(12) United States Patent
Muto et al.

(10) Patent No.: US 10,546,839 B2
(45) Date of Patent: Jan. 28, 2020

(54) SEMICONDUCTOR DEVICE AND ELECTRONIC APPARATUS INCLUDING SEMICONDUCTOR CHIPS INCLUDING AN INSULATED GATE BIPOLAR TRANSISTOR AND A DIODE

(71) Applicant: Renesas Electronics Corporation, Tokyo (JP)

(72) Inventors: Akira Muto, Tokyo (JP); Norio Kido, Tokyo (JP)

(73) Assignee: RENESAS ELECTRONIC CORPORATION, Tokyo (JP)

( * ) Notice: Subject to any disclaimer, the term of this patent is extended or adjusted under 35 U.S.C. 154(b) by 0 days.

(21) Appl. No.: 16/146,097

(22) Filed: Sep. 28, 2018

(65) Prior Publication Data

US 2019/0088629 A1 Mar. 21, 2019

Related U.S. Application Data

(62) Division of application No. 15/501,750, filed as application No. PCT/JP2014/072207 on Aug. 25, 2014, now Pat. No. 10,217,727.

(51) Int. Cl.
*H01L 25/07* (2006.01)
*H01L 23/28* (2006.01)
(Continued)

(52) U.S. Cl.
CPC ............ *H01L 25/072* (2013.01); *H01L 23/28* (2013.01); *H01L 23/3114* (2013.01);
(Continued)

(58) Field of Classification Search
None
See application file for complete search history.

(56) References Cited

U.S. PATENT DOCUMENTS

| 6,060,772 A | 5/2000 | Sugawara et al. |
| 6,166,464 A | 12/2000 | Grant |

(Continued)

FOREIGN PATENT DOCUMENTS

| JP | 11-74433 A | 3/1999 |
| JP | 2000-091500 A | 3/2000 |

(Continued)

OTHER PUBLICATIONS

Chinese Office Action, dated Sep. 26, 2018, in Chinese Applicaton No. 201480081240.7 and English Translation thereof.

(Continued)

*Primary Examiner* — Bilkis Jahan
(74) *Attorney, Agent, or Firm* — McGinn I.P. Law Group, PLLC

(57) ABSTRACT

An electronic apparatus includes a wiring board including a main surface on which a first wiring and a second wiring are formed, a first semiconductor device mounted on the main surface of the wiring board, and a second semiconductor device mounted on the main surface of the wiring board. Each of the first semiconductor device and the second semiconductor device includes a first semiconductor chip including an insulated gate bipolar transistor, a second semiconductor chip including a diode, a first lead electrically connected to an emitter electrode pad formed on a first front surface of the first semiconductor chip, a second lead electrically connected to an anode electrode pad formed on a second front surface of the second semiconductor chip, and a first terminal electrically connected to a collector electrode formed on a first back surface of the first semiconductor chip.

6 Claims, 58 Drawing Sheets

(51) Int. Cl.
  *H01L 25/18* (2006.01)
  *H01L 23/00* (2006.01)
  *H02P 25/092* (2016.01)
  *H01L 23/31* (2006.01)
  *H01L 23/498* (2006.01)
  *H02P 27/06* (2006.01)

(52) U.S. Cl.
  CPC ............ *H01L 23/498* (2013.01); *H01L 24/37* (2013.01); *H01L 24/40* (2013.01); *H01L 24/73* (2013.01); *H01L 25/07* (2013.01); *H01L 25/18* (2013.01); *H02P 25/092* (2016.02); *H02P 27/06* (2013.01); *H01L 2224/32245* (2013.01); *H01L 2224/37147* (2013.01); *H01L 2224/37599* (2013.01); *H01L 2224/48247* (2013.01); *H01L 2224/73221* (2013.01); *H01L 2224/73265* (2013.01); *H01L 2224/8385* (2013.01); *H01L 2224/8485* (2013.01); *H01L 2924/1203* (2013.01); *H01L 2924/13055* (2013.01); *H01L 2924/181* (2013.01)

(56) References Cited

U.S. PATENT DOCUMENTS

| | | | | |
|---|---|---|---|---|
| 7,151,311 | B2* | 12/2006 | Nakajima | H01L 21/565 257/728 |
| 7,245,004 | B2* | 7/2007 | Takaishi | H01L 23/3107 257/675 |
| 7,304,379 | B2* | 12/2007 | Andou | H01L 23/4334 257/714 |
| 8,823,153 | B2* | 9/2014 | Kim | H01L 23/4334 257/666 |
| 8,900,933 | B2* | 12/2014 | Adachi | H01L 25/072 438/124 |
| 2005/0023658 | A1 | 2/2005 | Tabira et al. | |
| 2006/0108684 | A1 | 5/2006 | Stevanovic et al. | |
| 2007/0052072 | A1* | 3/2007 | Iwade | H01L 23/051 257/675 |
| 2008/0012045 | A1 | 1/2008 | Muto et al. | |
| 2008/0054422 | A1 | 3/2008 | Koike et al. | |
| 2011/0089558 | A1* | 4/2011 | Muto | H01L 24/40 257/712 |
| 2012/0043662 | A1 | 2/2012 | Ohno | |

FOREIGN PATENT DOCUMENTS

| | | |
|---|---|---|
| JP | 2002-033445 A | 1/2002 |
| JP | 2002-270736 A | 9/2002 |
| JP | 2003-243611 A | 8/2003 |
| JP | 2005-051130 A | 2/2005 |
| JP | 2005-136332 A | 5/2005 |
| JP | 2006-148098 A | 6/2006 |
| JP | 2007-073743 A | 3/2007 |
| JP | 2008-021796 A | 1/2008 |
| JP | 2008-060256 A | 3/2008 |
| JP | 2011-086889 A | 4/2011 |
| JP | 2013-098425 A | 5/2013 |
| WO | WO 2011/092859 A1 | 8/2011 |

OTHER PUBLICATIONS

Taiwanese Office Action, dated Dec. 10, 2018, in Taiwanese Application No. 104125992 and English Translation thereof.
United States Notice of Allowance dated Sep. 7, 2018, in U.S. Appl. No. 15/201,750.
United States Office Action dated Feb. 7, 218, in U.S. Appl. No. 15/201,750.
International Search Report (ISR) (PCT Form PCT/ISA/210), in PCT/JP2014/072207, dated Sep. 22, 2014.
Japanese Office Action dated Nov. 14, 2017 in Japanese Application No. 2016-545113 with an English Translation thereof.
Chinese Office Action, dated Apr. 25, 2019, in Chinese Application No. 201480081240.7 and English Translation thereof.

* cited by examiner (PART OF)
INVERTER CIRCUIT FOR SR MOTOR (PART OF)
INVERTER CIRCUIT FOR PM MOTOR

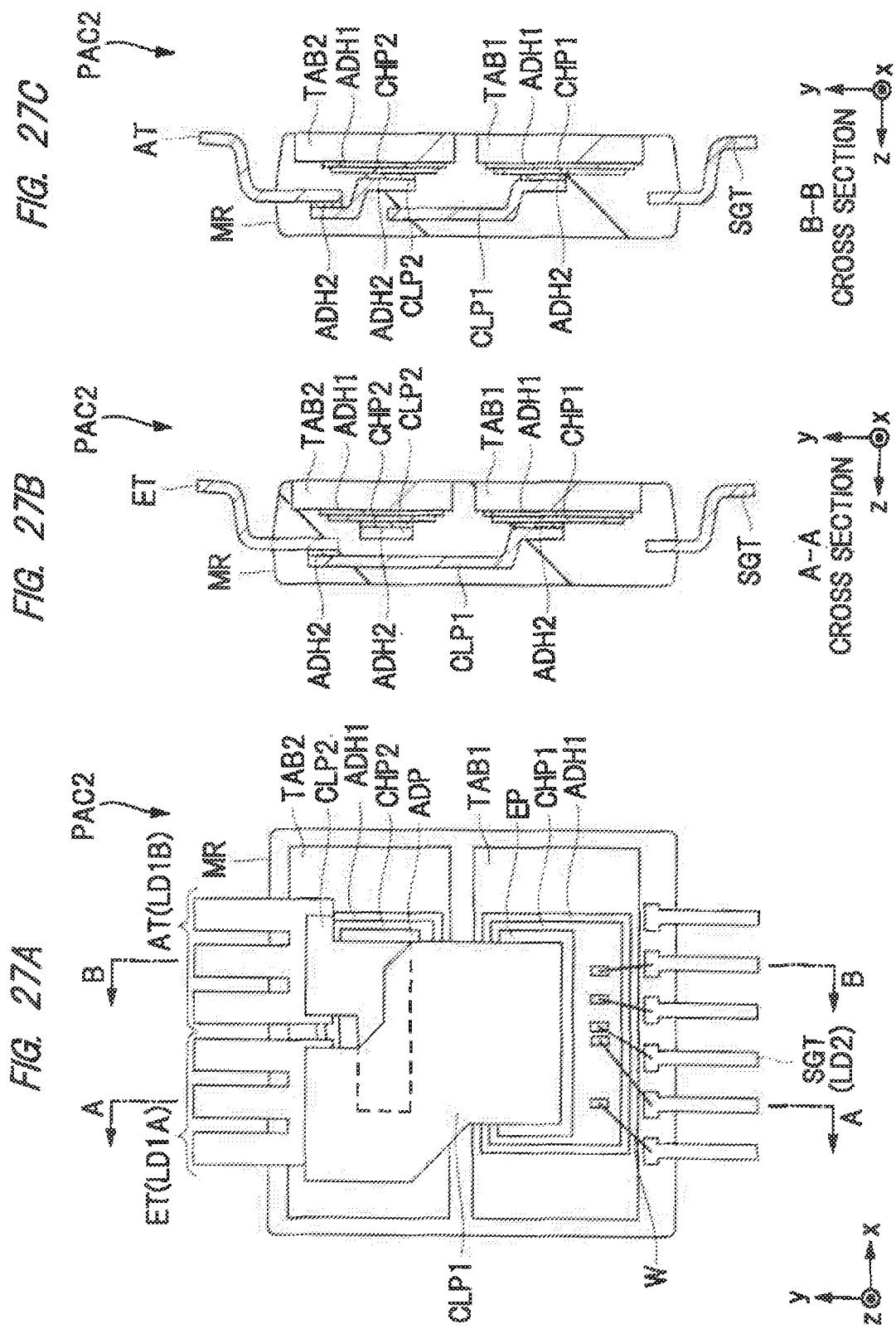

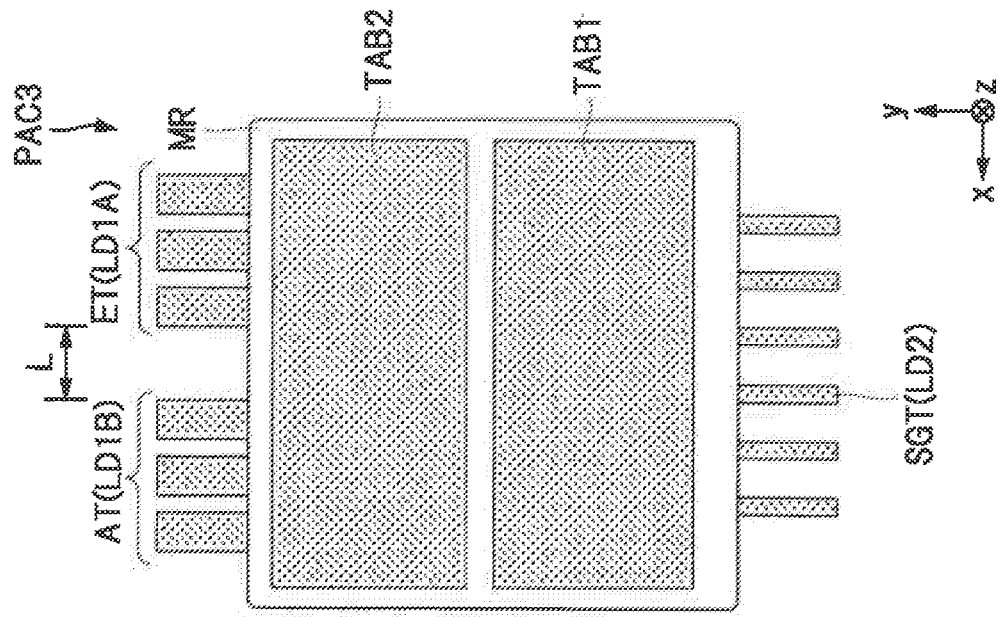
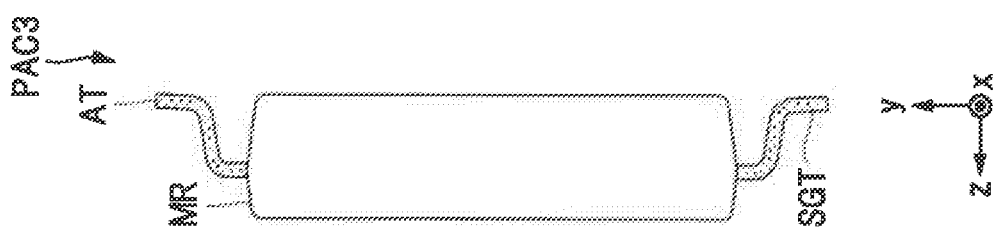
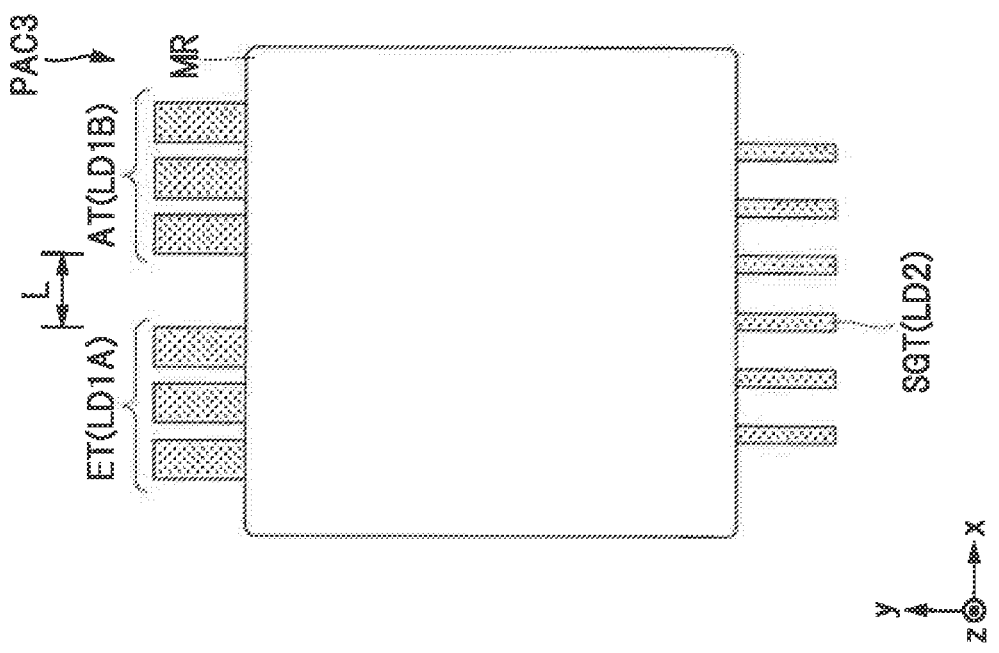

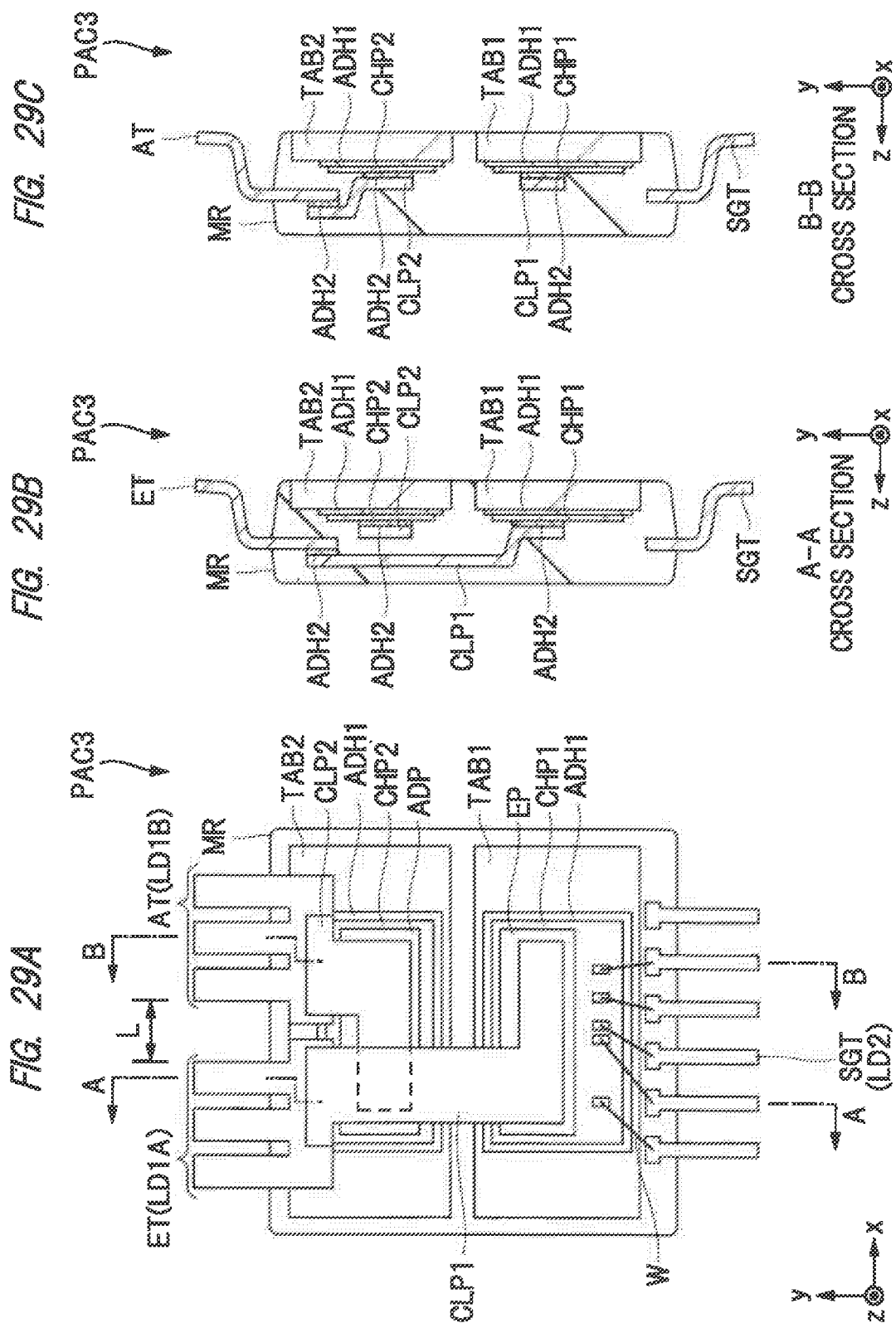

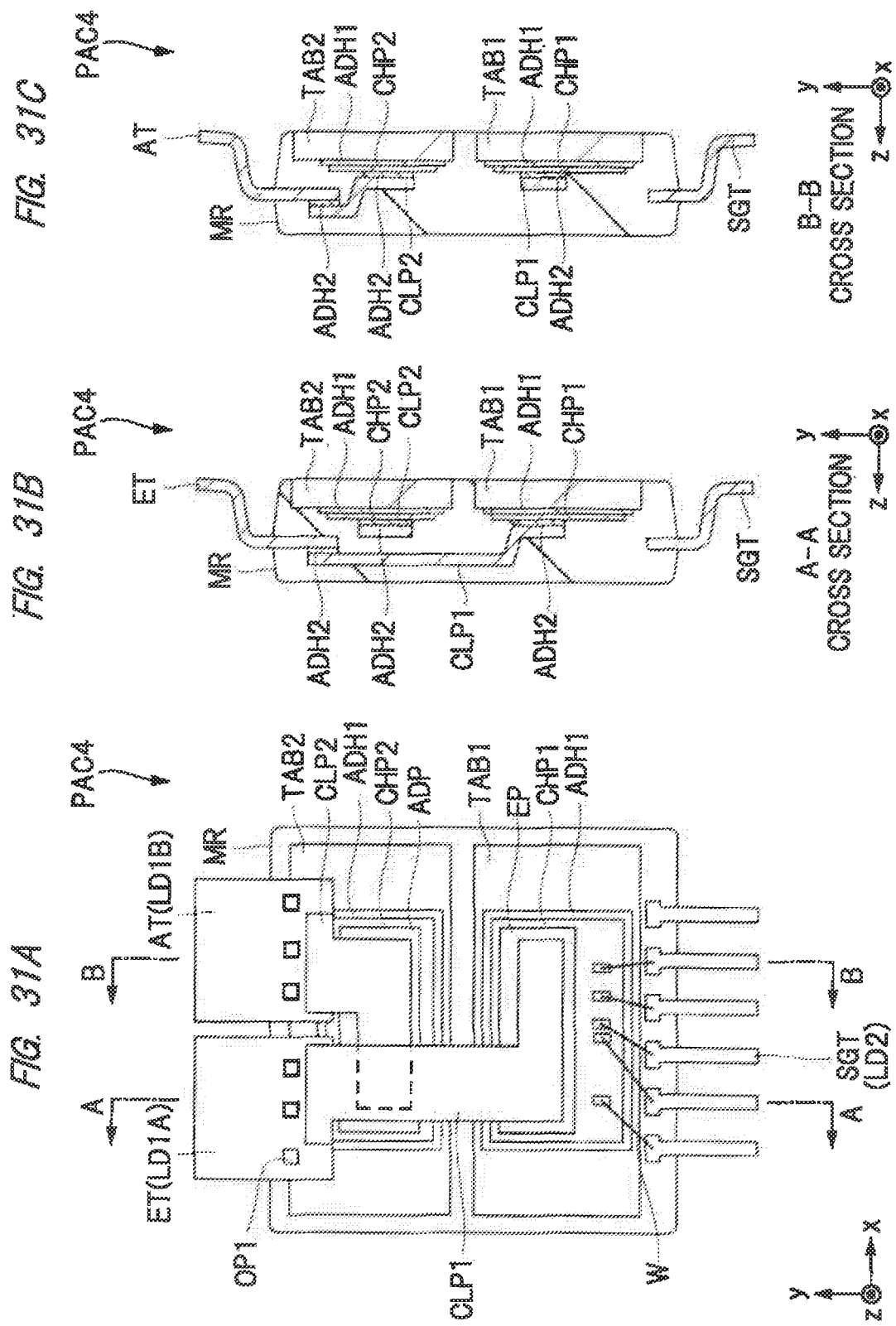

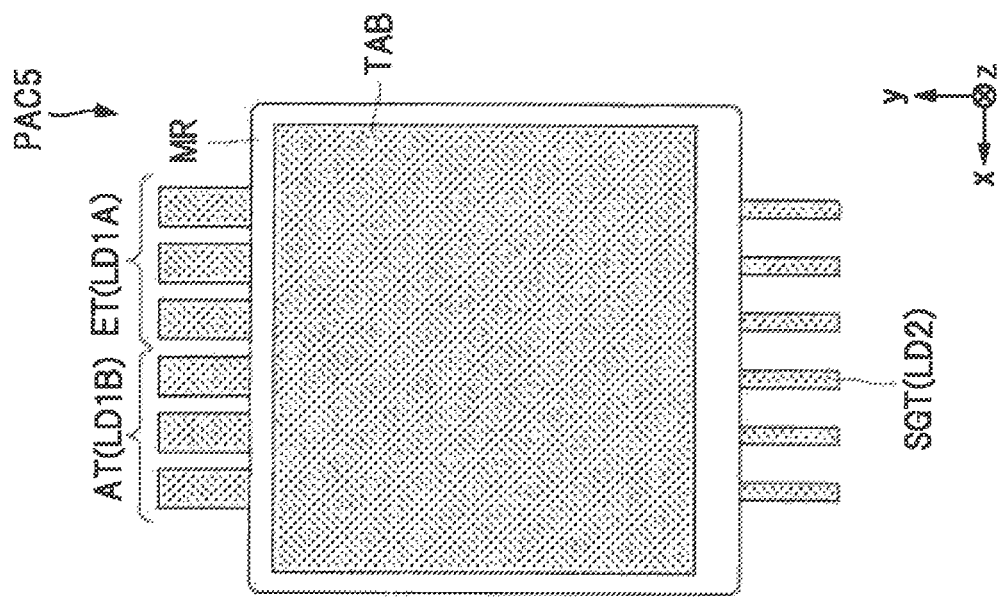
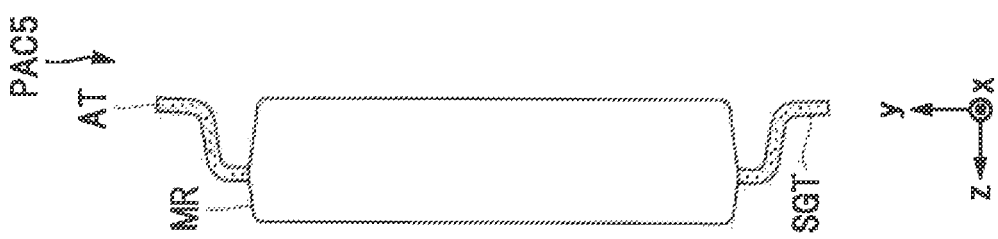
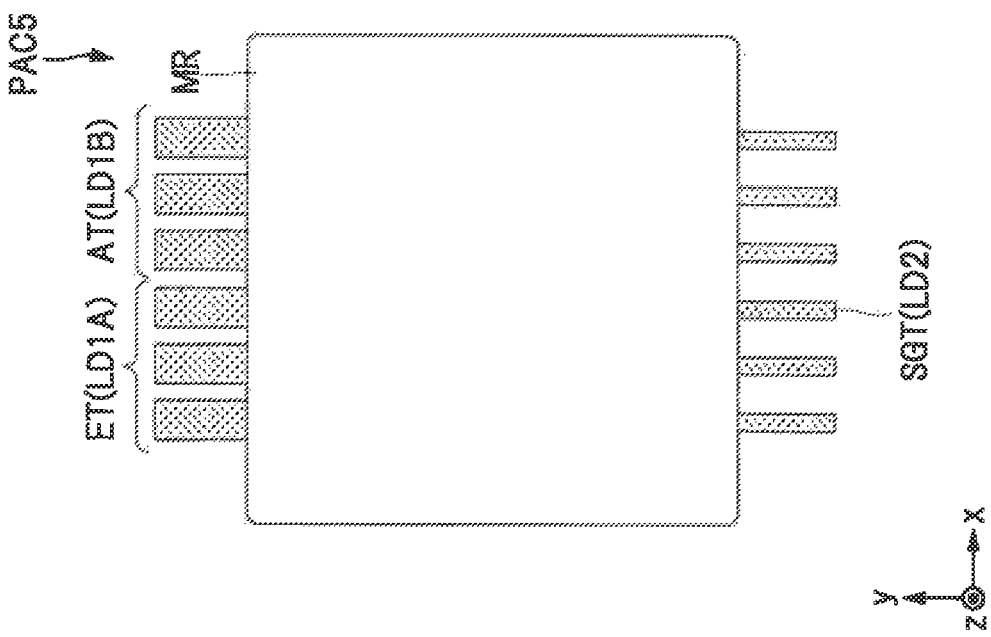

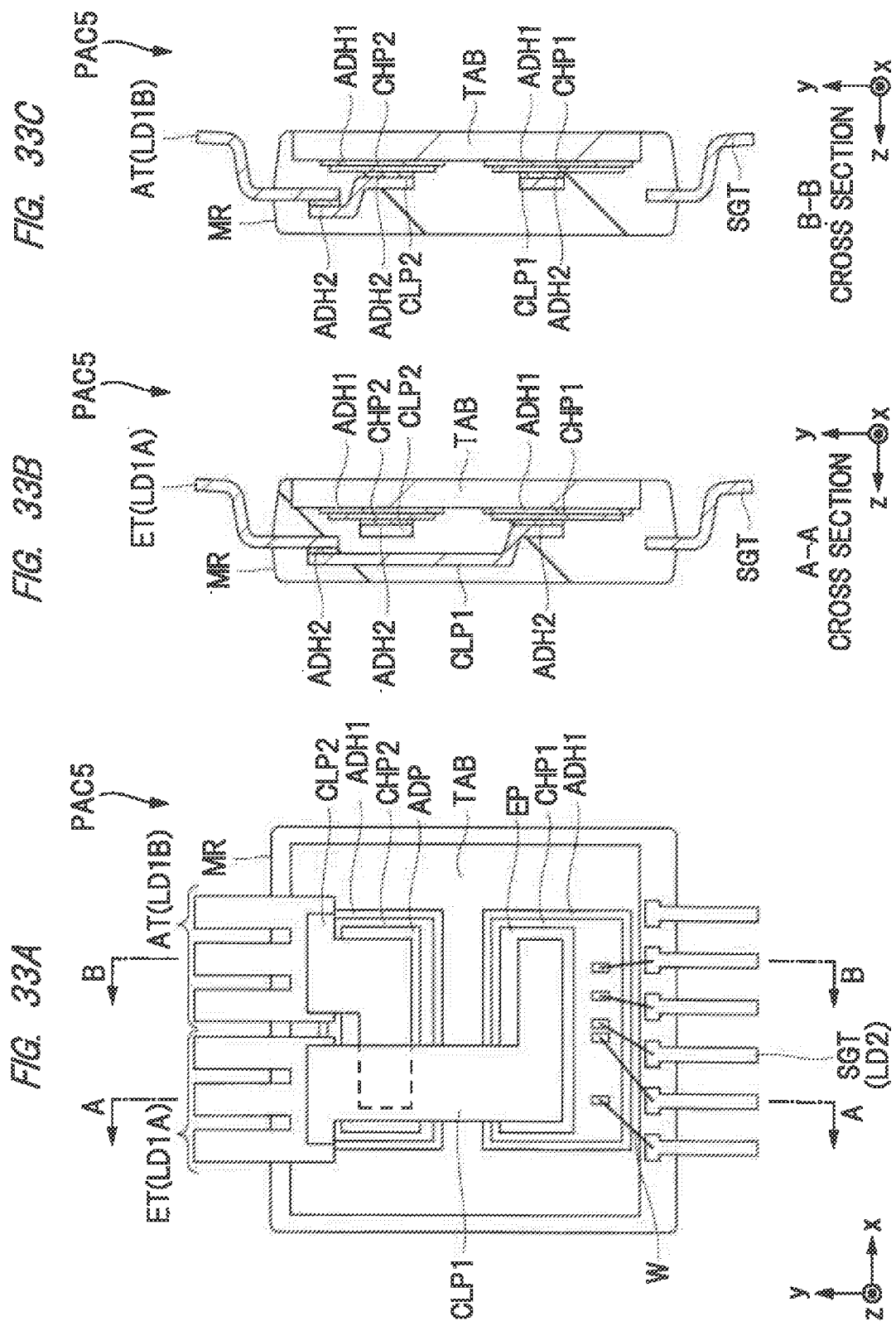

SEMICONDUCTOR DEVICE AND ELECTRONIC APPARATUS INCLUDING SEMICONDUCTOR CHIPS INCLUDING AN INSULATED GATE BIPOLAR TRANSISTOR AND A DIODE

The present application is a Divisional Application of U.S. patent application Ser. No. 15/501,750, filed on Feb. 3, 2017, which is based on and claims priority from International Application No. PCT/JP2014/072207, filed on Aug. 25, 2014, the entire contents of which are incorporated herein by reference.

TECHNICAL FIELD

The present invention relates to a semiconductor device and an electronic apparatus and relates also to, for example, a technique effectively applied to a semiconductor device and an electronic apparatus that function as components of an inverter.

BACKGROUND ART

Japanese Patent Application Laid-open Publication No. 2008-60256 (Patent Document 1) describes a semiconductor device in which output pins protrude from one side of a sealing material while control pins protrude from a side opposite to the one side of the sealing material.

Japanese Patent Application Laid-open Publication No. 2008-21796 (Patent Document 2) describes a semiconductor device which includes a first semiconductor chip having an insulated gate bipolar transistor (hereinafter, referred to as "IGBT") formed therein and a second semiconductor chip having a diode formed therein.

Japanese Patent Application Laid-open Publication No. 2011-86889 (Patent Document 3) describes a combined package including a plurality of unit packages in each of which a first semiconductor chip having an IGBT formed therein and a second semiconductor chip having a diode formed therein are sealed with the same sealing material.

Japanese Patent Application Laid-open Publications No. 2000-91500 (Patent Document 4), No. 2006-148098 (Patent Document 5), and No. 2013-98425 (Patent Document 6) describe a technique related to a power semiconductor module including an inverter that controls a switched reluctance motor (hereinafter, referred to as "SR motor" as abbreviated).

RELATED ART DOCUMENTS

Patent Documents

Patent Document 1: Japanese Patent Application Laid-open Publication No. 2008-60256

Patent Document 2: Japanese Patent Application Laid-open Publication No. 2008-21796

Patent Document 3: Japanese Patent Application Laid-open Publication No. 2011-86889

Patent Document 4: Japanese Patent Application Laid-open Publication No. 2000-91500

Patent Document 5: Japanese Patent Application Laid-open Publication No. 2006-148098

Patent Document 6: Japanese Patent Application Laid-open Publication No. 2013-98425

SUMMARY OF THE INVENTION

Problems to be Solved by the Invention

For example, an electric car, hybrid car, etc., is equipped with a motor. As one example of such a motor, a permanent magnet synchronous motor (hereinafter, referred to as "PM motor" as abbreviated) is cited. This PM motor is used in general as a motor that drives an electric car, hybrid car, etc. Recently, however, the needs for the SR motor have been growing because of cost reduction requirements. Controlling a motor requires an electronic apparatus (power module) making up an inverter circuit. It has been attempted to achieve such high performance and such downsizing of this electronic apparatus as being applicable to the conventionally mainly used PM motor. In other words, the SR motor for which needs have been rapidly growing in terms of cost reduction requirements lies in a situation of no much progress of the improvement of the SR motor as typified by the achievement of such high performance and such downsizing as being applicable to the electronic apparatus that controls the SR motor. Therefore, from the viewpoint of the achievement of such high performance and such downsizing as being applicable to the SR motor, it is significantly required to improve the electronic apparatus that controls the SR motor for which needs have been growing rapidly in terms of cost reduction requirements.

The above and other object and novel characteristics of the present invention will be apparent from the description of the present specification and the accompanying drawings.

Means for Solving the Problems

A semiconductor device according to an embodiment includes a first chip mounting portion mounting a first semiconductor chip having an IGBT formed therein, and a second chip mounting portion mounting a second semiconductor chip having a diode formed therein. The semiconductor device according to an embodiment also includes a first lead electrically connected to an emitter electrode pad of the first semiconductor chip via a first conductive member, and a second lead electrically connected to an anode electrode pad of the second semiconductor chip via a second conductive member. At this time, the first chip mounting portion and the second chip mounting portion are electrically separated from each other, and the first conductive member and the second conductive member are electrically separated from each other.

An electronic apparatus according to an embodiment includes a wiring board and a plurality of semiconductor devices mounted on a main surface of the wiring board. At this time, each of the plurality of semiconductor devices is configured by the semiconductor device having the above-described structure.

Effects of the Invention

In a semiconductor device according to an embodiment, for example, such high performance as being applicable to an SR motor can be achieved.

BRIEF DESCRIPTIONS OF THE DRAWINGS

FIG. 27A is a plan view illustrating an internal structure of a semiconductor device of a first modification, FIG. 27B is a cross-sectional view taken along a line A-A of FIG. 27A, and FIG. 27C is a cross-sectional view taken along a line B-B of FIG. 27A;

FIG. 28A is a plan view of a semiconductor device of a second modification that is viewed from its front surface, FIG. 28B is a side view of the semiconductor device of the second modification that is viewed from its one side, and FIG. 28C is a plan view of the semiconductor device of the second modification that is viewed from its back surface;

FIG. 29A is a plan view illustrating an internal structure of the semiconductor device of the second modification, FIG. 29B is a cross-sectional view taken along a line A-A of FIG. 29A, and FIG. 29C is a cross-sectional view taken along a line B-B of FIG. 29A;

FIG. 31A is a plan view illustrating an internal structure of the semiconductor device of the third modification, FIG. 31B is a cross-sectional view taken along a line A-A of FIG. 31A, and FIG. 31C is a cross-sectional view taken along a line B-B of FIG. 31A;

FIG. 32A is a plan view of a semiconductor device of a fourth modification that is viewed from its front surface, FIG. 32B is a side view of the semiconductor device of the fourth modification that is viewed from its one side, and FIG. 32C is a plan view of the semiconductor device of the fourth modification that is viewed from its back surface;

FIG. 33A is a plan view illustrating an internal structure of the semiconductor device of the fourth modification, FIG. 33B is a cross-sectional view taken along a line A-A of FIG. 33A, and FIG. 33C is a cross-sectional view taken along a line B-B of FIG. 33A;

DETAILED DESCRIPTION OF PREFERRED EMBODIMENTS

Figure 1A:
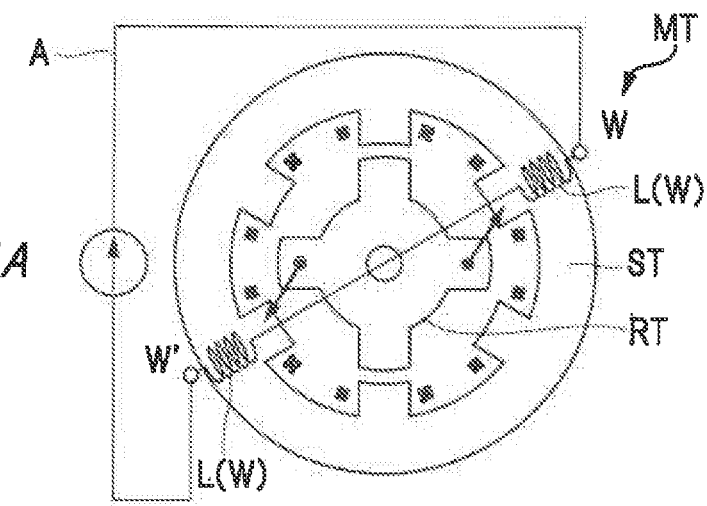
FIGS. 1A to 1C are explanatory diagrams of the rotation principle of an SR motor.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference symbols throughout all the drawings for describing the embodiments in principle, and the repetitive description thereof is omitted. Note that hatching is used even in a plan view so as to make the drawings easy to see in some cases.

First Embodiment

The present first embodiment provides a technical concept on a power module including an inverter circuit that controls an SR motor. According to the description of the present specification, conceptually, the entire power module corresponds to an electronic apparatus, and an electronic component including a semiconductor chip among components making up the power module corresponds to a semiconductor device.

<Rotation Principle of SR Motor>

For example, an electric car, hybrid car, etc., is equipped with a motor, and a PM motor, SR motor, etc., are cited as this motor. The SR motor has advantages of more cost reduction and higher speed rotation than the PM motor. Specifically, the SR motor has an advantage which can reduce the cost more than PM motor because the SR motor does not use rare earth substances (rare metal) and has a simple rotor structure. The SR motor has an advantage which can achieve the high speed rotation since a rotor has a structure made of a simple robust iron mass. Therefore, in recent years, needs for the SR motor has been growing in terms of the cost reduction requirements. In the present first embodiment, attention is paid to this SR motor. In the following description, the rotation principle of the SR motor will be explained first.

Figure 1B:
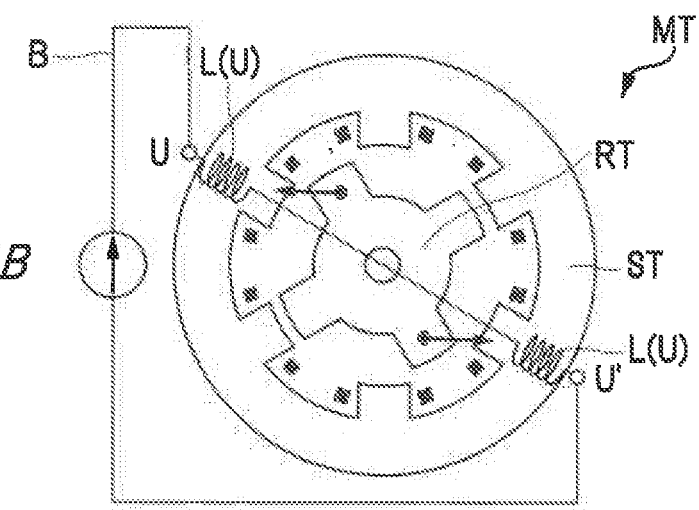
Figure 1C:
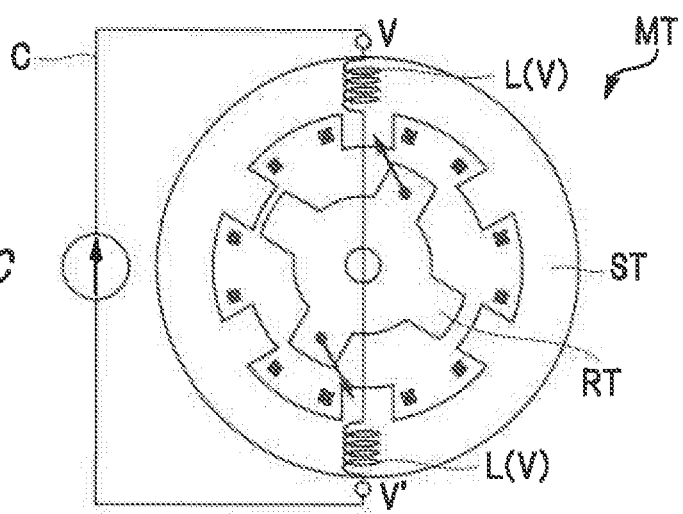

FIGS. 1A to 1C are explanatory diagrams of the rotation principle of an SR motor MT. First, as illustrated in FIG. 1A, the SR motor MT has a stator ST and a rotor RT. The rotor RT which can rotate is placed inside the stator ST. A winding is wound around a portion between a terminal W and a terminal W' of the stator ST, so that a coil L(W) is formed. When a current is caused to flow through a closed circuit A including the coil L(W) wound around the portion between the terminal W and the terminal W' of the stator ST, an electromagnet caused by the current flowing through the coil L(W) wound around the portion between the terminal W and the terminal W' is formed. As a result, for example, an attractive force which is a magnetic force generated by the electromagnet is applied to the rotor RT made of an iron member, and the rotor is pulled in a direction indicated by arrows in FIG. 1A.

Subsequently, when the closed circuit A including the coil L(W) wound around the portion between the terminal W and the terminal W' of the stator ST is opened to cut off the current flow, the magnetic force generated by the electromagnet created by the current flowing through the coil L(W) wound around the portion between the terminal W and the terminal W' is lost. The attractive force applied from the electromagnet which is created by the current flowing through the coil L(W) wound around the portion between the terminal W and the terminal W' to the rotor RT is lost. Subsequently, as illustrated in FIG. 1B, when a current is caused to flow through a closed circuit B including a coil L(U) wound around a portion between a terminal U and a terminal U' of the stator ST, an electromagnet created by the current flowing through the coil L(U) wound around the portion between the terminal U and the terminal U' is formed. As a result, an attractive force is applied from the electromagnet to the rotor RT, and the rotor RT is pulled in a direction indicated by arrows in FIG. 1B.

Subsequently, when the closed circuit B including the coil L(U) wound around the portion between the terminal U and the terminal U' of the stator ST is opened to cut off the current flow, the magnetic force generated by the electromagnet created by the current flowing through the coil L(U) wound around the portion between the terminal U and the terminal U' is lost. The attractive force applied from the electromagnet which is created by the current flowing through the coil L(U) wound around the portion between the terminal U and the terminal U' to the rotor RT is lost. Subsequently, as illustrated in FIG. 1C, when a current is caused to flow through a closed circuit C including a coil L(V) wound around a portion between a terminal V and a terminal V' of the stator ST, an electromagnet created by the current flowing through the coil L(V) wound around the portion between the terminal V and the terminal V' is formed. As a result, an attractive force is applied from the electromagnet to the rotor RT, and the rotor RT is pulled in a direction indicated by arrows in FIG. 1C.

In this manner, the electromagnet is generated by sequentially switching the closed circuit A, closed circuit B, and closed circuit C to sequentially cause the current flow through each of these closed circuits. By the attractive force from the created electromagnet, the rotor RT rotates, for example, continuously counterclockwise as illustrated in FIGS. 1A to 1C. This is the rotation principle of the SR motor MT, which recognizes that it is required to cause the current flow by switching the closed circuit A, closed circuit B, and closed circuit C in order to rotate the SR motor RT. A circuit that carries out switching control over these closed circuits A, closed circuit B, and closed circuit C is an inverter circuit. That is, the inverter circuit is configured so as to sequentially switch the closed circuits A, closed circuit B, and closed circuit C to control the current flowing through each of these closed circuits. A configuration of the inverter circuit having such a function will be described below.

<Configuration of Inverter Circuit>

Figure 2:
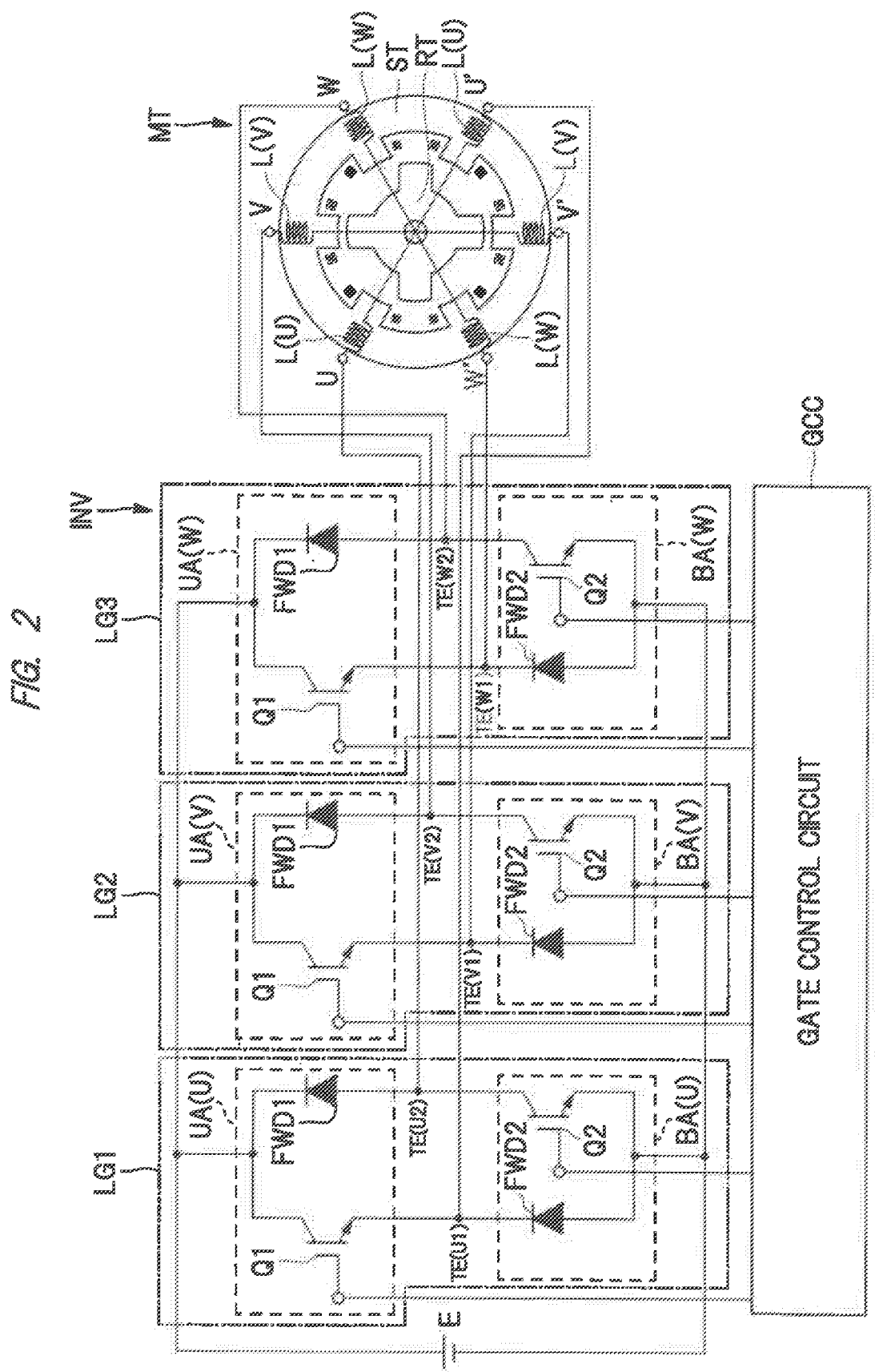
FIG. 2 is a circuit diagram in which an inverter circuit is disposed between a direct-current power supply and the SR motor.

FIG. 2 is a circuit diagram in which an inverter circuit INV is disposed between a direct-current power supply E and the SR motor MT. As illustrated in FIG. 2, the inverter circuit INV includes a first leg LG1, a second leg LG2, and a third leg LG3 that are connected in parallel to the direct-current power supply E. The first leg LG1 is composed of an upper arm UA(U) and a lower arm BA(U) connected in series to each other, the second leg LG2 is composed of an upper arm UA(V) and a lower arm BA(V) connected in series to each other, and the third leg LG3 is composed of an upper arm UA(W) and a lower arm BA(W) connected in series to each other. The upper arm UA(U) is composed of an IGBT Q1 and a diode FWD1, while the lower arm BA(U) is composed of an IGBT Q2 and a diode FWD2. At this time, both of the IGBT Q1 of the upper arm UA(U) and the diode FWD2 of the lower arm BA(U) are connected to a terminal TE(U1), and the IGBT Q1 and the diode FWD2 are connected in series to each other. On the other hand, both of the diode FWD1 of the upper arm UA(U) and the IGBT Q2 of the lower arm BA (U) are connected to a terminal TE(U2), and the diode FWD1 and the IGBT Q2 are connected in series to each other. The terminal TE(U1) is connected to the terminal U' of the SR motor, while the terminal TE(U2) is connected to the terminal U of the SR motor. That is, the coil L(U) existing between the terminal U and terminal U' of the SR motor MT is connected between the terminal TE(U1) and terminal TE(U2) of the inverter INV.

Similarly, the upper arm UA(V) is composed of an IGBT 01 and a diode FWD1, while the lower arm BA(V) is composed of an IGBT Q2 and a diode FWD2. At this time, both of the IGBT Q1 of the upper arm UA(V) and the diode FWD2 of the lower arm BA(V) are connected to a terminal TE(V1), and the IGBT Q1 and the diode FWD2 are connected in series to each other. On the other hand, both of the diode FWD1 of the upper arm UA(V) and the IGBT Q2 of the lower arm BA(V) are connected to a terminal TE(V2), and the diode FWD1 and the IGBT Q2 are connected in series to each other. The terminal TE(V1) is connected to the terminal V' of the SR motor, while the terminal TE(V2) is connected to the terminal V of the SR motor. That is, the coil L(V) existing between the terminal V and terminal V' of the SR motor MT is connected between the terminal TE(V1) and terminal TE(V2) of the inverter INV.

Also, the upper arm UA(W) is composed of an IGBT Q1 and a diode FWD1, while the lower arm BA(W) is composed of an IGBT Q2 and a diode FWD2. At this time, both of the IGBT Q1 of the upper arm UA(W) and the diode FWD2 of the lower arm BA(W) are connected to a terminal TE(W1), and the IGBT Q1 and the diode FWD2 are connected in series to each other. On the other hand, both of the diode FWD1 of the upper arm UA (W) and the IGBT Q2 of the lower arm BA (W) are connected to a terminal TE(W2), and the diode FWD1 and the IGBT Q2 are connected in series to each other. The terminal TE(W1) is connected to the terminal W' of the SR motor, while the terminal TE(W2) is connected to the terminal W of the SR motor. That is, the coil L(W) existing between the terminal W and terminal W' of the SR motor MT is connected between the terminal TE(W1) and terminal TE(W2) of the inverter INV.

Next, the gate electrode of each IGBT Q1 which is a component of each of the upper arms UA(U), UA(V), and UA(W) is electrically connected to a gate control circuit GCC. Thus, by gate control signals from the gate control circuit GCC, the on/off operations (switching operations) of respective IGBTs Q1 of the upper arms UA(U), UA(V), and UA(W) are controlled. Similarly, the gate electrode of each IGBT Q2 which is a component of each of the lower arms BA(U), BA(V), and BA(W) is also electrically connected to the gate control circuit GCC. By gate control signals from the gate control circuit GCC, the on/off operations of respective IGBTs Q2 of the lower arms BA(U), BA(V), and BA(W) are controlled.

Here, a case of usage of, for example, a power MOSFET (Metal Oxide Semiconductor Field Effect Transistor) as a switching element of the inverter circuit INV is assumed. This power MOSFET has an advantage of high-speed switching performance because of being a voltage-driven type in which the on/off operations are controlled by a voltage applied to its gate electrode. Meanwhile, the power MOSFET has a property that causing increase in an on-resistance as increase in a breakdown voltage, which results in a higher heat generation. This is because, while the high breakdown voltage of the power MOSFET is secured by increasing a thickness of a low-concentration epitaxial layer (drift layer), the thicker low-concentration epitaxial layer causes a higher resistance as a side effect.

On the other hand, a bipolar transistor capable of handling a large amount of power may also be used as such a switching element. However, the bipolar transistor has a property that generally causes a slower switching speed than that of the above-described power MOSFET because of being a current-driven type in which the on/off operation is controlled by a base current.

Therefore, applications to a motor of an electric car, hybrid car, etc., which requires a large amount of power and high-speed switching, are difficult to be handled by the power MOSFET and bipolar transistor. Therefore, an IBGT is used in such applications requiring the large amount of power and the high-speed switching. This IGBT is composed of combination of a power MOSFET and a bipolar transistor, and is a semiconductor element that has combination of the high-speed switching property of the power MOSFET and the high breakdown voltage property of the bipolar transistor. From this fact, the IGBT is a semiconductor element suitable for the applications requiring the large amount of the current and the high-speed switching because of being capable of handling the large amount of power and the high-speed switching. From the above description, in the inverter circuit INV according to the present first embodiment, the IGBT is adopted as the switching element.

The inverter circuit INV of the present first embodiment includes the first leg LG1 to third leg LG3 connected in parallel to one another, and each of the first leg LG1 to third leg LG3 has two IGBTs (IGBT Q1 and IGBT Q2) and two diodes (diode FWD1 and diode FWD2). Therefore, the inverter circuit INV of the present first embodiment includes six IGBTs and six diodes. In the inverter circuit INV configured as described above, the SR motor MT can be rotated by controlling the on/off operations (switching operations) of three IGBTs Q1 and three IGBTs Q2 through the gate control circuit GCC. Hereinafter, an operation of the inverter circuit INV for rotating the SR motor MT will be described with reference to drawings.

<Operation of Inverter Circuit>

Figure 3:
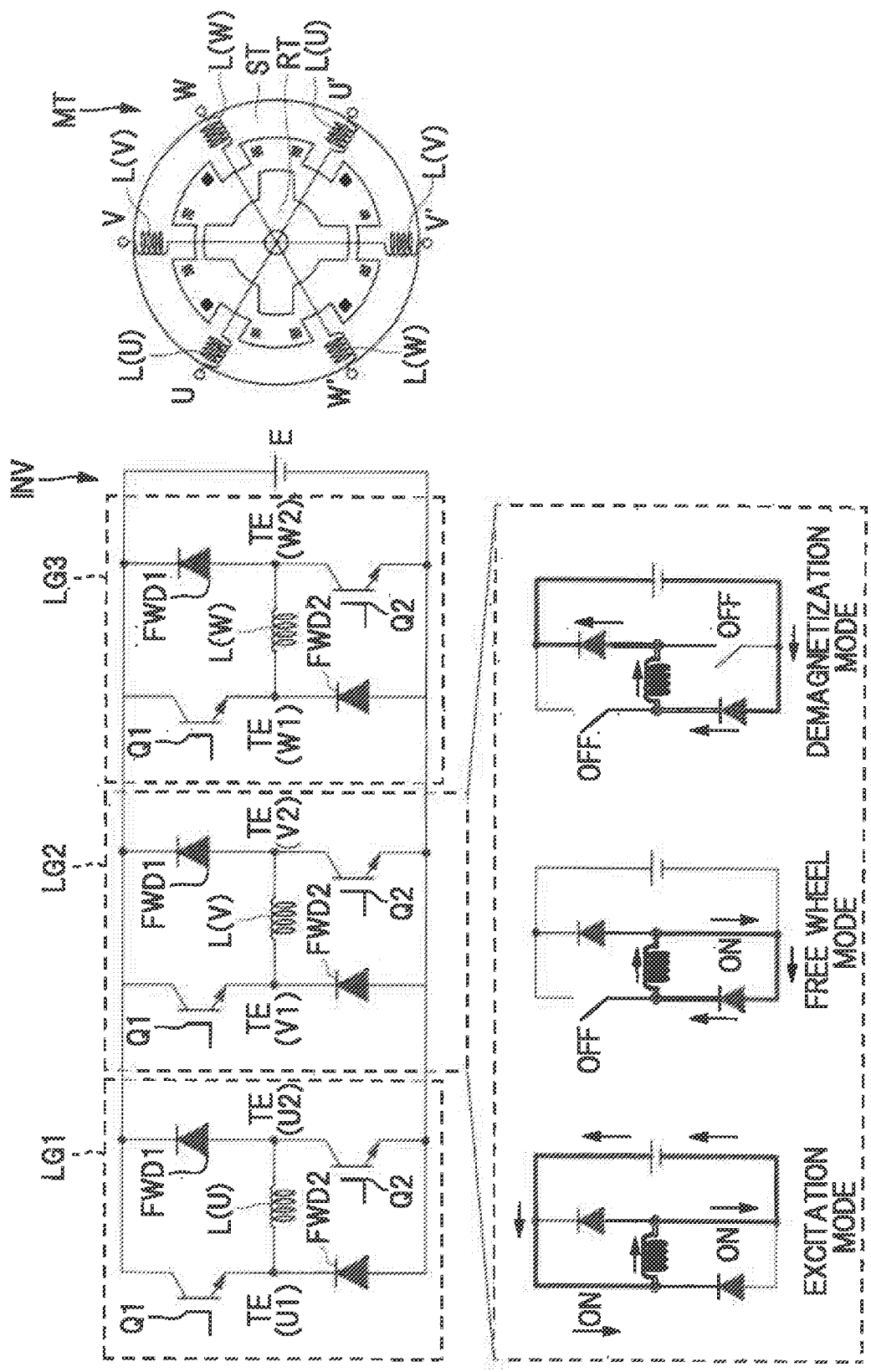
FIG. 3 is an explanatory diagram of an operation of the inverter circuit according to a first embodiment.

FIG. 3 is an explanatory diagram of an operation of the inverter circuit INV according to the present first embodiment. The inverter circuit INV of FIG. 3 serves as a circuit for rotating the SR motor MT, and includes the first leg LG1 to third leg LG3. At this time, for example, the first leg LG1 is a circuit that controls a current flowing through the coil L(U) disposed between the terminal U and terminal U' of the SR motor MT, and the second leg LG2 is a circuit that controls a current flowing through the coil L(V) disposed between the terminal V and terminal V' of the SR motor MT. Similarly, the third leg LG3 is a circuit that controls a current flowing through the coil L(W) disposed between the terminal W and terminal W' of the SR motor MT. That is, at the inverter circuit INV illustrated in FIG. 3, the current flowing through the coil L(U) is controlled by the first leg LG1, the current flowing through the coil L(V) is controlled by the second leg LG2, and the current flowing through the coil L(W) is controlled by the third leg LG3. At the inverter circuit INV illustrated in FIG. 3, the control for the current flowing through the coil L(U) by the first leg LG1, the control for the current flowing through the coil L(V) by the second leg LG2, and the control for the current flowing through the coil L(W) by the third leg LG3 are equally performed at different timings. Therefore, for example, the control for the current flowing through the coil L(V) by the second leg LG2 will be explained below as an example.

In FIG. 3, first, when the current starts flowing through the coil L(V) of the SR motor MT, the IGBT Q1 is switched on and the IGBT Q2 is also switched on as illustrated in an excitation mode. At this time, a current is supplied from the direct-current power supply E through the switched-on IGBT Q1, and then, supplied from the terminal TE(V1) to the coil L(V). The current returns from the coil L(V) through the terminal TE(V2), and then, through the switched-on IGBT Q2 to the direct-current power supply E. In this manner, the current is caused to flow through the coil L(V). As a result, an electromagnet is generated between the terminal V and terminal V' of the stator ST of the SR motor MT, and an attractive force generated by the electromagnet is applied to the rotor RT. Then, in order to keep the attractive force generated by the electromagnet, the current flowing through the coil L(V) of the SR motor MT is maintained. Specifically, as illustrated in a free wheel mode of FIG. 3, the IGBT Q1 is switched off while the IGBT Q2 is kept on. In this case, as illustrated in the free wheel mode of FIG. 3, the closed circuit is formed by the coil L(V), the switched-on IGBT Q2, and the diode FWD2, and the current keeps flowing through this closed circuit. As a result, the current flowing through the coil L(V) is maintained, and the application of the attractive force of the electromagnet created from the coil L(V) to the rotor RT is kept. Subsequently, the current flowing through the coil L(V) disappears. Specifically, as illustrated in a demagnetization mode of FIG. 3, the IGBT Q1 is switched off, and the IGBT Q2 is also switched off. In this case, as illustrated in the demagnetization mode of FIG. 3, the residual power of the coil L(V) in the closed circuit formed by the coil L(V), the switched-on IGBT Q2, and the diode FWD2 disappears via the diode FWD1 by switching off the IGBT Q2. As a result, the current flowing through the coil L(V) reduces to zero, and the electromagnet created by the current flowing through the coil L(V) disappears. In this manner, the attractive force applied from the electromagnet created by the current flowing through the coil L(V) to the rotor RT is lost. By repeat of such an operation at different timings for the first leg LG1 to third leg LG3, the rotor RT of the SR motor MT can be rotated. In the above-described manner, the SR motor MT can be rotated by the current control by the inverter INV of the present first embodiment.

<Difference from Inverter Circuit for PM Motor>

Figure 4B:
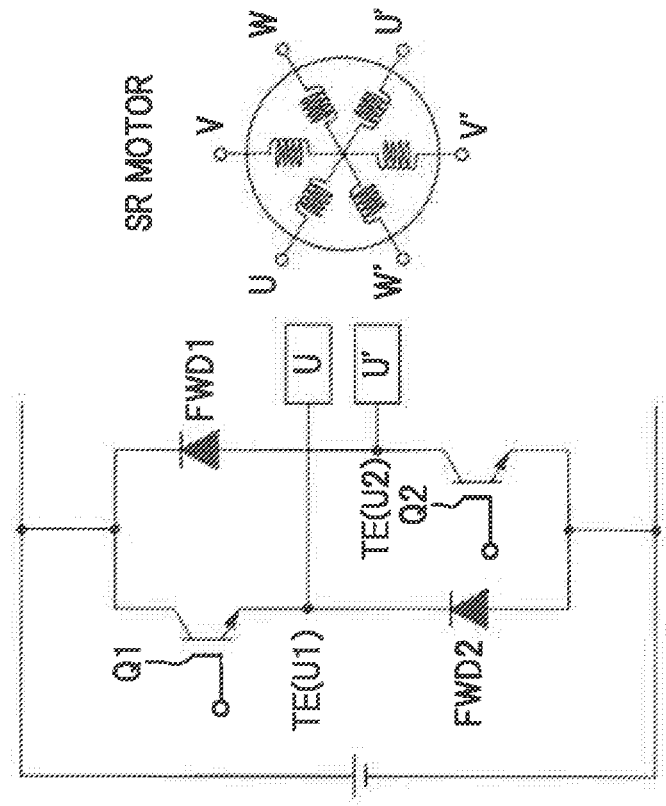
FIG. 4A is a diagram illustrating a part of an inverter circuit for a PM motor and FIG. 4B is a diagram illustrating a part of an inverter circuit for the SR motor.
Figure 4A:
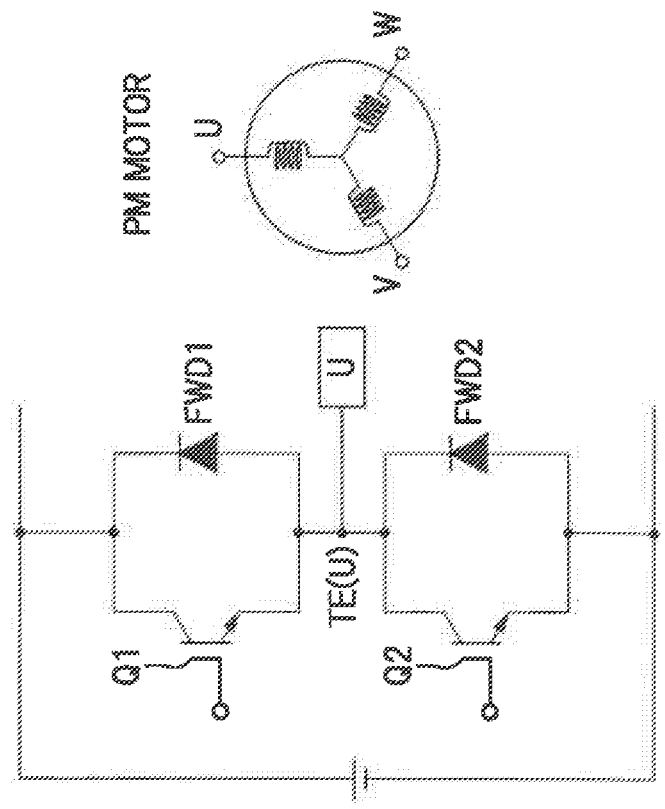

Next, a difference between the inverter circuit for the SR motor according to the present first embodiment and a generally-used inverter circuit for the PM motor will be described. FIGS. 4A and 4B are diagrams for explaining the difference between the inverter circuit for the PM motor and the inverter circuit for the SR motor. Particularly, FIG. 4A is a diagram illustrating a part of the inverter circuit for the PM motor and FIG. 4B is a diagram illustrating a part of the inverter circuit for the SR motor.

FIG. 4A illustrates a part of the inverter circuit that is electrically connected to the terminal U (U phase) of the PM motor. Specifically, the IGBT Q1 and diode FWD1 making up the upper arm are connected in reversely parallel to each other, and the IGBT Q2 and diode FWD2 making up the lower arm are connected in reversely parallel to each other. One terminal TB(U) is provided between the upper arm and the lower arm, and this terminal TE(U) is connected to the terminal U of the PM motor. In the inverter circuit for the PM motor configured as described above, as illustrated in FIG. 4A, a U-phase coil, a V-phase coil, and a W-phase coil of the PM motor are connected in three-phase connection arrangement (e.g., star connection arrangement), in which the elements of the arms that drive each coil are controlled so as not to perform the simultaneous up/down operation. Therefore, the inverter circuit for the PM motor is controlled so that two phases are paired as "U-phase coil+V-phase coil"→"the V-phase coil+W-phase coil"→"the W-phase coil+U-phase coil". As a result, in the inverter circuit for the PM motor, when the IGBTs are switched on to cause a current to flow through the coil and then are switched off for phase switching, a regenerative current caused by residual power flows through the diodes in the arms, so that the residual power disappears. Therefore, in the inverter circuit for the PM motor, it is required to configure the IGBT and the diode to be paired. As a result, in the inverter circuit for the PM motor, one terminal TE(U) is provided between the upper arm and the lower arm as illustrated in FIG. 4A.

On the other hand, FIG. 4B illustrates a part of the inverter circuit that is electrically connected to the terminal U and terminal U' of the SR motor. Specifically, the IGBT Q1 making up the upper arm is connected in series to the diode FWD2 making up the lower arm, and the terminal TE(U1) is disposed between the IGBT Q1 making up the upper arm and the diode FWD2 making up the lower arm. The diode FWD1 making up the upper arm is connected in series to the IGBT Q2 making up the lower arm, and the terminal TE(U2) is disposed between the diode FWD1 making up the upper arm and the IGBT Q2 making up the lower arm. The terminal TE(U1) of the inverter circuit is connected to the terminal U of the SR motor, while the terminal TE(U2) of the inverter circuit is connected to the terminal U' of the SR motor. The inverter circuit for the SR motor configured as described above includes a coil of each phase of the SR motor and a closed circuit formed of an H-bridge circuit. Therefore, for example, as illustrated in FIG. 4B, when the IGBT Q1 of the upper arm and the IGBT Q2 of the lower arm which are in cross-coupled arrangement are switched on to cause a current to flow through the coil disposed between the terminal U and terminal U' of the SR motor (see the excitation mode of FIG. 3) and then are switched off for phase transition, it is required to cause the residual power of the coil to disappear in the above-described closed circuit. In this case, it is not required to cause the residual power of the coil to disappear in the closed circuit. In the inverter circuit for the SR motor, the residual power of the coil disappears in a closed circuit different from the above-described closed circuit (the demagnetization mode of FIG. 3). That is, in the inverter circuit for the SR motor, as illustrated in the demagnetization mode of FIG. 3, a different closed circuit for causing the residual power of the coil to disappear can be formed of not the IGBT Q1 and IGBT Q2 which are the switching elements but the diode FWD1 and diode FWD2 that allow a current to flow only in one direction. In this manner, the inverter circuit for the SR motor has a feature in which the closed circuit in the excitation mode of FIG. 3 is different from the closed circuit in the demagnetization mode of FIG. 3. Because of this feature, the inverter circuit for the SR motor includes two terminals such as terminals TE(U1) and TE(U2) as illustrated in FIG. 4B. Because of this, the inverter circuit for the SR motor is different from the inverter circuit for the PM motor in that the former inverter circuit includes two terminals such as the terminals TE(U1) and TE(U2) disposed between the upper arm and the lower arm as illustrated in FIG. 4B, while the latter inverter circuit includes one terminal such as the terminal TE(U) disposed between the upper arm and the lower arm as illustrated in FIG. 4A.

The above description says that, because of the difference between the inverter circuits, a configuration of an electronic device (power module) that embodies the inverter circuit for the SR motor according to the present first embodiment is different from a configuration of an electronic device (power module) that embodies the inverter circuit for the PM motor. Here, in the electronic apparatus that embodies the inverter circuit, it has been attempted to increase its performance and achieve downsizing so as to be suitable for the PM motor which has been conventionally mainly used. However, in the SR motor for which needs have been growing rapidly because of cost reduction requirements, the increase in its performance and the achievement of its downsizing suitable for the electronic apparatus controlling the SR motor have not advanced so much. Accordingly, in the present first embodiment, attention is paid to the SR motor for which needs have been growing rapidly because of cost reduction requirements, and improvements are devised for achieving the high performance and the downsizing of the electronic apparatus which embodies the inverter circuit for the SR motor, and of a semiconductor device making up the electronic apparatus. A technical concept according to the present first embodiment to which the improvements are devised will be described below. Major improvements according to the present first embodiment are a package structure (mounting structure) of a semiconductor device that embodies the inverter circuit for the SR motor and a layout of an electronic apparatus. First, IGBTs and diodes included in the semiconductor device will be described, and then, features of the present first embodiment will be described.

<Structure of IGBT>

The structure of the IGBT Q1 and the diode FWD1 which make up the inverter circuit INV of the present first embodiment will be described with reference to drawings. The inverter circuit INV of the present first embodiment includes the IGBT Q1 and IGBT Q2, and the diode FWD1 and diode FWD2. Since the IGBT Q1 and IGBT Q2 have the same configuration as each other, and besides, the diode FWD1 and diode FWD2 have the same configuration as each other, the IGBT Q1 and the diode FWD1 will be cited for the description as representative examples.

Figure 5:
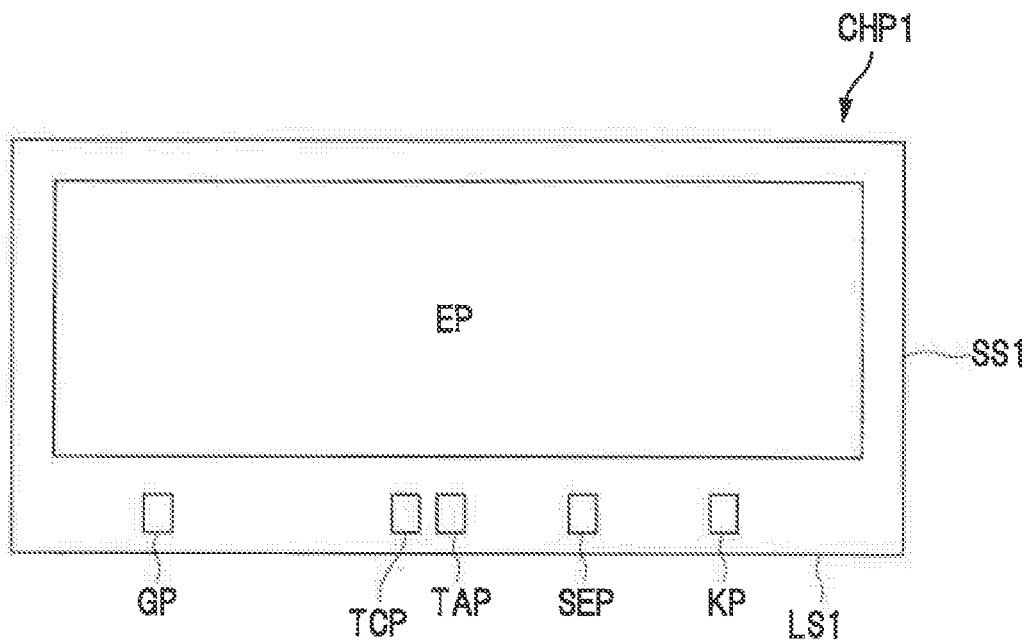
FIG. 5 is a plan view illustrating the outline of a semiconductor chip having an IGBT formed therein.

FIG. 5 is a plan view illustrating an outline shape of a semiconductor chip CHP1 on which the IGBT Q1 is formed. FIG. 5 illustrates a main surface (front surface) of the semiconductor chip CHP1. As illustrated in FIG. 5, the plane shape of the semiconductor chip CHP1 of the present first embodiment is a rectangle having long sides LS1 and short sides SS1. On the front surface of the rectangular semiconductor chip CHP1, a rectangular emitter electrode pad EP is formed. Along the long side direction of the semiconductor chip CHP1, a plurality of electrode pads are formed. Specifically, a gate electrode pad GP, a temperature detecting electrode pad TCP, a temperature detecting electrode pad TAP, a current detecting electrode pad SEP, and a Kelvin detecting electrode pad KP are arranged as the electrode pads from a left side in FIG. 5. In this manner, on the front surface of the rectangular semiconductor chip CHP1, the emitter electrode pad EP and an electrode pad are arranged in the short side direction, and the plurality of electrode pads are formed in the long side direction. At this time, the size (plane area) of the emitter electrode pad EP is significantly larger than that of each of the plurality of electrode pads.

Figure 6:
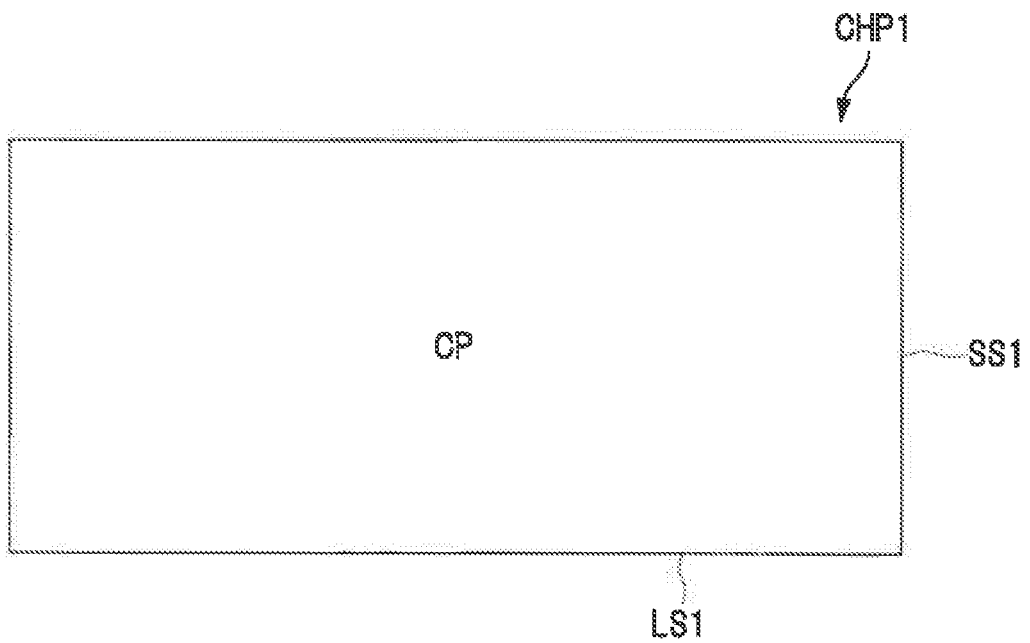
FIG. 6 is a plan view illustrating a back surface opposite to a front surface of the semiconductor chip.

FIG. 6 is a plan view illustrating the back surface opposite to the front surface of the semiconductor chip CHP1. As illustrated in FIG. 6, a rectangular collector electrode pad CP is formed over the whole back surface of the semiconductor chip CHP1.

Figure 7:
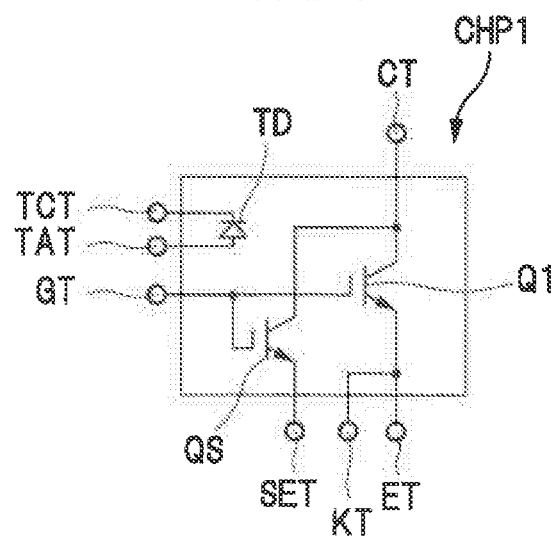
FIG. 7 is a circuit diagram illustrating an example of a circuit formed on the semiconductor chip.

Subsequently, a configuration of a circuit formed on the semiconductor chip CHP1 will be described. FIG. 7 is a circuit diagram illustrating an example of the circuit formed on the semiconductor chip CHP1. As illustrated in FIG. 7, the IGBT Q1, a detecting IGBT QS, and a temperature detecting diode TD are formed on the semiconductor chip CHP1. The IGBT Q1 is the main IGBT which is used for drive control over the SR motor MT of FIG. 2. On this IGBT Q1, an emitter electrode, a collector electrode, and a gate electrode are formed. The emitter electrode of the IGBT Q1 is electrically connected to an emitter terminal ET via the emitter electrode pad EP of FIG. 5, and the collector electrode of the IGBT Q1 is electrically connected to a collector terminal CT via the collector electrode pad CP of FIG. 6. The gate electrode of the IGBT Q1 is electrically connected to a gate terminal GT via the gate electrode pad GP of FIG. 5.

The gate electrode of the IGBT Q1 is connected to the gate control circuit GCC of FIG. 2. At this time, a signal from the gate control circuit GCC is applied to the gate electrode of the IGBT Q1 via the gate terminal GT, so that the switching operation of the IGBT Q1 can be controlled by the gate control circuit GCC.

The detecting IGBT QS is provided to detect an overcurrent flowing between the collector and the emitter of the IGBT Q1. That is, as the inverter circuit INV, the detecting IGBT QS is provided to detect the overcurrent flowing between the collector and the emitter of the IGBT Q1 and protect the IGBT Q1 from damage caused by the overcurrent. In the detecting IGBT QS, the collector electrode of the detecting IGBT QS is electrically connected to the collector electrode of the IGBT Q1, while the gate electrode of the detecting IGBT QS is electrically connected to the gate electrode of the IGBT Q1. The emitter electrode of the detecting IGBT QS is electrically connected to a current detecting terminal SET, which is different from the emitter electrode of the IGBT Q1, via the current detecting electrode pad SEP of FIG. 5. The current detecting electrode terminal SET is connected to an external current detecting circuit. This current detecting circuit detects a current flow between the collector and the emitter of the IGBT Q1 based on output from the emitter electrode of the detecting IGBT QS, and cuts off a gate signal applied to the gate electrode of the IGBT Q1 when the overcurrent flows to protect the IGBT Q1.

Specifically, the detecting IGBT QS is used as a current detecting element for preventing the overcurrent flow through the IGBT Q1 due to load short-circuit, etc. For example, the detecting IGBT QS is designed so that a ratio between a current flowing through the main IGBT Q1 and a current flowing through the detecting IGBT QS is expressed as "IGBT Q1: the detecting IGBT QS=1000:1". That is, when a current of 200 A is caused to flow through the main IGBT Q1, a current of 200 mA flows through the detecting IGBT QS.

In a practical application, a sense resistance electrically connected to the emitter electrode of the detecting IGBT QS is externally provided, and a voltage on both ends of the sense resistance is fed back to a control circuit. The control circuit performs control so as to cut off a power supply when the voltage on both ends of the sense resistance becomes equal to or higher than a set voltage. That is, when a current flowing through the main IGBT Q1 becomes the overcurrent, a current flowing through the detecting IGBT QS also increases. As a result, a current flowing through the sense resistance also increases, and therefore, it can be found out that the current flow through the main IGBT Q1 is in the overcurrent state when the voltage on both ends of the sense resistance increases and is equal to or higher than the set voltage.

The temperature detecting diode TD is provided to detect the temperature of the IGBT Q1 (roughly speaking, a temperature of the semiconductor chip CHP1). That is, the temperature of the IGBT Q1 is detected by a change in the voltage of the temperature detecting diode TD caused by a change in the temperature of the IGBT Q1. In the temperature detecting diode TD, a p-n junction is formed by injecting different impurities into polysilicon. The temperature detecting diode TD has a cathode electrode (negative electrode) and an anode electrode (positive electrode). The cathode electrode is electrically connected to a temperature detecting terminal TCT of FIG. 7 via the temperature detecting electrode pad TCP (see FIG. 5) formed on the upper surface of the semiconductor chip CHP1 through internal wiring. Similarly, the anode electrode is electrically connected to a temperature detecting terminal TAT of FIG. 7 via the temperature detecting electrode pad TAP (see FIG. 5) formed on the upper surface of the semiconductor chip CHP1 through internal wiring.

The temperature detecting terminal TCT and temperature detecting terminal TAT are connected to an externally-provided temperature detecting circuit. This temperature detecting circuit indirectly detects the temperature of the IGBT Q1, based on output between the temperature detecting terminal TCT and the temperature detecting terminal TAT which are connected to the cathode electrode and the anode electrode of the temperature detecting diode TD, respectively. When a detected temperature is equal to or higher than a certain temperature, a gate signal applied to the gate electrode of the IGBT Q1 is cut off, so that the IGBT Q1 is protected.

When a forward voltage equal to or higher than a certain value is applied as described above, the temperature detecting diode TD formed of a p-n junction diode has a property of rapid increase in a forward current flowing through the temperature detecting diode TD. The voltage value at which the forward current flow rapidly starts changes depending on a temperature so that this voltage value is lower as the temperature is higher. In the present first embodiment, this property of the temperature detecting diode TD is used. That is, the temperature can be indirectly monitored by causing a certain current to flow through the temperature detecting diode and measuring a voltage on both ends of the temperature detecting diode TD. A practical application controls an element operating temperature so as not to exceed a guaranteed value (e.g., 15° C. to 175° C.) by feeding back the voltage value (temperature signal) of the temperature detecting diode TD measured as described above to the control circuit.

Next, in FIG. 7, the emitter electrode of the IGBT Q1 is electrically connected to the emitter terminal ET and also to a Kelvin terminal KT which is a different terminal from the emitter terminal ET. This Kelvin terminal KT is electrically connected to the Kelvin detecting electrode pad KP (see FIG. 5) formed on the upper surface of the semiconductor chip CHP1 through internal wiring. Therefore, the emitter electrode of the IGBT Q1 is electrically connected to the Kelvin terminal KT via the Kelvin detecting electrode pad KP. The Kelvin terminal KT is used as a main terminal for testing the IGBT Q1. That is, when a voltage sense measurement is taken at the emitter terminal ET of the IGBT Q1 in a test in which a large current is caused to flow through the main IGBT Q1, a large current flows through the emitter terminal ET, and therefore, a voltage drop due to wiring resistance becomes too large to ignore, and it is difficult to accurately measure an on-voltage. Accordingly, in the present first embodiment, the Kelvin terminal KT is provided as a voltage sense terminal which is electrically connected to the emitter terminal ET of the IGBT Q1 but through which a large current does not flow. Thus, in the test in which a large current is caused to flow, the on-voltage of the IGBT Q1 can be measured without being affected by the large current by measuring the voltage of the emitter electrode at the Kelvin terminal KT. Further, the Kelvin terminal KT is used also as an electrically independent reference pin for gate drive output.

As described above, the semiconductor chip CHP1 of the present first embodiment is so configured that it can be connected to the control circuits including the current detecting circuit, temperature detecting circuit, etc., and therefore, the operation reliability of the IGBT Q1 included in the semiconductor chip CHP1 can be improved.

<Device Structure of IGBT>

Figure 8:
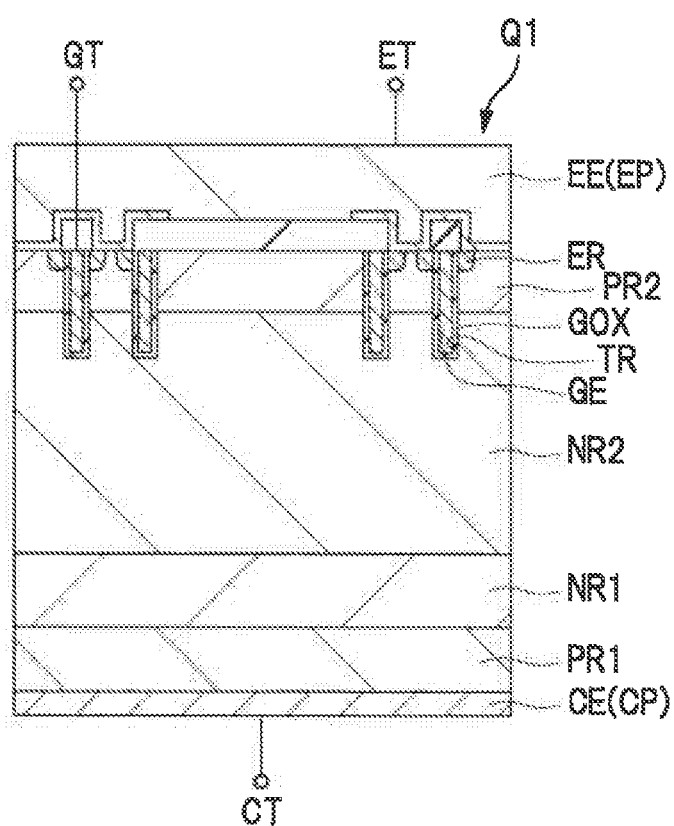
FIG. 8 is a cross-sectional view illustrating the device structure of the IGBT of the present first embodiment.

Subsequently, the device structure of the IGBT Q1 will be described. FIG. 8 is a cross-sectional view illustrating the device structure of the IGBT Q1 of the present first embodiment. In FIG. 8, the IGBT Q1 has a collector electrode CE (collector electrode pad CP) formed on the back surface of the semiconductor chip, and a $p^+$-type semiconductor region PR1 is formed on the collector electrode CE. An $n^+$-type semiconductor region NR1 is formed on the $p^+$-type semiconductor region PR1, and an $n^-$-type semiconductor region NR2 is formed on the n-type semiconductor region NR1. A p-type semiconductor region PR2 is formed on the $n^-$-type semiconductor region NR2, and trenches TR which penetrate the p-type semiconductor region PR2 to reach the $n^-$-type semiconductor region NR2 are formed. Further, $n^+$-type semiconductor regions ER which serve as emitter regions are formed so that they are matched to the trenches TR. Inside each trench TR, for example, a gate insulating film GOX made of silicon oxide is formed, and a gate electrode GE is formed via the gate insulating film GOX. The gate electrode GE is made of, for example, a polysilicon film, and is formed so as to fill the inside of the trench TR. FIG. 8 illustrates a trench gate structure, but the structure is not limited to the trench gate structure. For example, an IGBT using a planar gate structure formed on a silicon substrate may be applicable although not illustrated.

In the IGBT Q1 configured as described above, the gate electrode GE is connected to the gate terminal GT via the gate electrode pad GP of FIG. 5. Similarly, the $n^+$-type semiconductor region ER, which serves as the emitter region, is electrically connected to the emitter terminal ET via an emitter electrode EE (emitter electrode pad EP). The $p^+$-type semiconductor region PR1, which serves as a collector region, is electrically connected to the collector electrode CE formed on the back surface of the semiconductor chip.

The IGBT Q1 configured as described above has both of the high-speed switching and voltage drive characteristics of the power MOSFET and the low on-voltage characteristics of the bipolar transistor.

Note that the $n^+$-type semiconductor region NR1 is referred to as buffer layer. This $n^+$-type semiconductor region NR1 is formed to prevent a punch-through phenomenon in which, when the IGBT Q1 is turned off, a depletion layer growing from the p-type semiconductor region PR2 into the $n^-$-type semiconductor region NR2 contacts the $p^+$-type semiconductor region PR1 formed below the $n^-$-type semiconductor region NR2. The $n^+$-type semiconductor region NR1 is formed in order to limit the amount of holes injected from the $p^+$-type semiconductor region PR1 into the $n^-$-type semiconductor region NR2 or others.

<Operation of IGBT>

Next, an operation of the IGBT Q1 according to the present first embodiment will be described. First, an operation of turning on of the IGBT Q1 will be described. In FIG. 8, a MOSFET having the trench gate structure is turned on by applying a sufficient positive voltage to a region between the gate electrode GE and the $n^+$-type semiconductor region ER which serves as the emitter region. In this case, forward bias in the region between the $n^-$-type semiconductor region NR2 and the $p^+$-type semiconductor region PR1 which serves as the collector region occurs, so that positive holes are injected from the $p^+$-type semiconductor region PR1 into the $n^-$-type semiconductor region NR2. Subsequently, electrons equivalent to the positive charges of the injected positive holes gather in the $n^-$-type semiconductor region NR2. In this manner, a resistance of the $n^-$-type semiconductor region NR2 is decreased (a conductivity thereof is modulated), so that the IGBT Q1 becomes in the on-state.

The on-voltage includes the junction voltage between the $p^+$-type semiconductor region PR1 and the $n^-$-type semiconductor region NR2. However, the resistance value of the $n^-$-type semiconductor region NR2 decreases by one or more orders of magnitude because of the conductivity modulation. Therefore, in such a high breakdown voltage as occupying most of the on-resistance, the IGBT Q1 has an on-voltage lower than the on-voltage of the power MOSFET. Therefore, it can be said that the IGBT Q1 is a device effective for achieving the high breakdown voltage. That is, in the power MOSFET, it is required to increase the thickness of its epitaxial layer serving as a drift layer in order to achieve the high breakdown voltage. However, in this case, the on-resistance also increases. On the other hand, in the IGBT Q1, even if the thickness of the $n^-$-type semiconductor region NR2 is increased in order to achieve the high breakdown voltage, the conductivity is modulated when the IGBT Q1 is turned on. Therefore, the on-resistance can be lower than that of the power MOSFET. That is, in comparison of the IGBT Q1 with the power MOSFET, a low on-resistance device can be achieved even when the high breakdown voltage is achieved.

Subsequently, an operation of turning off of the IGBT Q1 will be described. By the drop of the voltage applied to the region between the gate electrode GE and the $n^+$-type semiconductor region ER which serves as the emitter region, the MOSFET having the trench gate structure is turned off. In this case, the injection of the positive holes from the $p^+$-type semiconductor region PR1 into the $n^-$-type semiconductor region NR2 stops, and the already-injected positive holes run out of their lives and become fewer. The remaining positive holes flow out directly into the p⁺-type semiconductor region PR1 (tail current). When the flowing out is completed, the IGBT Q1 turns off. In this manner, the IGBT Q1 can be turned on and off.

<Structure of Diode>

Figure 9:
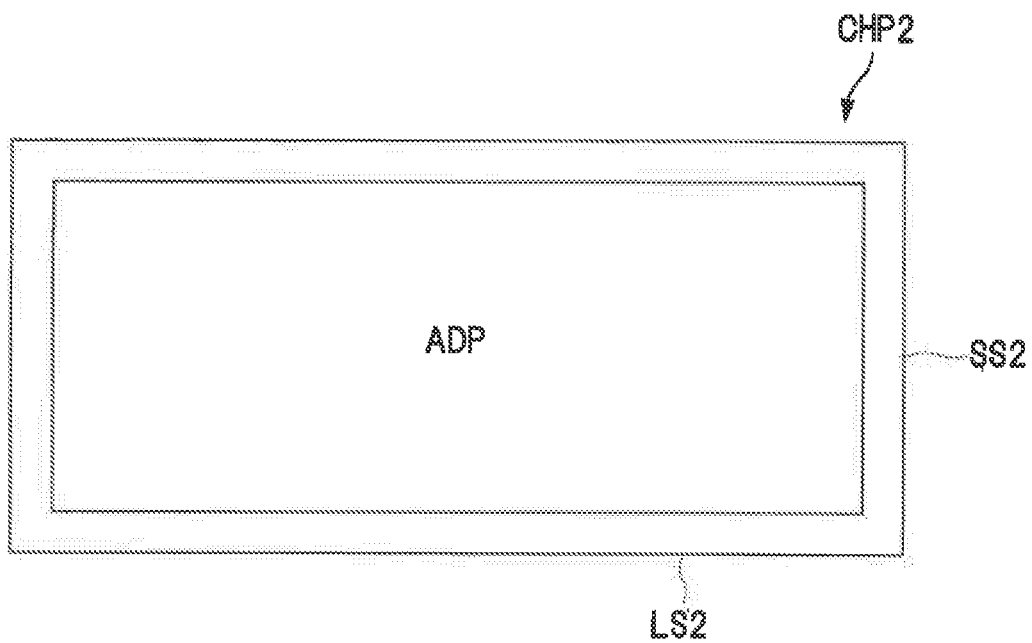
FIG. 9 is a plan view illustrating the outline of a semiconductor chip having a diode formed therein.

Next, FIG. 9 is a plan view illustrating an outline shape of a semiconductor chip CHP2 on which the diode FWD1 is formed. FIG. 9 illustrates the main surface (front surface) of the semiconductor chip CHP2. As illustrated in FIG. 9, the plane shape of the semiconductor chip CHP2 of the present first embodiment is a rectangular shape having long sides LS2 and short sides SS2. On the front surface of the rectangular semiconductor chip CHP2, a rectangular anode electrode pad ADP is formed. On the other hand, a rectangular cathode electrode pad is formed over the whole back surface opposite to the front surface of the semiconductor chip CHP2 although not illustrated.

Figure 10:
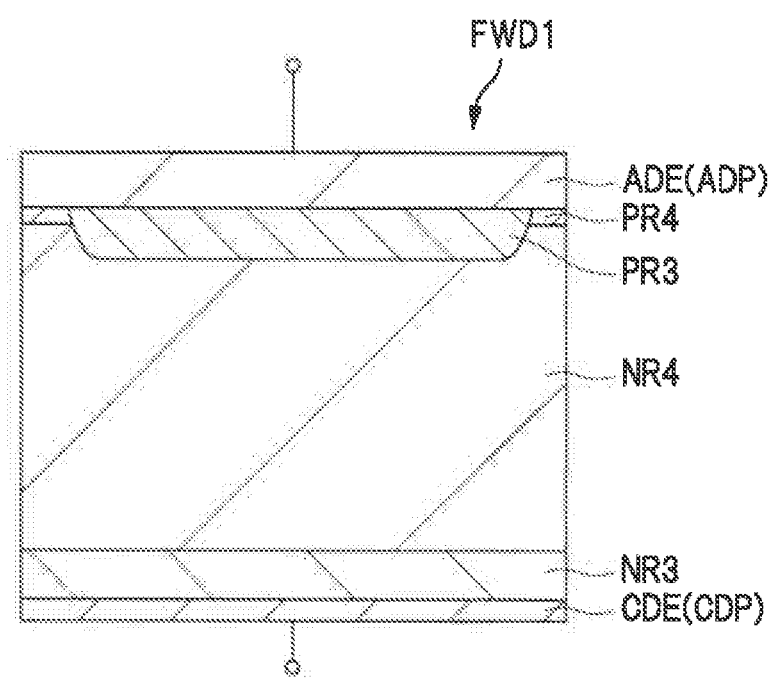
FIG. 10 is a cross-sectional view illustrating the device structure of the diode.

Subsequently, the device structure of the diode FWD1 will be described. FIG. 10 is a cross-sectional view illustrating the device structure of the diode FWD1. In FIG. 10, a cathode electrode CDE (cathode electrode pad CDP) is formed on the back surface of the semiconductor chip, and an n-type semiconductor region NR3 is formed on the cathode electrode CDE. An n⁻-type semiconductor region NR4 is formed on the n⁺-type semiconductor region NR3, and a p⁻-type semiconductor region PR3 is formed on the n⁻-type semiconductor region NR4. On the p-type semiconductor region PR3 and a p⁻-type semiconductor region PR4, an anode electrode ADE (anode electrode pad ADP) is formed. The anode electrode ADE is made of, for example, aluminum and silicon.

<Operation of Diode>

According to the diode FWD1 configured as described above, when a positive voltage is applied to the anode electrode ADE and a negative voltage is applied to the cathode electrode CDE, forward bias in a p-n junction between the n⁻-type semiconductor region NR4 and the p-type semiconductor region PR3 occurs, so that the current flows. On the other hand, when a negative voltage is applied to the anode electrode ADE and a positive voltage is applied to the cathode electrode CDE, reverse bias in the p-n junction between the n⁻-type semiconductor region NR4 and the p-type semiconductor region PR3, so that the current does not flow. The diode FWD1 having a rectifying function can operate as described above.

<Requirement for Improvement>

For example, the PM motor is generally used as a motor that drives an electric car, hybrid car, etc. An electronic apparatus making up an inverter circuit is required for controlling the PM motor. It has been attempted to achieve the high performance and the downsizing of this electronic apparatus suitable for the generally mainly used PM motor. From the viewpoint of the high performance and the downsizing, the electronic apparatus obtained by embodying the inverter circuit for the PM motor and the semiconductor device which is a component of the electronic apparatus have been improved.

In recent years, needs for the SR motor have been growing because of cost reduction requirements. However, the SR motor lies in a situation of no much progress of the achievement of such high performance and such downsizing as being applicable to the electronic apparatus that controls the SR motor. For example, the configuration of the inverter circuit for the PM motor is different from the configuration of the inverter circuit for the SR motor, and therefore, the electronic apparatus making up the inverter circuit for the PM motor is inevitably different from the electronic apparatus making up the inverter circuit for the SR motor. Therefore, the electronic apparatus making up the inverter circuit for the PM motor cannot be used directly as the electronic apparatus making up the inverter circuit for the SR motor. Since the payment for the attention of the SR motor that is advantageous for the cost reduction has started in recent years, study on the achievement of the high performance and the downsizing of the electronic apparatus making up the inverter circuit for the SR motor delays.

Specifically, the conventional electronic apparatus making up the inverter circuit for the SR motor is achieved by, for example, bare-chip mounting of six semiconductor chips each having an IGBT formed thereon and six semiconductor chips each having a diode formed thereon on a ceramic substrate. Such a bare-chip mounting product has an advantage in which a circuit configuration can be supported by a substrate layout but requires to be improved in terms of productivity, general-purpose use, and reliability.

For example, as the requirement for the improvement in terms of the productivity, large loss of members can be cited since, when it is determined that even one semiconductor chip is defective at the stage of completing the bare-chip mounting product, other non-defective semiconductor chips are waste. As the requirement for the improvement in terms of the general-purpose use, a small degree of freedom in a mounting configuration and an outline size larger than requires can be cited since a size and a terminal arrangement are fixed. As the requirement for the improvement in terms of the reliability, a fact that the semiconductor chip tends to directly receive damage can be cited since the semiconductor chip is not sealed with a sealing material made of a resin.

As described above, the electronic apparatus making up the inverter circuit for the SR motor has the requirements for the improvement in terms of the productivity, the general-purpose use, and the reliability since the above-described bare-chip mounting product is the main stream, and besides, has the requirements for the improvement also in terms of the achievement of the high performance and the downsizing of the electronic apparatus. Accordingly, in the present first embodiment, improvements are devised for achieving the high performance and the downsizing of the electronic apparatus making up the inverter circuit for the SR motor and of the semiconductor device making up the electronic apparatus. A technical concept of the present first embodiment to which the improvements are devised will be described below.

<Mounting Configuration of Semiconductor Device According to First Embodiment>

A semiconductor device according to the present first embodiment relates to the inverter circuit INV of FIG. 2, and is constructed by arranging one IGBT and one diode, which are components making up the inverter circuit INV, into a single package. That is, the electronic apparatus (power module) serving as the three-phase inverter circuit INV that drives a three-phase motor is configured by using six semiconductor devices of the present first embodiment.

Figure 11:
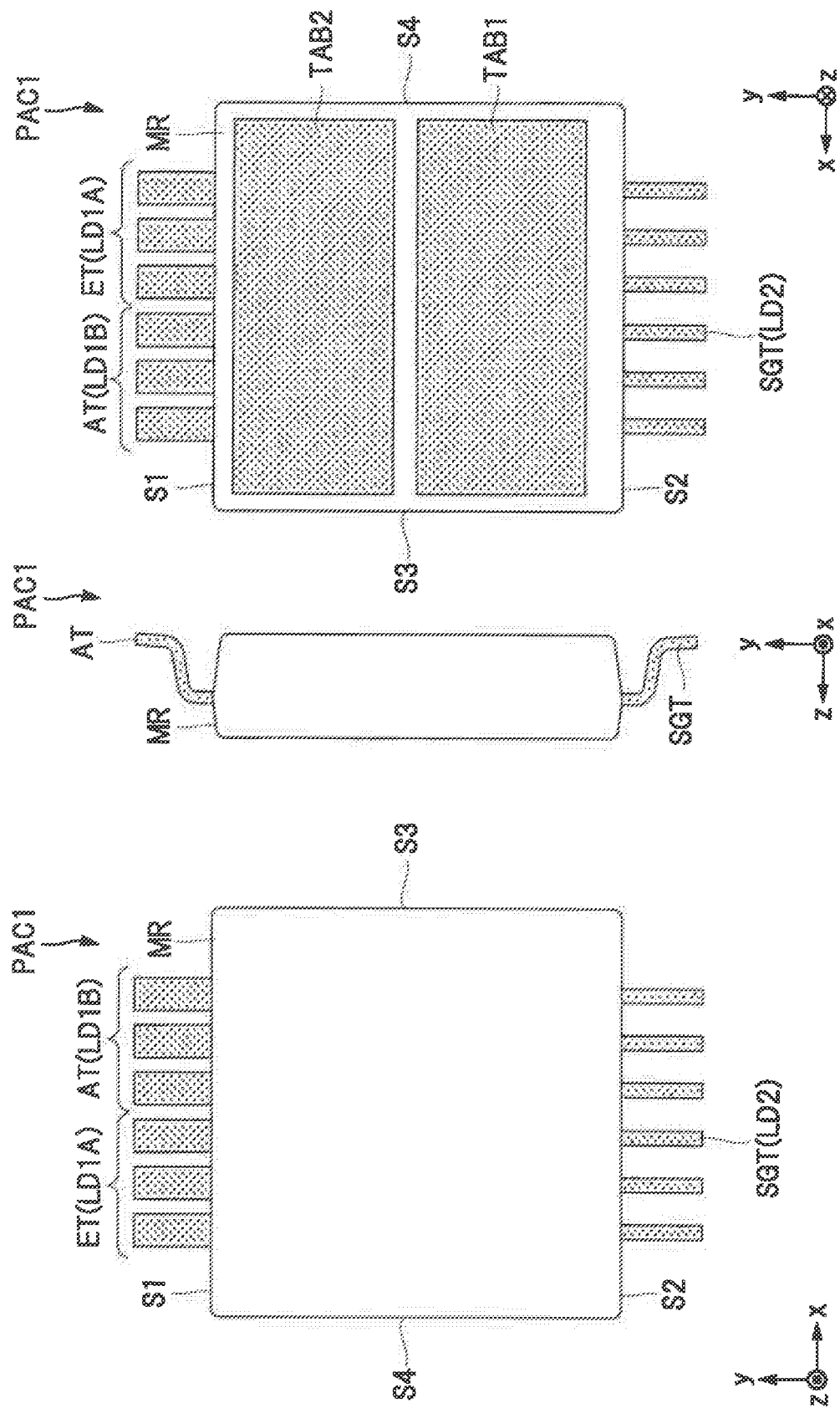
FIG. 11A is a plan view of the semiconductor device of the present first embodiment that is viewed from its front surface.
FIG. 11B is a side view of the semiconductor device of the present first embodiment that is viewed from its one side.
FIG. 11C is a plan view of the semiconductor device of the present first embodiment that is viewed from its back surface.

Each of FIGS. 11A to 11C illustrates an outer appearance configuration of a semiconductor device PAC1 according to the present first embodiment. Specifically, FIG. 11A is a plan view of the semiconductor device PAC1 of the present first embodiment that is viewed from its front surface (upper surface), FIG. 11B is a side view of the semiconductor device PAC1 of the present first embodiment that is viewed from its one side, and FIG. 11C is a plan view of the semiconductor device PAC1 of the present first embodiment that is viewed from its back surface (lower surface).

As illustrated in FIGS. 11A to 11C, the semiconductor device PAC1 of the present first embodiment has a square sealing material MR made of a resin. This sealing material MR has an upper surface illustrated in FIG. 11A, a lower surface illustrated in FIG. 11C that is opposite to the upper surface, and a first side surface and a second side surface opposite to the first side surface, the first and second side surfaces being located between the upper surface and the lower surface in the thickness direction of the sealing material MR. Each of FIGS. 11A and 11C illustrates a side S1 making up the first side surface and a side S2 making up the second side surface. The side S1 extends in the x direction, and the side S2 extends also in the x direction. The sealing material MR also has a third side surface (FIG. 11B) intersecting with the first and second side surfaces, and a fourth side surface intersecting with the first and second side surfaces and opposite to the third side surface. Each of FIGS. 11A and 11C illustrates a side S3 making up the third side surface and a side S4 making up the fourth side surface. That is, the sealing material MR has the side S3 extending in the y direction intersecting with the x direction, and the side S4 opposite to the side S3.

Here, in the semiconductor device PAC1 according to the present first embodiment, as illustrated in FIGS. 11A to 11C, a part of each of a plurality of leads LD1A and a part of each of a plurality of leads LD1B protrude from the first side surface, and a part of each of a plurality of leads LD2 protrudes from the second side surface. At this time, the leads LD1A make up the emitter terminal ET, the leads LD1B make up an anode terminal AT, and the leads LD2 make up signal terminals SGT. In a plan view, the leads LD1A and LD1B are arranged along the side S1 of the sealing material MR, the side S1 extending in the x direction (first direction). At this time, the width of each of the plurality of leads LD1A making up the emitter terminal ET is larger than the width of each of the plurality of leads LD2 making up the signal terminals SGT. Similarly, the width of each of the plurality of leads LD1B making up the anode terminal AT is larger than the width of each of the plurality of leads LD2 making up the signal terminals SGT. These widths are made by taking account of a fact that a minute current flows through the signal terminal SGT while it is required to reduce a resistance as much as possible in the emitter terminal ET and anode terminal AT since a large current flows therethrough. In the semiconductor device PAC1 of the present first embodiment, as illustrated in FIG. 11A, note that there is no lead arranged along the sides S3 and S4 of the sealing material MR.

According to the semiconductor device PAC1 of the present first embodiment, as illustrated in FIG. 11C, a chip mounting portion TAB1 and a chip mounting portion TAB2 are exposed from the back surface of the sealing material MR. These chip mounting portion TAB1 and chip mounting portion TAB2 are arranged so that they are physically separated by the sealing material MR. As a result, the chip mounting portion TAB1 and the chip mounting portion TAB2 are electrically separated from each other. That is, the semiconductor device PAC1 of the present first embodiment has the chip mounting portion TAB1 and the chip mounting portion TAB2 electrically separated from each other by the sealing material MR, and the back surface of the chip mounting portion TAB1 and the back surface of the chip mounting portion TAB2 are exposed from the back surface of the sealing material MR.

Figure 12:
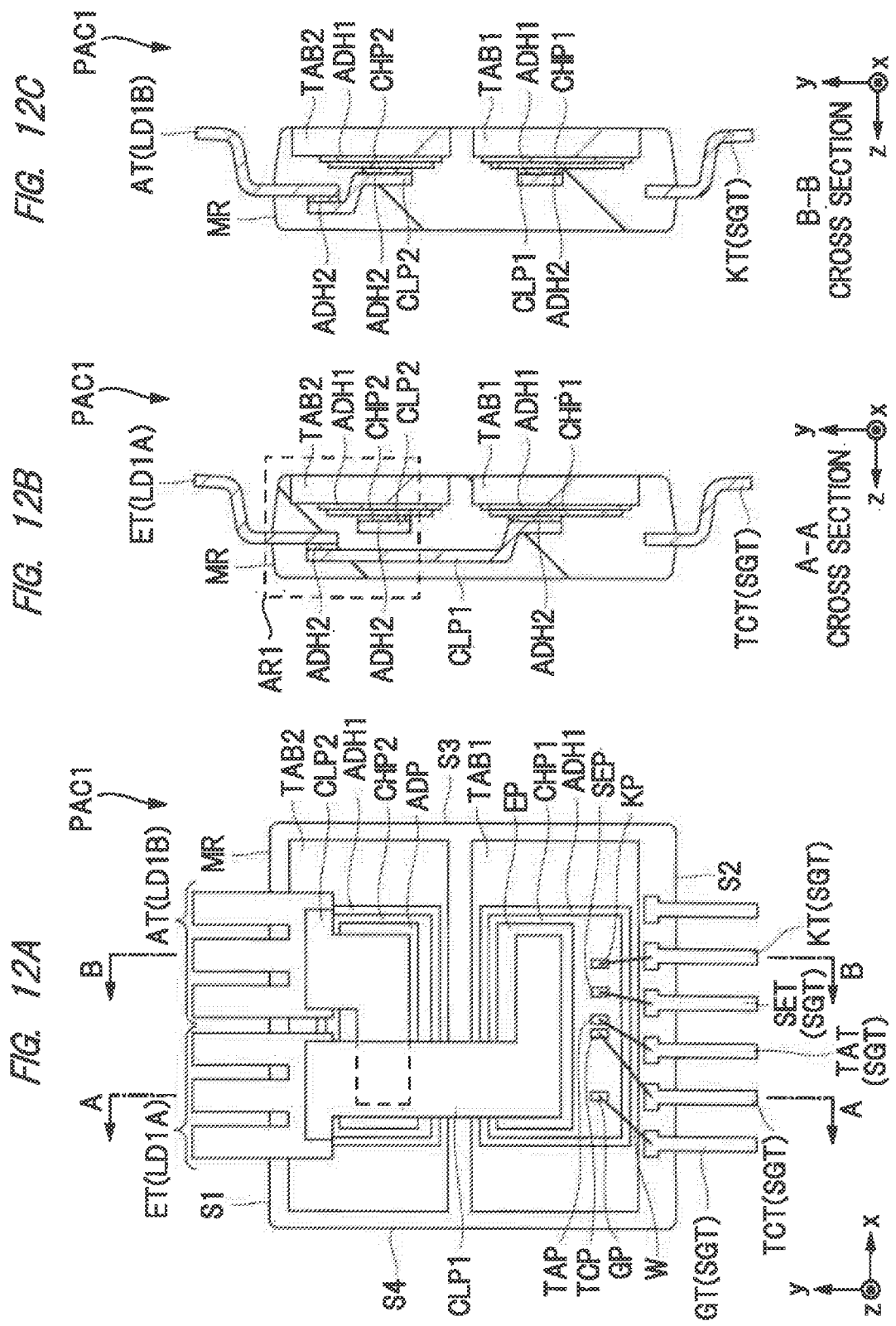
FIG. 12A is a plan view illustrating the internal structure of the semiconductor device of the present first embodiment.
FIG. 12B is a cross-sectional view taken along a line A-A of FIG. 12A.
FIG. 12C is a cross-sectional view taken along a line B-B of FIG. 12A.

Subsequently, the internal structure of the semiconductor device PAC1 of the present first embodiment will be described. Each of FIGS. 12A to 12C illustrates the internal structure of the semiconductor device PAC1 of the present first embodiment. Specifically, FIG. 12A corresponds to a plan view, FIG. 12B corresponds to a cross-sectional view taken along a line A-A of FIG. 12A, and FIG. 12C corresponds to a cross-sectional view taken along a line B-B of FIG. 12A.

First, in FIG. 12A, the lead LD1A that is the emitter terminal ET has a part (first part) sealed with the sealing material MR and a part (second part) exposed from the sealing material MR, and the second part of the lead LD1A is divided into a plurality of parts because of formation of slits. Similarly, the lead LD1B that is the anode terminal AT has a part (third part) sealed with the sealing material MR and a part (fourth part) exposed from the sealing material MR, and the fourth part of the lead LD1B is divided into a plurality of parts because of formation of slits.

Next, in FIG. 12A, the rectangular chip mounting portion TAB1 and the rectangular chip mounting portion TAB2 are arranged inside the sealing material MR, and the chip mounting portion TAB1 and the chip mounting portion TAB2 are separated from each other. These chip mounting portions TAB1 and TAB2 function also as heat spreaders for enhancing heat release efficiency, and are made of, for example, a material containing copper with high heat conductivity as a main component.

Here, a term "main component" in the present specification means the most-contained material component among components making up a member. For example, a term "material containing copper as a main component" means that the member material contains copper as the maximum content component. The usage of the term "main component" in the present specification is intended to express, for example, a fact that a member is basically made of copper but a case of additionally containing impurities in the member is not excluded.

On the chip mounting portion TAB1, the semiconductor chip CHP1 having the IGBT formed thereon is mounted via a conductive adhesive ADH1. At this time, a surface on which the semiconductor chip CHP1 is mounted is defined as a first upper surface of the chip mounting portion TAB1, and a surface opposite to the first upper surface is defined as a first lower surface. This case means that the semiconductor chip CHP1 is mounted on the first upper surface of the chip mounting portion TAB1. Specifically, the semiconductor chip CHP1 having the IGBT formed thereon is disposed so that the collector electrode CE (collector electrode pad CP) (see FIGS. 6 and 8) formed on the back surface of the semiconductor chip CHP1 is in contact with the first upper surface of the chip mounting portion TAB1 via the conductive adhesive ADH1. In this case, the emitter electrode pad EP and a plurality of electrode pads formed on the front surface of the semiconductor chip CHP1 are oriented upward.

On the other hand, on the chip mounting portion TAB2, the semiconductor chip CHP2 having the diode formed thereon is mounted via the conductive adhesive ADH1. At this time, a surface on which the semiconductor chip CHP2 is mounted is defined as a second upper surface of the chip mounting portion TAB2, and a surface opposite to the second upper surface is defined as a second lower surface. This case means that the semiconductor chip CHP2 is mounted on the second upper surface of the chip mounting portion TAB2. Specifically, the semiconductor chip CHP2 having the diode formed thereon is disposed so that the cathode electrode pad formed on the back surface of the semiconductor chip CHP2 is in contact with the second upper surface of the chip mounting portion TAB2 via the conductive adhesive ADH1. In this case, the anode electrode pad ADP formed on the front surface of the semiconductor chip CHP2 are oriented upward. Therefore, in the semiconductor device PAC1 of the present first embodiment, the chip mounting portion TAB1 and the chip mounting portion TAB2 are electrically separated from each other. This means that the collector electrode CE (collector electrode pad CP) (see FIGS. 6 and 8) of the semiconductor chip CHP1 that is disposed to be in contact with the first upper surface of the chip mounting portion TAB1 is electrically separated from the cathode electrode pad of the semiconductor chip CHP2 that is disposed to be in contact with the second upper surface of the chip mounting portion TAB2.

In FIG. 12A, note that a plane area of the chip mounting portion TAB1 is larger than a plane area of the semiconductor chip CHP1 having the IGBT formed thereon, and a plane area of the chip mounting portion TAB2 is larger than a plane area of the semiconductor chip CHP2 having the diode formed thereon.

Subsequently, as illustrated in FIG. 12A, a clip CLP1, which is a conductive member, is disposed on the emitter electrode pad EP of the semiconductor chip CHP1 via a conductive adhesive. This clip CLP1 is connected to the emitter terminal ET via a conductive adhesive. Therefore, the emitter electrode pad EP of the semiconductor chip CHP1 is electrically connected to the emitter terminal ET via the clip CLP1. The clip CLP1 is formed of, for example, a plate-shaped member made of copper as a main component. That is, in the present first embodiment, a large current flows from the emitter electrode pad EP of the semiconductor chip CHP1 to the emitter terminal ET, and therefore, the clip CLP1 securing a large area is used to allow such a large current flow.

As illustrated in FIG. 12A, the plurality of electrode pads are formed on the front surface of the semiconductor chip CHP1, and each of the plurality of the electrode pads is electrically connected to the signal terminal SGT via a wire W which is a conductive member. Specifically, the plurality of electrode pads include the gate electrode pad GP, the temperature detecting electrode pad TCP, the temperature detecting electrode pad TAP, the current detecting electrode pad SEP, and the Kelvin detecting electrode pad KP. The gate electrode pad GP is electrically connected to the gate terminal GT, which is one of the signal terminals SGT, via the wire W. Similarly, the temperature detecting electrode pad TCP is electrically connected to the temperature detecting terminal TCT, which is one of the signal terminals SGT, via the wire W, and the temperature detecting electrode pad TAP is electrically connected to the temperature detecting terminal TAT, which is one of the signal terminals SGT, via the wire W. The current detecting electrode pad SEP is electrically connected to the current detecting terminal SET, which is one of the signal terminals SGT, via the wire W, and the Kelvin detecting electrode pad KP is electrically connected to the Kelvin terminal KT via the wire W. At this time, the wire W is made of, for example, a conductive member containing gold, copper, or aluminum as a main component.

Meanwhile, as illustrated in FIG. 12A, a clip CLP2, which is a conductive member, is disposed on the anode electrode pad ADP of the semiconductor chip CHP2 via a conductive adhesive. This clip CLP2 is connected to the anode terminal AT via a conductive adhesive. Therefore, the anode electrode pad ADP of the semiconductor chip CHP2 is electrically connected to the anode terminal AT via the clip CLP2. The clip CLP2 is made of, for example, a plate-shaped member containing copper as a main component. That is, in the present first embodiment, a large current flows from the anode electrode pad ADP of the semiconductor chip CHP2 to the anode terminal AT, and therefore, the clip CLP2 securing a large area is used to allow such a large current flow.

Here, as illustrated in FIG. 12A, in a plan view, the chip mounting portion TAB2 is disposed between the side S1 of the sealing material MR (see FIG. 11A) and the chip mounting portion TAB1. This means that the semiconductor chip CHP2 is mounted on the chip mounting portion TAB2 so that the semiconductor chip CHP2 is located between the semiconductor chip CHP1 and the emitter terminal ET (and the anode terminal AT), and means that the semiconductor chip CHP1 is mounted on the chip mounting portion TAB1 so that the semiconductor chip CHP1 is located between the semiconductor chip CHP2 and the signal terminals SGT.

In other words, the emitter terminal ET and anode terminal AT, the semiconductor chip CHP2, the semiconductor chip CHP1, and the signal terminals SGT are arranged along the y direction. Specifically, in a plan view, the semiconductor chip CHP2 is mounted on the chip mounting portion TAB2 so that the semiconductor chip CHP2 is closer to the emitter terminal ET and anode terminal AT than the semiconductor chip CHP1, and the semiconductor chip CHP1 is mounted on the chip mounting portion TAB1 so that the semiconductor chip CHP1 is closer to the signal terminals SGT than the semiconductor chip CHP2.

In a plan view, the semiconductor chip CHP1 is mounted on the chip mounting portion TAB1 so that the gate electrode pad GP is closer to the signal terminals SGT than the emitter electrode pad EP. In still other words, in a plan view, the semiconductor chip CHP1 is mounted on the chip mounting portion TAB1 so that the plurality of electrode pads including the gate electrode pad GP, the temperature detecting electrode pad TCP, the temperature detecting electrode pad TAP, the current detecting electrode pad SEP, and the Kelvin detecting electrode pad KP are closer to the signal terminals SGT than the emitter electrode pad EP. In other words, in a plan view, it can be said that the plurality of electrode pads of the semiconductor chip CHP1 are arranged along the side closest to the signal terminals SGT among the all sides of the semiconductor chip CHP1. At this time, as illustrated in FIG. 12A, in a plan view, the clip CLP1 is disposed so as not to overlap any one of the plurality of electrode pads including the gate electrode pad GP and the plurality of wires W.

In FIG. 12A, the clip CLP1 and the clip CLP2 are electrically separated from each other. Thus, in consideration of the facts that the chip mounting portion TAB1 and the chip mounting portion TAB2 are electrically separated from each other and that the clip CLP1 and the clip CLP2 are also electrically separated from each other, the emitter terminal ET and the anode terminal AT are electrically separated from each other in the semiconductor device PAC1 of the present first embodiment.

In a plan view, the clip CLP1 is disposed so as to overlap the semiconductor chip CHP2. Specifically, as illustrated in FIG. 12A, in a plan view, the anode electrode pad ADP of the semiconductor chip CHP is formed on the front surface of the semiconductor chip CHP2 so that a part of the anode electrode pad ADP overlaps the clip CLP1, and the clip CLP2 is electrically connected to the anode electrode pad ADP so as to cover the anode electrode pad ADP. As a result, the clip CLP1 is disposed so as to overlap a part of the clip CLP2 located on the anode electrode pad ADP.

According to the semiconductor device PAC1 having such an internal structure, the semiconductor chip CHP1, the semiconductor chip CHP2, a part of the chip mounting portion TAB1, a part of the chip mounting portion TAB2, a part of the lead LD1A, a part of the lead LD1B, a part of each of the plurality of signal terminals SGT, the clip CLP1, the clip CLP2, and the wire W are sealed with the sealing material MR.

Subsequently, as illustrated in FIGS. 12B and 12C, the semiconductor chip CHP1 having the IGBT formed thereon is mounted on the chip mounting portion TAB1 via the conductive adhesive ADH1, while the semiconductor chip CHP2 having the diode formed thereon is mounted on the chip mounting portion TAB2 via the conductive adhesive ADH1.

As illustrated in FIG. 12B, the clip CLP1 is disposed on the front surface of the semiconductor chip CHP1 via a conductive adhesive ADH2. This clip CLP1 extends to pass above the semiconductor chip CHP2 and is connected to the emitter terminal ET by the conductive adhesive ADH2. A part of the emitter terminal ET is exposed from the sealing material MR. The semiconductor chip CHP1 is connected to the signal terminal SGT disposed opposite to the emitter terminal ET, via the wire W, and a part of the signal terminal SGT is also exposed from the sealing material MR.

Figure 13:
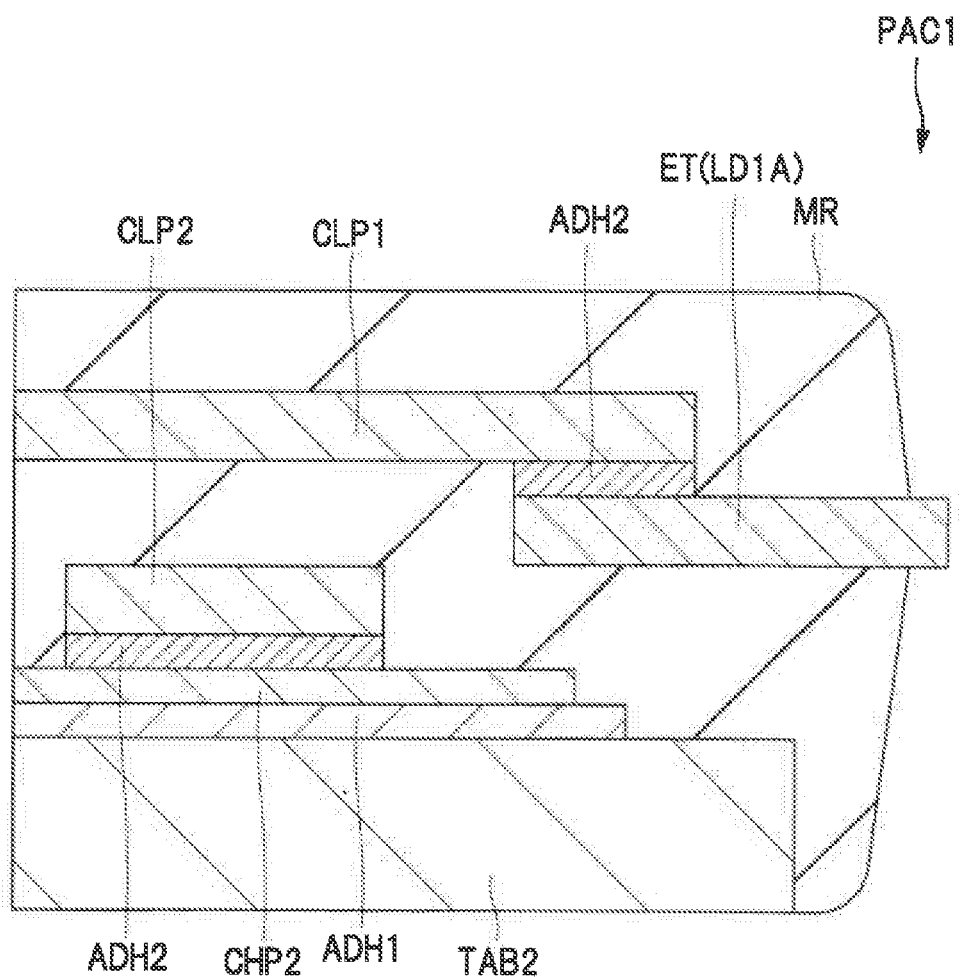
FIG. 13 is an enlarged view of a partial region of the cross-sectional view of FIG. 12B.

FIG. 13 is an enlarged view of a region AR1 of FIG. 12B. As illustrated in FIG. 13, it can be found that the clip CLP1 extends to pass above the clip CLP2 mounted on the semiconductor chip CHP2 via the conductive adhesive ADH2. That is, as illustrated in FIG. 13, it can be found that the clip CLP1 is disposed to be across above a part of the clip CLP2 while being away from the clip CLP2. From this fact, it can be found that the clip CLP1 and the clip CLP2 are physically separated from each other, and, as a result, the clip CLP1 and the clip CLP2 are electrically separated from each other.

As illustrated in FIG. 12C, the clip CLP2 is disposed on the front surface of the semiconductor chip CHP2 via the conductive adhesive ADH2. This clip CLP2 is connected to the anode terminal AT by the conductive adhesive ADH2, and a part of the anode terminal AT is exposed from the sealing material MR.

Here, as illustrated in FIGS. 12B and 12C, the lower surface of the chip mounting portion TAB1 is exposed from the lower surface of the sealing material MR, and this exposed lower surface of the chip mounting portion TAB1 serves as a collector terminal. The lower surface of the chip mounting portion TAB1 is a surface that can be soldered to a wiring formed on a mounting substrate when the semiconductor device PAC1 is mounted on the mounting substrate.

Similarly, the lower surface of the chip mounting portion TAB2 is exposed from the lower surface of the sealing material MR, and this exposed lower surface of the chip mounting portion TAB2 serves as a cathode terminal. The lower surface of the chip mounting portion TAB2 is a surface that can be soldered to a wiring formed on the mounting substrate when the semiconductor device PAC1 is mounted on the mounting substrate.

At this time, since the chip mounting portion TAB1 and the chip mounting portion TAB2 er electrically separated from each other as illustrated in FIGS. 12B and 12C, the collector terminal which is the lower surface of the chip mounting portion TAB1 and the cathode terminal which is the lower surface of the chip mounting portion TAB2 are electrically separated from each other.

As illustrated in FIGS. 12B and 12C, note that the chip mounting portion TAB1 and chip mounting portion TAB2 are made thicker than the emitter terminal ET, the anode terminal AT, and the signal terminals SGT.

According to the semiconductor device PAC1 of the present first embodiment, for example, silver paste containing a silver filler (Ag filler) while using a material such as an epoxy resin as a binder can be used as the conductive adhesives ADH1 and ADH2. This silver paste is a lead-free material containing no lead as a component, and therefore, has an environment-friendly advantage. The silver paste also has superior temperature cycle and power cycle properties, thus has an advantage of improving the reliability of the semiconductor device PAC1. When the silver paste is used, the silver paste can be thermally treated in, for example, a baking furnace which is less inexpensive than a vacuum reflow apparatus used for a solder reflow process, and therefore, the usage can obtain an advantage which is an inexpensive assembly facility of the semiconductor device PAC1.

However, the material of the conductive adhesives ADH1 and ADH2 is not limited to the silver paste, and, for example, solder can also be used. The case of the usage of the solder as the material of the conductive adhesives ADH1 and ADH2 has an advantage of reducing the on-resistance of the semiconductor device PAC1 because of a high electric conductivity of the solder. That is, by the usage of the solder, a performance of the semiconductor device PAC1 used for, for example, the inverter that requires the on-resistance reduction can be improved.

Here, after the semiconductor device PAC1 of the present first embodiment is completed as a product, the semiconductor device is mounted on a circuit board (mounting substrate). In this case, the solder is used for the connection between the semiconductor device PAC1 and the mounting substrate. The case of the connection by the solder requires a heat treatment (reflow process) since the solder is melted for the connection.

Therefore, when the solder used to connect the semiconductor 16 device PAC1 to the mounting substrate is the same material as the above-described solder used inside the semiconductor device PAC1, the solder used inside the semiconductor device PAC1 is also melted by the heat treatment (reflow process) applied in the connection between the semiconductor device PAC1 and the mounting substrate. This case causes a problem of occurrence of cracks on the resin sealing the semiconductor device PAC1 because of volume expansion due to the molten solder and a problem of leakage of the molten solder to outside.

For this reason, a solder with a high melting point is used inside the semiconductor device PAC1. In this case, the solder with the high melting point used inside the semiconductor device PAC1 is not melted by the heat treatment (reflow process) applied in the connection between the semiconductor device PAC1 and the mounting substrate. This result can prevent the problem of occurrence of cracks on the resin sealing the semiconductor device PAC1 because of volume expansion due to the molten solder with the high melting point and the problem of leakage of the molten solder to outside.

As the solder used to connect the semiconductor device PAC1 to the mounting substrate, a solder represented by, for example, tin (Sn)-silver (Ag)-copper (Cu) whose melting point is about 220° C. is used. During the reflow process, the semiconductor device PAC1 is heated up to about 260° C.

From this fact, the solder with the high melting point described in the present specification means, for example, a solder that does not melt even when heated up to about 260° C. Representatively, the solder is, for example, a solder having a melting point of 300° C. or higher, a reflow temperature of about 350° C., and containing Pb (lead) of 90 wt. % or more.

Basically, in the semiconductor device PAC1 of the present first embodiment, it is assumed that the conductive adhesive ADH1 and conductive adhesive ADH2 are made of the same material as each other. However, their materials are not limited to this, and, for example, the material making up the conductive adhesive ADH1 and the material making up the conductive adhesive ADH2 may be different from each other.

As described above, the semiconductor device PAC1 of the present first embodiment are mounted.

<Features of Semiconductor Device of First Embodiment>

Next, features of the semiconductor device PAC1 of the present first embodiment will be described. As illustrated in FIG. 12A, a first feature according to the present first embodiment is that the semiconductor device PAC1 (package product) which is a single package of one semiconductor chip CHP1 having the IGBT formed thereon and one semiconductor chip CHP2 having the diode formed thereon is provided as the semiconductor device which is a component of the inverter circuit for the SR motor.

For example, the conventional electronic apparatus making up the inverter circuit for the SR motor is achieved by, for example, bare-chip mounting of six semiconductor chips each having the IGBT formed thereon and six semiconductor chips each having the diode formed thereon directly on the ceramic substrate. Such a bare-chip mounting product has an advantage in which a circuit configuration can be handled by substrate layout but has a requirement for improvement in terms of productivity and general-purpose use.

Specifically, as a demerit of the bare-chip mounting product, large loss of members can be cited since, when it is determined that even one semiconductor chip is defective at the stage of completing the bare-chip mounting product, other non-defective semiconductor chips are waste. And, the bare-chip mounting product also has demerits of a small degree of freedom in a mounting configuration and an outline size larger than requires since a size and a terminal arrangement are fixed. Further, it has a demerit of a fact that the semiconductor chip tends to directly receive damage since the semiconductor chip is not sealed with a sealing material made of a resin.

As described above, the electronic apparatus making up the inverter circuit for the SR motor is the above-described bare-chip mounting product, and therefore, has the requirements for the improvement in terms of the productivity, the general-purpose use, and the reliability which are unique for the bare-chip mounting product, and the electronic apparatus making up the inverter circuit for the SR motor is under a circumstance in which the achievement of the high performance and the downsizing has not been sufficiently studied. That is, the conventional electronic apparatus making up the inverter circuit for the SR motor has a premise of usage of the bare-chip mounting product as a component of this electronic apparatus, and loses a viewpoint of adopting a component other than the bare-chip mounting product. In other words, there is no idea of using a packaged semiconductor device as the component of the electronic apparatus making up the inverter circuit for the SR motor.

With regard to this point, a basic idea of the present first embodiment is the usage of the packaged semiconductor device as the component of the electronic apparatus making up the inverter circuit for the SR motor. Specifically, according to the present first embodiment, the semiconductor device making up the inverter circuit for the SR motor is achieved as the semiconductor device PAC1 which is in a single package of one semiconductor chip CHP1 having the IGBT formed thereon and one semiconductor chip CHP2 having the diode formed thereon. According to the present first embodiment, the electronic apparatus serving as the inverter circuit for the SR motor is configured by using a plurality of package products (semiconductor devices PAC1) which have been already determined to be non-defective. Therefore, in the present first embodiment, for example, even if a defective product is included in the plurality of package products, the defective product can be easily replaced. That is, in the present first embodiment, the electronic apparatus serving as the inverter circuit for the SR motor is composed of a plurality of package products, and therefore, a defective package product itself can be easily replaced, so that a problem of wasting the remaining non-defective package products can be prevented. As a result, according to the present first embodiment, loss of members can be significantly reduced, and a manufacturing cost can be reduced.

That is, in the case of the bare-chip mounting product, a plurality of semiconductor chips are mounted on the ceramic substrate as the bare chip mounting, and a pad of each semiconductor chip is connected to a terminal of the ceramic substrate via a wire. In this case, even if a (some) semiconductor chip of the plurality of semiconductor chips is determined as the defective, the defective semiconductor chip cannot be easily replaced. This is because the defective semiconductor chip is connected to the ceramic substrate via the wire, and, even if the defective semiconductor chip is removed and replaced with a new non-defective semiconductor chip, wire-bonding between the replaced non-defective semiconductor chip and the ceramic substrate is difficult.

On the other hand, in the present first embodiment, the electronic apparatus serving as the inverter circuit for the SR motor is composed of the plurality of package products, and therefore, a defective package product itself can be easily replaced. This is because, when a new non-defective package product is mounted after the defective package product is removed, wire-bonding is not required as different from the bare-chip mounting product, and it is only required to join a terminal protruding out of the package product to the mounting substrate by using solder or silver paste. That is, replacement work of the package product is extremely easier than replacement work of the bare-chip mounting product. As a result, the problem of wasting the remaining non-defectives products can be prevented.

In addition, in the package product according to the present first embodiment, the degree of freedom in the size and the terminal layout can be larger than that of the bare-chip mounting product, and therefore, the package product has an advantage which can improve the downsizing of the outer size by utilizing such a degree of freedom. The semiconductor chip is composed as the plurality of package products sealed with the sealing material made of the resin, and therefore, the package product has an advantage which can reduce the direct damage on the semiconductor chip more than the bare-chip mounting product. According to the above description, the first feature of the present first embodiment, which is the adoption of the package product (semiconductor device PAC1) as the component of the electronic apparatus serving as the inverter circuit for the SR motor, has a superior advantage which can promote the cost reduction, the downsizing, and the high reliability of the electronic apparatus.

Subsequently, a second feature of the present first embodiment is that the semiconductor device PAC1 produced in a single package is devised so as to achieve a configuration dedicated to the SR motor. A specific configuration of the second feature of the present first embodiment will be described below.

For example, as illustrated in FIG. 4A, in the inverter circuit for the PM motor, the upper arm is composed of the IGBT Q1 and the diode FWD1, the lower arm is composed of the IGBT Q2 and the diode FWD2, and the terminal TE(U) disposed between the upper arm and the lower arm is connected to the U-phase terminal of the PM motor. That is, in the inverter circuit for the PM motor, one terminal TE(U) is connected to the U-phase terminal of the PM motor.

On the other hand, as illustrated in FIG. 4B, also in the inverter circuit for the SR motor, the upper arm is composed of the IGBT Q1 and the diode FWD1, and the lower arm is composed of the IGBT Q2 and the diode FWD2. However, two terminals TE(U1) and TE(U2) are disposed between the upper arm and the lower arm. And, these two terminals TE(U1) and TE(U2) are connected to the SR motor. That is, the inverter circuit for the SR motor is different in that the terminals TE(U1) and TE(U2) separated from each other are disposed between the upper arm and the lower arm, from the inverter circuit for the PM motor in which only one terminal TE(U) is disposed between the upper arm and the lower arm.

Therefore, in the attention paid to the upper arm in the inverter circuit for the SR motor, the emitter of the IGBT Q1 is connected to the terminal TE(U1), while the anode of the diode FWD1 is connected to the terminal TE(U2). In consideration of the separation of the terminal TE(U1) from the terminal TE(U2), this means that the emitter of the IGBT Q1 and the anode of the diode FWD1 are separated from each other. On the other hand, in the attention paid to the lower arm in the inverter circuit for the SR motor, the collector of the IGBT Q2 is connected to the terminal TE(U2), while the cathode of the diode FWD2 is connected to the terminal TE(U1). In consideration of the separation of the terminal TE(U1) from the terminal TE(U2), this means that the collector of the IGBT Q2 and the cathode of the diode FWD2 are separated from each other. Hence, in order to achieve the configuration dedicated to the SR motor by the semiconductor device PAC1 produced in a single package and to make the configuration applicable to both upper and lower arms, it is required to configure the semiconductor device PAC1 so that the emitter of the IGBT and the anode of the diode are separated from each other and that the collector of the IGBT and the cathode of the diode are separated from each other. Practically, the semiconductor device PAC1 of the present first embodiment can be configured so that the emitter of the IGBT and the anode of the diode are separated from each other and that the collector of the IGBT and the cathode of the diode are separated from each other, and this configuration is the second feature of the present first embodiment.

Specifically, in FIG. 12A, the chip mounting portion TAB1 on which the semiconductor chip CHP1 having the IGBT is mounted is electrically separated from the chip mounting portion TAB2 on which the semiconductor chip CHP2 having the diode is mounted. In consideration of functioning the back surface of the semiconductor chip CHP1 having the IGBT as the collector and functioning the back surface of the semiconductor chip CHP2 having the diode as the cathode, the electrical separation between the chip mounting portion TAB1 and the chip mounting portion TAB2 means that the collector of the IGBT is electrically separated from the cathode of the diode. Hence, in the semiconductor device PAC1 of the present first embodiment, the configuration of the electrical separation between the collector of the IGBT and the cathode of the diode is achieved by the configuration of the electrical separation between the chip mounting portion TAB1 and the chip mounting portion TAB2.

Next, as illustrated in FIG. 12A, the emitter electrode pad EP formed on the front surface of the semiconductor chip CHP1 is electrically connected to the clip CLP1, and this clip CLP1 is electrically connected to the emitter terminal ET. On the other hand, the anode electrode pad ADP formed on the front surface of the semiconductor chip CHP2 is electrically connected to the clip CLP2, and this clip CLP2 is electrically connected to the anode terminal AT. At this time, in the semiconductor device PAC1 of the present first embodiment, the clip CLP1 and the clip CLP2 are electrically separated from each other. This means that the emitter electrode pad EP and the anode electrode pad ADP are electrically separated from each other. In other words, the emitter terminal ET and the anode terminal AT are electrically separated from each other. Hence, in the semiconductor device PAC1 of the present first embodiment, the configuration of the electrical separation between the collector of the IGBT and the cathode of the diode is achieved by the configuration of the electrical separation between the clip CLP1 and the clip CLP2.

As described above, according to the semiconductor device PAC1 of the present first embodiment, by such a second feature as the electrical separation between the chip mounting portion TAB1 and the chip mounting portion TAB2 and the electrical separation between the clip CLP1 and the clip CLP2, the emitter of the IGBT and the anode of the diode are separated from each other, and the collector of the IGBT and the cathode of the diode are separated from each other. Thus, in the semiconductor device PAC1 of the present first embodiment, the semiconductor device PAC1 formed in a single package can achieve the mounting configuration dedicated to the SR motor, and can achieve a configuration which is applicable to both upper and lower arms.

In the semiconductor device PAC1 of the present first embodiment, it is preferable that the chip mounting portion TAB1 and the chip mounting portion TAB2 are electrically separated from each other and that the clip CLP1 and the clip CLP2 are electrically separated from each other. This is because the semiconductor device PAC1 having such a configuration can use for the upper arm required to electrically separate the emitter of the IGBT from the anode of the diode, and also for the lower arm required to electrically separate the collector of the IGBT from the cathode of the diode. In this manner, the second feature of the present first embodiment obtains an advantage which shares the components since both upper and lower arms can be configured by the same structure.

However, in the semiconductor device PAC1 of the present first embodiment, at least the electrical separation between the chip mounting portion TAB1 and the chip mounting portion TAB2 or the electrical separation between the clip CLP1 and the clip CLP2 is only required. For example, as long as the configuration for the electrical separation between the chip mounting portion TAB1 and the chip mounting portion TAB2 is achieved, the clip CLP1 and the clip CLP2 may be electrically connected together. In such a case, the emitter terminal ET is electrically connected to the anode terminal AT, and therefore, the semiconductor device PAC1 cannot be used for the upper arm. However, the configuration for the electrical separation between the collector of the IGBT and the cathode of the diode is achieved, and therefore, the semiconductor device PAC1 can be used for the lower arm. On the other hand, for example, if the configuration for the electrical separation between the clip CLP1 and the clip CLP2 is achieved, the chip mounting portion TAB1 and the chip mounting portion TAB2 may be electrically connected together. In such a case, the collector of the IGBT is electrically connected to the cathode of the diode, and therefore, the semiconductor device PAC1 cannot be used for the lower arm. However, the configuration for the electrical separation between the emitter of the IGBT and the anode of the diode is achieved, the semiconductor device PAC1 can be used for the upper arm.

That is, from the viewpoint of the usage of the semiconductor device PAC1 of the present first embodiment for both upper and lower arms, the semiconductor device PAC1 desirably has the second feature of the present first embodiment. However, when a component dedicated to the upper arm and a component dedicated to the lower arm can be separately provided, at least the electrical separation between the chip mounting portion TAB1 and the chip mounting portion TAB2 or the electrical separation between the clip CLP1 and the clip CLP2 is only required.

Subsequently, a third feature of the present first embodiment is that, for example, the semiconductor chip CHP2 having the diode is mounted on the chip mounting portion TAB2 so that the semiconductor chip CHP2 is located between the emitter terminal ET and anode terminal AT and the semiconductor chip CHP1 having the IGBT in a plan view as illustrated in FIG. 12A. In other words, the third feature of the present first embodiment is such arrangement of the semiconductor chip CHP2 having the diode as being closer to the emitter terminal ET and anode terminal AT than the semiconductor chip CHP1 having the IGBT.

In this manner, the following advantage can be obtained. For example, according to the third feature of the present first embodiment, the length of the clip CLP2 connecting the anode terminal AT and the anode electrode pad ADP of the semiconductor chip CHP2 having the diode can be reduced. This means that the parasitic resistance of the clip CLP2 can be reduced, and, as a result, heat loss caused by the diode can be reduced. Particularly, in the inverter circuit for the SR motor, a ratio of the heat loss caused by the diode is large. Therefore, from the viewpoint of reducing the ratio of the heat loss caused by the diode, the third feature of the present first embodiment is useful.

Figure 14:
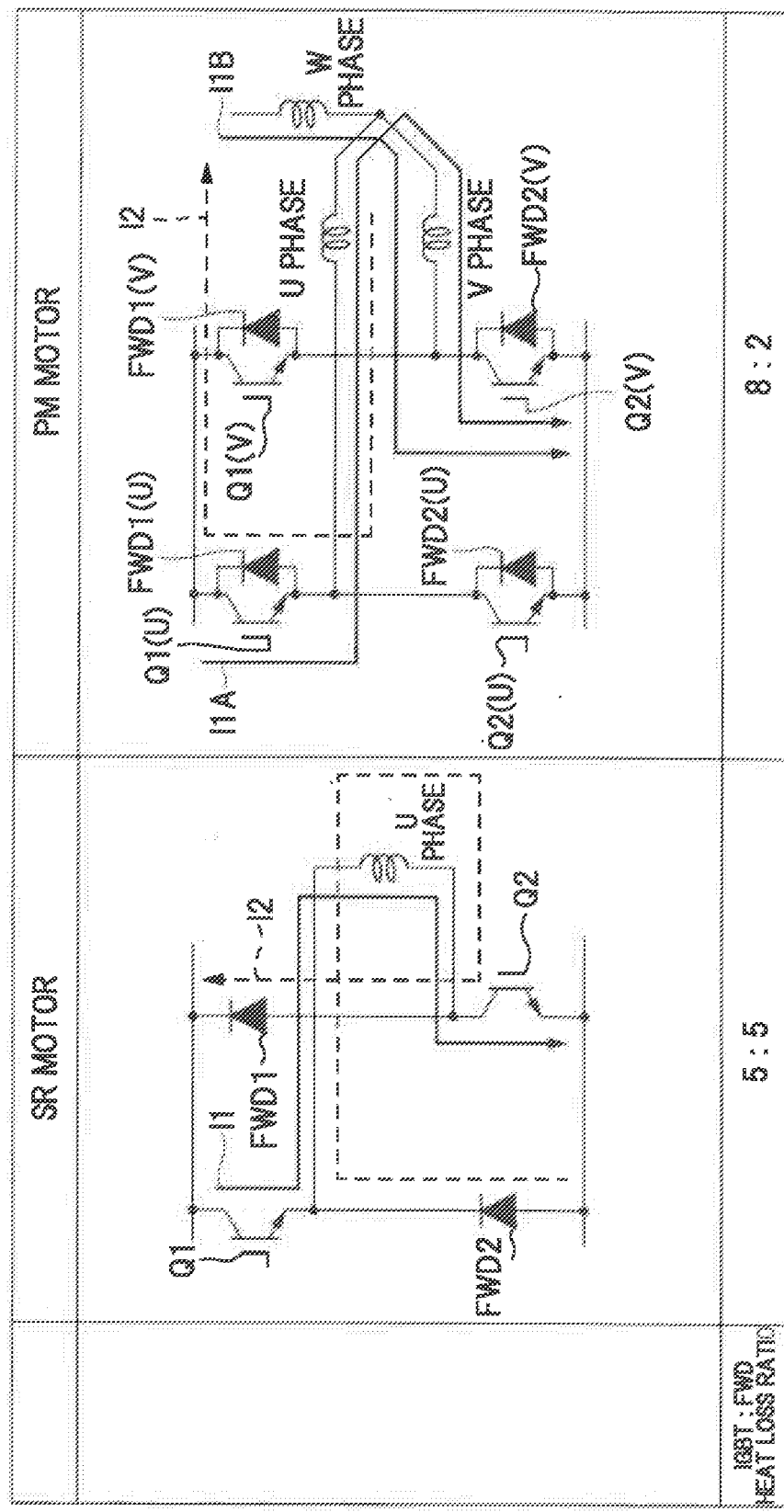
FIG. 14 is an explanatory diagram of a mechanism that makes a difference between the SR motor and the PM motor in the ratio between heat loss at the IGBT and heat loss at the diode.

This point will be specifically described below. FIG. 14 is a diagram for explaining a mechanism that makes a difference between the SR motor and the PM motor in the ratio between the heat loss at the IGBT and the heat loss at the diode. In FIG. 14, attention is paid to the PM motor first for the explanation.

In the PM motor, connection among the U-phase coil, V-phase coil, and W-phase coil which are the components of the PM motor is star connection arrangement, and a current is switched in a unit of two phases such as "U-phase coil+V-phase coil"→"V-phase coil+W-phase coil"→"W-phase coil+U-phase coil". Specifically, as illustrated in the right diagram of FIG. 14, the inverter circuit for the PM motor includes an upper arm composed of an IGBT Q1(U) and a diode FWD1(U) and a lower arm composed of an IGBT Q2(U) and a diode FWD2(U) so as to correspond to the U-phase coil. Similarly, the inverter circuit for the PM motor includes also an upper arm composed of the IGBT Q1(V) and a diode FWD1(V) and a lower arm composed of an IGBT Q2(V) and a diode FWD2(V) so as to correspond to the V-phase coil. At this time, first, a current I1A flows through a path such as "IGBT Q1(U)"→"U-phase coil"→"V-phase coil"-4 "IGBT Q2(V)". This is a main current flowing through the IGBT. When the switching occurs from "U-phase coil+V-phase coil" to "V-phase coil+W-phase coil", a current I1B flows through a path such as "W-phase coil"→"V-phase coil"→"IGBT Q2(V)". At this time, the main current does not flow through the U-phase coil because the U-phase coil is separated, and therefore, energy accumulated at the U-phase coil is released as a regenerative current I2. In the inverter circuit for the PM motor operated as described above, while the main current flows through two phases in the U-phase coil and V-phase coil, the regenerative current flows from a single phase (U-phase). In this manner, the inverter circuit for the PM motor has a feature of a larger main current that drives two phases than the regenerative current generated from a single phase (U phase). As a result, the main current flowing through the IGBT is larger than the regenerative current flowing through the diode. In this manner, a heat loss ratio of the inverter circuit for the PM motor is expressed as, for example, "IGBT:diode=8:2". This means that the inverter circuit for the PM motor has a relatively small heat loss influence due to the regenerative current flowing through the diode.

On the other hand, the SR motor includes the upper arm and the lower arm so as to correspond to the U-phase coil which is a component of the SR motor. Specifically, as illustrated in the left diagram of FIG. 14, the inverter circuit for the SR motor includes the upper arm composed of the IGBT Q1 and the diode FWD1 and the lower arm composed of an IGBT Q2 and the diode FWD2 so as to correspond to the U-phase coil. At this time, first, a current I1 flows through a path such as "IGBT Q1"→"U-phase coil-"→"IGBT Q2". This is a main current flowing through the IGBT. When the switching occurs from "U-phase coil" to "V-phase coil", the main current does not flow through the U-phase coil because the U-phase coil is separated, and therefore, energy accumulated at the U-phase coil is released as a regenerative current I2. The inverter circuit for the SR motor operated as described above has a feature in which the main current flowing through the IGBT and the regenerative current flowing through the diode have the same current value as each other. As a result, the main current flowing through the IGBT is the same as the regenerative current flowing through the diode. In this manner, a heat loss ratio of the inverter circuit for the SR motor is expressed as, for example, "IGBT:diode=5:5". This means that the inverter circuit for the SR motor has a larger heat loss influence due to the regenerative current flowing through the diode than the inverter circuit for the PM motor. Therefore, in the inverter circuit for the SR motor, it is more required to reduce the heat loss caused by the diode than the inverter circuit for the PM motor.

With regard to this respect, the semiconductor device PAC1 of the present first embodiment has the third feature of such arrangement of the semiconductor chip CHP2 having the diode as being closer to the emitter terminal ET and anode terminal AT than the semiconductor chip CHP1 having the IGBT. According to the third feature of the present first embodiment, the length of the clip CLP2 connecting the anode terminal AT and the anode electrode pad ADP of the semiconductor chip CHP2 having the diode can be reduced. This means that the parasitic resistance of the clip CLP2 can be reduced, and, as a result, this means that the heat loss caused by the diode can be reduced. Therefore, since the heat loss caused by the diode is large in the inverter circuit for the SR motor as illustrated in FIG. 14, the third feature of the present first embodiment is useful from the viewpoint of reducing the ratio of the heat loss caused by the diode.

Further, according to the third feature of the present first embodiment, the following advantage can be also obtained. That is, in the present first embodiment, the diode has a function of causing a return current (regenerative current) to flow therethrough in order to release electromagnetic energy accumulated in an inductance included in a load. At this time, this regenerative current from the load flows through the diode formed on the semiconductor chip CHP2. In this case, for example, if the distance between the anode terminal AT and the semiconductor chip CHP2 having the diode is large, the parasitic inductance of the wiring (clip CLP2) connecting the anode terminal AT to the diode is large. As a result, by the parasitic inductance of the clip CLP2, the flow of the regenerative current from the anode terminal AT into the diode is prohibited. That is, the parasitic inductance has a function of suppressing a current change as much as possible, and therefore, prohibits, for example, the start of the regenerative current flow from the anode terminal AT to the diode. Thus, when the parasitic inductance of the clip CLP2 connecting the anode terminal AT to the diode is large, it is difficult to flow the regenerative current into the diode.

From this viewpoint, even if the diode is provided in order to allow the regenerative current flow, when the parasitic inductance of the clip CLP2 connecting the anode terminal AT to the diode is large, such a function of the diode as flowing the regenerative current cannot be sufficiently exerted. Therefore, it is desirable to reduce the length of the clip CLP2 connecting the anode terminal AT to the diode as much as possible so that the parasitic inductance of the clip CLP2 is reduced.

With regard to this, according to the above-described third feature of the present first embodiment, the semiconductor chip CHP2 having the diode is located closer to the anode terminal AT. Therefore, the length of the clip CLP2 connecting the anode terminal AT to the diode is small, so that the parasitic inductance of the clip CLP2 can be reduced. As a result, according to the present first embodiment, the regenerative current flows easily from the anode terminal AT into the diode, so that such a function of the diode as flowing the regenerative current can be sufficiently exerted.

Next, since the semiconductor device PAC1 in the present first embodiment has the above-described third feature, for example, the clip CLP1 electrically connecting the emitter terminal ET and the emitter electrode pad EP of the semiconductor chip CHP1 having the IGBT is disposed so as to pass above the semiconductor chip CHP2 having the diode as illustrated in FIG. 12A. Based on this as a premise, in a fourth feature of the present first embodiment, the clip CLP1 overlaps a part of the clip CLP2 electrically connecting the semiconductor chip CHP2 to the anode terminal AT in a plan view. That is, according to the present first embodiment, while the clip CLP1 necessarily passes above the semiconductor chip CHP2 because of its third feature described above, the fourth feature of the present first embodiment is the extension of the clip CLP2 to a region that overlaps the clip CLP1 in a plan view. According to the fourth feature, a contact area between the semiconductor chip CHP2 and the clip CLP2 can be increased. This means that the parasitic resistance of the clip CLP2 can be reduced. According to the first embodiment, the heat loss caused by the diode which tends to become obvious in, particularly, the inverter circuit for the SR motor can be significantly reduced by a synergistic effect between the effect of reducing the parasitic resistance of the clip CLP2 that is achieved the above-described third feature and the effect of reducing the parasitic resistance of the clip CLP2 that is achieved by the fourth feature.

Subsequently, for example, as illustrated in FIG. 12A, a fifth feature of the present first embodiment is that the emitter terminal ET and anode terminal AT protrude from the side S1 of the sealing material MR while the signal terminals SGT protrude from the side S2 of the sealing material MR. That is, the fifth feature of the present first embodiment lies in the fact that the side of the sealing material MR from which the emitter terminal ET and anode terminal AT protrude is different from the side of the sealing material MR from which the signal terminals SGT protrude. More specifically, the signal terminals SGT protrude from a side opposite to the side of the sealing material MR from which the emitter terminal ET and anode terminal AT protrude.

In this case, for example, the following advantages can be obtained. A first advantage is that the emitter terminal ET and anode terminal AT can be arranged over the side S1 of the sealing material MR as illustrated in FIG. 12A. That is, it is assumed that the semiconductor device PAC1 of the present first embodiment is adopted to an inverter circuit through which a large current of several hundreds of A flows. Therefore, it is required to sufficiently secure a current path at the emitter terminal ET and anode terminal AT through which a large current flows. With regard to this, according to the present first embodiment, the emitter terminal ET and anode terminal AT can be arranged over the side S1 which is one side of the sealing material MR. This means that the current path at the emitter terminal ET and anode terminal AT can be sufficiently secured. As a result, according to the present first embodiment, the emitter terminal ET and anode terminal AT becoming the current path can be sufficiently secured, and therefore, the semiconductor device can be adopted to the inverter circuit through which a large current of several hundreds of A flows, and the resistances of the emitter terminal ET and anode terminal AT can be reduced. That is, in the present first embodiment, since the side of the sealing material MR from which the emitter terminal ET and anode terminal AT protrude is different from the side of the sealing material MR from which the signal terminals SGT protrude, the width of the emitter terminal ET and the width of the anode terminal AT can be increased without consideration of a space occupied by the signal terminals SGT. In this manner, the present first embodiment can provide the high-performance semiconductor device PAC1 capable of handling a large current and contributing to the reduction of the power consumption through the resistance reduction because the area occupied by the emitter terminal ET and anode terminal AT can be sufficiently secured.

Next, a second advantage is that the wires W can be arranged without being limited by the arrangement positions of the clips CLP1 and CLP2 because the emitter terminal ET, the anode terminal AT and the signal terminals SGT are arranged on sides opposite to each other as illustrated in FIG. 12A. For example, in FIG. 12A, the anode electrode pad ADP on the surface of the semiconductor chip CHP2 having the diode is electrically connected to the anode terminal AT located closer to the side S1 of the sealing material MR by the clip CLP2, and the emitter electrode pad EP of the semiconductor chip CHP1 having the IGBT is electrically connected to the emitter terminal ET located closer to the side S1 of the sealing material MR by the clip CLP1.

Meanwhile, the plurality of electrode pads formed on the front surface of the semiconductor chip CHP1 are electrically connected to the signal terminals SGT located closer to the side S2 of the sealing material MR by the wires W. Therefore, since the emitter terminal ET and anode terminal AT are located closer to the side S1 while the signal terminals SGT are located closer to the side S2, the clip CLP1 which is connected to the emitter terminal ET, the clip CLP2 which is connected to the anode terminal AT, and the wires W which are connected to the signal terminals SGT can be arranged without being limited by one another.

Particularly, as illustrated in FIG. 12A, the clip CLP1 and the wires W can be arranged without being limited by each other by a synergistic effect of such a layout structure of the emitter electrode pad EP and the plurality of electrode pads on the semiconductor chip CHP1 as arranging the emitter electrode pad EP to be closer to the side S1 and arranging the plurality of electrode pads to be closer to the side S2. This means that, for example, the lengths of the wires W can be reduced by reducing the distance between the signal terminals SGT and the plurality of electrode pads. As a result, a parasitic inductance existing at the wires W can be reduced, so that the stability of circuit operations can be improved.

Further, as illustrated in FIGS. 12B and 12C, a third advantage is improvement of the mounting stability at the mounting of the semiconductor device PAC1 on the mounting substrate since the leads protrude from both sides of the sealing material MR. Specifically, the semiconductor device PAC1 of the present first embodiment is electrically connected to terminals of the wiring substrate by the leads protruding from the sealing material MR processed into a gull-wing shape. Therefore, a structure in which the leads protrude from both sides of the sealing material MR is balanced well, and therefore, the mounting stability of the semiconductor device PAC1 on the wiring board is improved, so that the positional accuracy and soldering reliability at the mounting of the semiconductor device PAC1 can be improved.

Subsequently, a fourth advantage is remarkable particularly in usage with a large current of several hundreds of A. For example, in FIGS. 12A and 12B, according to the semiconductor device PAC1 of the present first embodiment, a large current flows from the collector terminal on the lower surface of the chip mounting portion TAB1 through a current path such as "IGBT formed inside the semiconductor chip CHP1"→"emitter electrode pad EP formed on the front surface of the semiconductor chip CHP1"→"clip CLP1"→"emitter terminal ET". Here, by the Ampere's rule, a current flow necessarily generates a magnetic field around the current flow. The larger an amount of the current flow is, the stronger the magnetic field is. Therefore, the more the large current flows, the stronger the magnetic field is. At this time, if the signal terminals SGT are located near the emitter terminal ET through which the large current flows, the magnetic field has an influence on the signal terminals SGT. Specifically, electromagnetic induced noises caused by the generated magnetic field are applied to the signal terminals SGT. In this case, if the electromagnetic induced noises are applied particularly to the gate terminal GT of the signal terminals SGT, a situation in which, for example, a voltage equal to or higher than a set voltage value is applied to the gate electrode of the IGBT occurs, and therefore, there is a risk of destruction of the IGBT. Similarly, other terminals than the gate terminal GT also have a risk of malfunctions in a current detecting circuit, a temperature detecting circuit, etc., because of the superimposed noises. That is, when the signal terminals SGT are arranged near the emitter terminal ET through which the large current flows, the electromagnetic induced noises are increased by the large magnetic field generated by the large current flow, and this exercises an adverse influence on the signal terminals SGT. That is, the signal terminals SGT are paths through which weak current signals or voltage signals are transmitted, and therefore, it is required to suppress the influence of the electromagnetic induced noises caused by the strong magnetic field in the large current as much as possible.

With regard to this, in the semiconductor device PAC1 of the present first embodiment, by the above-described fifth feature, the emitter terminal ET through which the large current flows and the signal terminals SGT through which the weak signals are transmitted are arranged on different and opposite sides to each other, and are arranged to be the furthest from each other. Therefore, according to the present first embodiment, it is possible on the signal terminals SGT to suppress the adverse influence of the electromagnetic induced noises caused by the strong magnetic field generated by the large current flowing through the emitter terminal ET. This means that the present first embodiment can improve the reliability of the semiconductor device PAC1 even when the large current is handled. This is the fourth advantage given by the fifth feature.

Further, a fifth advantage is that the signal terminals SGT can be also arranged on the side S2 of the sealing material MR. For example, in the semiconductor device PAC1 of the present first embodiment, the gate terminal GT, the temperature detecting terminal TCT, the temperature detecting terminal TAT, the current detecting terminal SET, and the Kelvin terminal KT are used as the signal terminals SGT. However, another signal terminal SGT can be easily added. That is, according to the fifth feature of the present first embodiment, multi-functionality because of the addition of another signal terminal SGT is easily achieved in view of achievement of higher performance and reliability.

Next, as illustrated in FIG. 12A, a sixth feature of the present first embodiment is that, for example, the semiconductor chip CHP1 having the IGBT and semiconductor chip CHP2 having the diode are of rectangles, and that the semiconductor chip CHP1 and semiconductor chip CHP2 are arranged so that the long sides of the rectangles are in parallel with the sides S1 and S2 of the sealing material MR that extend in the x direction. In this manner, the widths of the clips CLP1 and CLP2 in the x direction can be increased, so that the large current can be handled. By the increase in the widths of the clips CLP1 and CLP2 in the x direction, the resistances of the clips CLP1 and CLP2 can be reduced, so that the connection resistance between the emitter terminal ET and the semiconductor chip CHP1 and the connection resistance between the anode terminal AT and the semiconductor chip CHP2 can be reduced.

That is, according to the present first embodiment, the plane shapes of the semiconductor chip CHP1 and semiconductor chip CHP2 are formed into rectangles, so that each of the semiconductor chip CHP1 and semiconductor chip CHP2 has a long side. According to the present first embodiment, the semiconductor chip CHP1 and semiconductor chip CHP2 are arranged so that their long sides intersect with a protruding direction (y direction) of the emitter terminal ET and the anode terminal AT. As a result, when the clip CLP1 and clip CLP2 are arranged along the protruding direction (y direction) of the emitter terminal ET and the anode terminal AT, the widths of the clip CLP1 and clip CLP2 in the x direction can be increased by the long sides. This means that the present first embodiment can increase not only the widths of the emitter terminal ET and anode terminal AT arranged over the side S1 of the sealing material MR but also the widths of the clip CLP1 and clip CLP2 in the x direction. As a result, according to the present first embodiment, a wide current path extending from the clip CLP1 to the emitter terminal ET can be secured. In this manner, in the semiconductor device PAC1 of the present first embodiment, the large current can be handled, and the on-resistance can be reduced.

Further, according to the present first embodiment, the rectangular semiconductor chip CHP1 and semiconductor chip CHP2 are arranged so that their short sides are in parallel with the protruding direction (y direction) of the emitter terminal ET and the anode terminal AT. As a result, according to the present first embodiment, the distance in the y direction between the emitter terminal ET and the semiconductor chip CHP1 having the IGBT can be reduced. In other words, the length of the clip CLP1 in the y direction which connects the emitter terminal ET to the semiconductor chip CHP1 having the IGBT can be reduced. Thus, according to the present first embodiment, the distance between the emitter terminal ET and the semiconductor chip CHP1 having the IGBT can be reduced, and therefore, the on-resistance of the semiconductor device PAC1 can be reduced.

As described above, the sixth feature of the present first embodiment includes a premise in which each plane shape of the semiconductor chip CHP1 and semiconductor chip CHP2 is formed into the rectangle. By arranging the long sides of the rectangles along the x direction intersecting with the y direction in which the current flows, the widths of the clip CLP1 and clip CLP2 in the x direction (direction perpendicular to the direction of the current flow) can be increased. On the other hand, the short sides of the rectangles are arranged along the y direction of the current flow, and therefore, the lengths of the clip CLP1 and CLP2 in the y direction (the lengths of the same in the direction of the current flow) can be reduced. That is, according to the sixth feature of the present first embodiment, the widths of the clip CLP1 and CLP2 in the x direction perpendicular to the direction of the current flow can be increased, and the lengths of the same in the y direction which is the direction of the current flow can be reduced, and therefore, the on-resistance of the semiconductor device PAC1 can be sufficiently reduced.

Subsequently, as illustrated in FIGS. 12B and 12C, a seventh feature of the present first embodiment is that, for example, the thickness of the chip mounting portion TAB1 and the thickness of the chip mounting portion TAB2 are larger than the thickness of each of the leads making up the emitter terminal ET, the anode terminal AT, and the signal terminals SGT, and that the lower surface of the chip mounting portion TAB1 and that of the chip mounting portion TAB2 are exposed from the sealing material MR. In this manner, first, since the lowers surfaces of the chip mounting portion TAB1 and chip mounting portion TAB2 are exposed from the sealing material MR, the heat release efficiency of the semiconductor device PAC1 can be improved. Further, according to the present first embodiment, since the thickness of the chip mounting portion TAB1 and the thickness of the chip mounting portion TAB2 are large, the heat release efficiency of the semiconductor device PAC1 can be also improved. The large thickness of the chip mounting portion TAB1 and the large thickness of the chip mounting portion TAB2 means a large volume of the chip mounting portion TAB1 and a large volume of the chip mounting portion TAB2, and this means a large heat capacity of the chip mounting portion TAB1 and a large heat capacity of the chip mounting portion TAB2. In this manner, a rise in the temperature of the semiconductor device PAC1 can be suppressed. That is, in the semiconductor device PAC1 of the present first embodiment, the heat release efficiency can be improved, and the heat capacity can be increased by a synergistic effect of the exposure of the chip mounting portions TAB1 and TAB2 from the sealing material MR and the large thicknesses of the chip mounting portions TAB1 and TAB2.

Therefore, according to the semiconductor device PAC1 of the present first embodiment, by the improvement of the heat release efficiency and the increase of the heat capacity, the temperature rise resulting from heat generation can be suppressed. As a result, according to the semiconductor device PAC1 of the present first embodiment, destruction of an element caused by an internal temperature rise can be suppressed, so that the reliability of the semiconductor device PAC1 can be improved.

According to the semiconductor device PAC1 of the present first embodiment, note that the lower surface of the chip mounting portion TAB1 is exposed from the sealing material MR, and this exposed surface functions as the collector terminal. Similarly, the lower surface of the chip mounting portion TAB2 is exposed from the sealing material MR, and this exposed surface functions as the cathode terminal. In this manner, according to the present first embodiment, the chip mounting portion TAB1 has not only the function of mounting the semiconductor chip CHP1 but also the function of serving as the heat spreader that improves the heat efficiency and the function of serving as the collector terminal. Similarly, the chip mounting portion TAB2 has not only the function of mounting the semiconductor chip CHP2 but also the function of serving as the heat spreader that improves the heat efficiency and the function of serving as the cathode terminal.

<Example of Combination of Semiconductor Devices of First Embodiment>

An example of a mounting configuration in which the inverter circuit is embodied by combining the semiconductor devices PAC1 of the present first embodiment will be described below.

Figure 15:
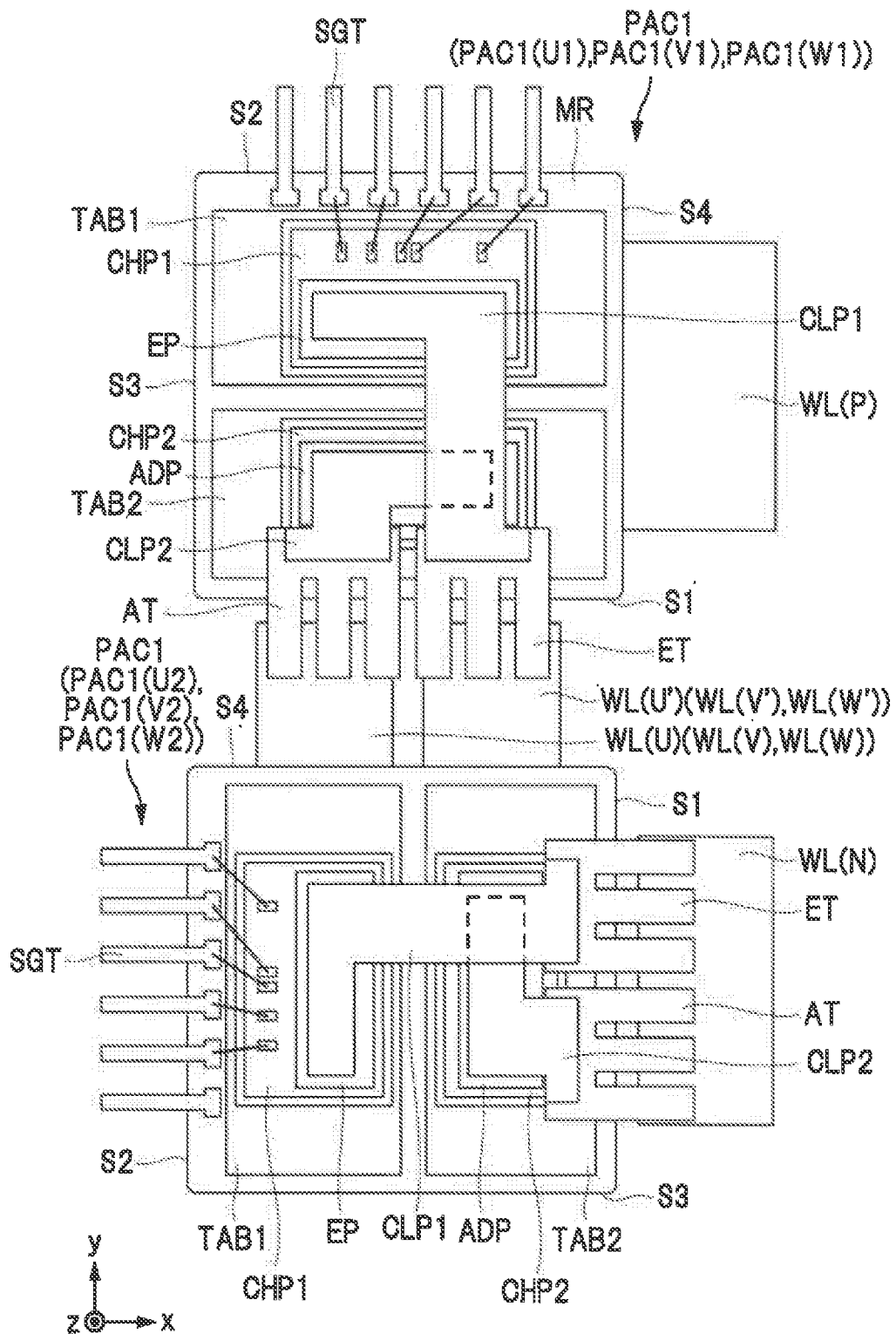
FIG. 15 is a diagram illustrating an example of a mounting configuration that realizes a part of the inverter circuit for the SR motor illustrated in FIG. 4B.

FIG. 15 is a diagram illustrating an example of a mounting configuration in which a part of the inverter circuit for the SR motor illustrated in FIG. 4B is embodied. In FIG. 15, the semiconductor device PAC1 located on the upper side makes up the upper arm, while the semiconductor device PAC1 located on the lower side makes up the lower arm. As illustrated in FIG. 15, the semiconductor device PAC1 making up the upper arm is electrically connected to a wiring WL(P) to which a power supply voltage is supplied. Specifically, the wiring WL(P) is electrically connected to both of the lower surfaces of the chip mounting portions TAB1 and TAB2 which are exposed from the lower surface of the sealing material MR of the semiconductor device PAC1 making up the upper arm.

At this time, the lower surface of the chip mounting portion TAB1 functions as the collector terminal, and the lower surface of the chip mounting portion TAB2 functions as the cathode terminal, and therefore, the collector terminal and the cathode terminal in the semiconductor device PAC1 making up the upper arm are electrically connected to each other by the wiring WL(P). This configuration corresponds to the configuration illustrated in FIG. 4B in which the collector of the IGBT Q1 and the cathode of the diode FWD1 are electrically connected to each other.

The emitter terminal ET of the semiconductor device PAC1 making up the upper arm is electrically connected to a wiring WL(U'), while the anode terminal AT of the semiconductor device PAC1 making up the upper arm is electrically connected to a wiring WL(U). Meanwhile, the wiring WL(U') is electrically connected to the lower surface of the chip mounting portion TAB2 exposed from the lower surface of the sealing material MR of the semiconductor device PAC1 making up the lower arm. The wiring WL(U) is electrically connected to the lower surface of the chip mounting portion TAB1 exposed from the lower surface of the sealing material MR of the semiconductor device PAC1 making up the lower arm. In this manner, the emitter terminal ET of the semiconductor device PAC1 making up the upper arm is electrically connected to the chip mounting portion TAB2 of the semiconductor devices PAC1 making up the lower arm via the wiring WL(U'). Similarly, the anode terminal AT of the semiconductor device PAC1 making up the upper arm is electrically connected to the chip mounting portion TAB1 of the semiconductor device PAC1 making up the lower arm via the wiring WL(U). Therefore, in consideration of the function of the lower surface of the chip mounting portion TAB1 as the collector terminal and the function of the lower surface of the chip mounting portion TAB2 as the cathode terminal, the emitter terminal ET of the semiconductor device PAC1 making up the upper arm is electrically connected to the cathode terminal of the semiconductor device PAC1 making up the lower arm, while the anode terminal AT of the semiconductor devices PAC1 making up the upper arm is electrically connected to the collector terminal of the semiconductor device PAC1 making up the lower arm. This configuration corresponds to the electrical connection between the emitter of the IGBT Q1 and the cathode of the diode FWD2 illustrated in FIG. 4B, and corresponds to the electrical connection between the collector of the IGBT Q2 and the anode of the diode FWD1 illustrated in FIG. 4B.

Both of the emitter terminal ET and anode terminal AT of the semiconductor device PAC1 making up the lower arm are electrically connected to a wiring WL(N) to which a reference potential (such as a ground potential) is supplied. This configuration corresponds to the electrical connection between the emitter of the IGBT Q2 and the anode of the diode FWD2 illustrated in FIG. 4B.

As described above, it is understood that, for example, a part of the inverter circuit for the SR motor illustrated in FIG. 4B is embodied by combining the semiconductor devices PAC1 of the present first embodiment. Here, the example of embodying a part of the inverter circuit for the SR motor by using the semiconductor devices PAC1 of the present first embodiment has been described. Eventually, the semiconductor device PAC1 of the present first embodiment becomes a component of the electronic apparatus including the inverter circuit for the SR motor. An example of a mounting configuration of the electronic apparatus will be described later.

<Method for Manufacturing Semiconductor Device of First Embodiment>

The semiconductor device of the present first embodiment is configured as described above, and a method for manufacturing this semiconductor device will be described below with reference to drawings.

1. Chip Mounting Portion Preparing Process

Figure 16:
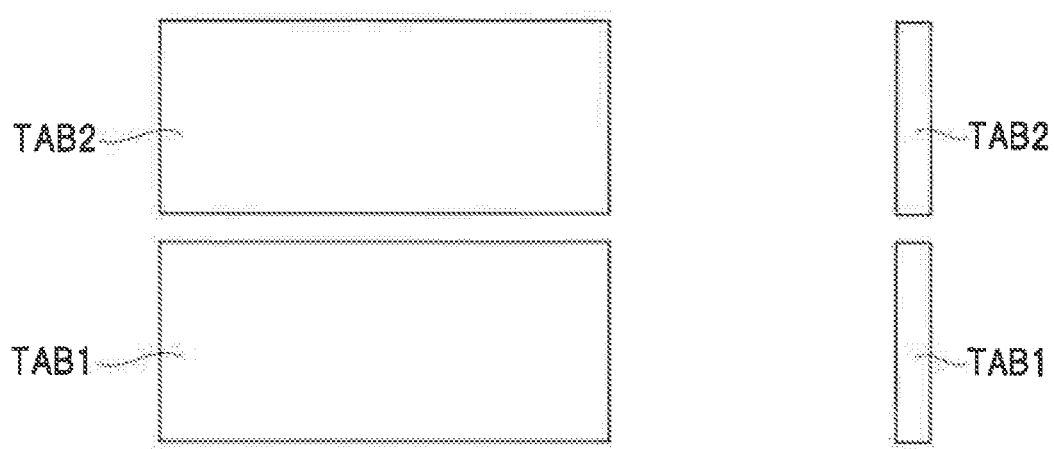
FIG. 16 is a diagram illustrating a manufacturing process for the semiconductor device of the present first embodiment.

First, as illustrated in FIG. 16, the chip mounting portion TAB1 and the chip mounting portion TAB2 separated from each other are prepared. These chip mounting portions TAB1 and TAB2 are formed into, for example, rectangles having the same size as each other. Here, the size of the chip mounting portion TAB1 and the size of the chip mounting portion TAB2 are not required to be the same as each other, and may be different from each other. However in the semiconductor device for the SR motor, a heat loss caused by the IGBT is equal to a heat loss caused by the diode are equal to each other as described above in FIG. 14, and therefore, it is desirable to set the heat release efficiency of the semiconductor chip having the IGBT to be equal to the heat release efficiency of the semiconductor chip having the diode. Therefore, from the viewpoint of improving the heat release efficiency of the semiconductor device as a whole, it can be said that it is desirable to form the size of the chip mounting portion TAB1 on which the semiconductor chip having the IGBT is mounted and the size of the chip mounting portion TAB2 on which the semiconductor chip having the diode is mounted to be equal to each other to make their heat efficiencies equal to each other.

2. Chip Mounting Process

Figure 17:
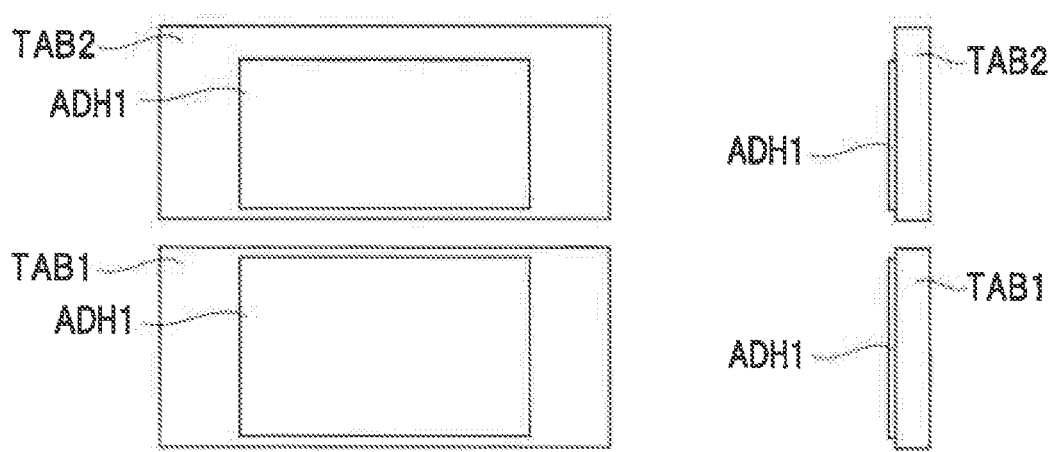
FIG. 17 is a diagram illustrating a manufacturing process for the semiconductor device, continued from FIG. 16.

Next, as illustrated in FIG. 17, the conductive adhesive ADH1 is applied onto the chip mounting portion TAB1, and the conductive adhesive ADH1 is applied also onto the chip mounting portion TAB2. As the conductive adhesive ADH1, for example, silver paste, solder with a high melting point, etc., can be used.

Figure 18:
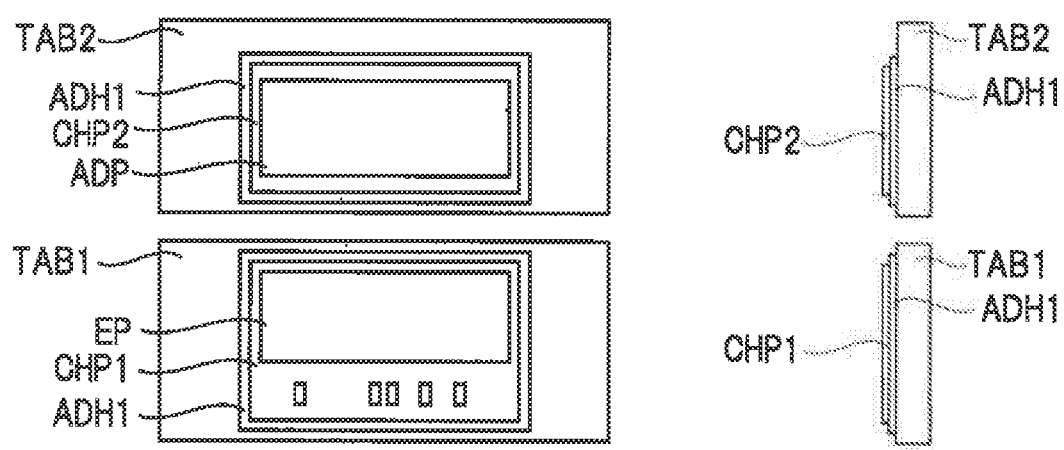
FIG. 18 is a diagram illustrating a manufacturing process for the semiconductor device, continued from FIG. 17.

Subsequently, as illustrated in FIG. 18, the semiconductor chip CHP1 having the IGBT is mounted on the chip mounting portion TAB1, while the semiconductor chip CHP2 having the diode is mounted on the chip mounting portion TAB2. Specifically, the semiconductor chip CHP1 is mounted on the chip mounting portion TAB1, the semiconductor chip CHP1 having a first front surface which has the IGBT and on which the emitter electrode pad EP is formed, and a first back surface on which the collector electrode is formed and which is opposite to the first front surface, and the chip mounting portion TAB1 is electrically connected to the first back surface of the semiconductor chip CHP1. Similarly, the semiconductor chip CHP2 is mounted on the chip mounting portion TAB2, the semiconductor chip CHP2 having a second front surface which has the diode and on which the anode electrode pad ADP is formed, and a second back surface on which the cathode electrode is formed and which is opposite to the second front surface, and the chip mounting portion TAB2 is electrically connected to the second back surface of the semiconductor chip CHP2.

In this manner, the semiconductor chip CHP2 having the diode is arranged so that the cathode electrode pad formed on the back surface of the semiconductor chip CHP2 is in contact with the chip mounting portion TAB2 via the conductive adhesive AHD1. As a result, the anode electrode pad ADP formed on the front surface of the semiconductor chip CHP2 is oriented upward.

On the other hand, the semiconductor chip CHP1 having the IGBT is arranged so that the collector electrode pad formed on the back surface of the semiconductor chip CHP1 is in contact with the chip mounting portion TAB1 via the conductive adhesive AHD1.

All of the emitter electrode pad EP and the plurality of electrode pads such as the gate electrode pad GP, the temperature detecting electrode pad TCP, the temperature detecting electrode pad TAP, the current detecting electrode pad SEP, and the Kelvin detecting electrode pad KP, which are formed on the front surface of the semiconductor chip CHP1, are oriented upward.

As the mounting order of the semiconductor chip CHP1 having the IGBT and the semiconductor chip CHP2 having the diode, the semiconductor chip CHP1 may be mounted first, and then, the semiconductor chip CHP2 may be mounted later. Alternatively, the semiconductor chip CHP2 may be mounted first, and then, the semiconductor chip CHP1 may be mounted later.

Then, a heat treatment is performed to the chip mounting portion TAB1 on which the semiconductor chip CHP1 is mounted and the chip mounting portion TAB2 on which the semiconductor chip CHP2 is mounted.

3. Base Material (Lead Frame) Preparing Process

Figure 19:
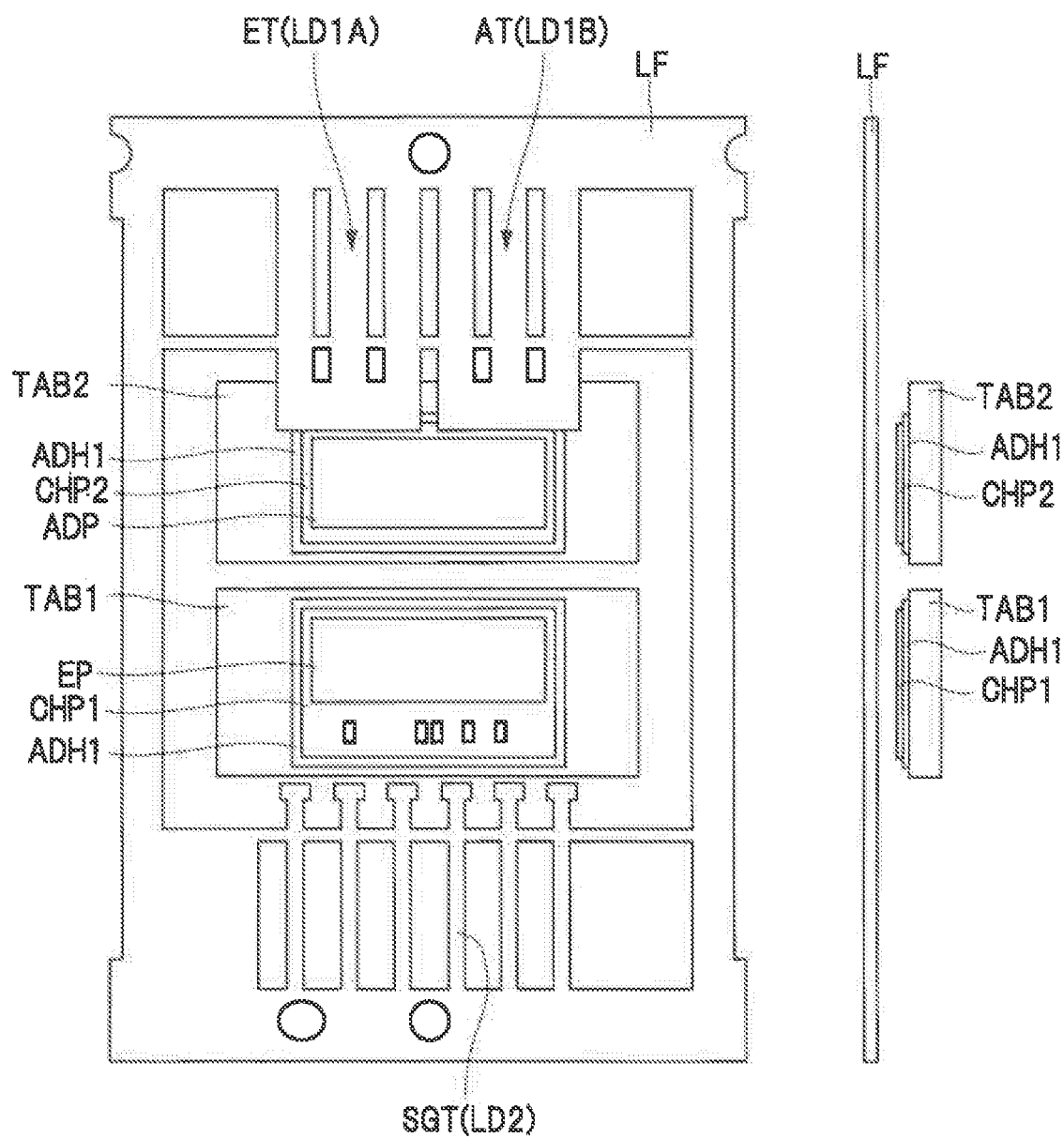
FIG. 19 is a diagram illustrating a manufacturing process for the semiconductor device, continued from FIG. 18.

Next, as illustrated in FIG. 19, a lead frame LF having the leads LD1A, and leads LD1B and leads LD2 is prepared. At this time, the chip mounting portion TAB1, chip mounting portion TAB2, and lead frame LF are arranged so that the chip mounting portion TAB2 is located between the leads LD1A and the chip mounting portion TAB1 and between the leads LD1B and the chip mounting portion TAB1. As a result, the semiconductor chip CHP1 having the IGBT is located at a position closer to the leads LD2, while the semiconductor chip CHP2 having the diode is located at a position closer to the leads LD1A and leads LD1B. In other words, in a plan view, the semiconductor chip CHP2 is mounted so as to be sandwiched between the leads LD1A, LD1B and the semiconductor chip CHP1, while the semiconductor chip CHP1 is mounted so as to be sandwiched between the leads LD2 and the semiconductor chip CHP2. Note that the thickness of the chip mounting portion TAB1 and the thickness of the chip mounting portion TAB2 are larger than the thickness of the lead frame LF.

4. Electrical Connection Process

Figure 20:
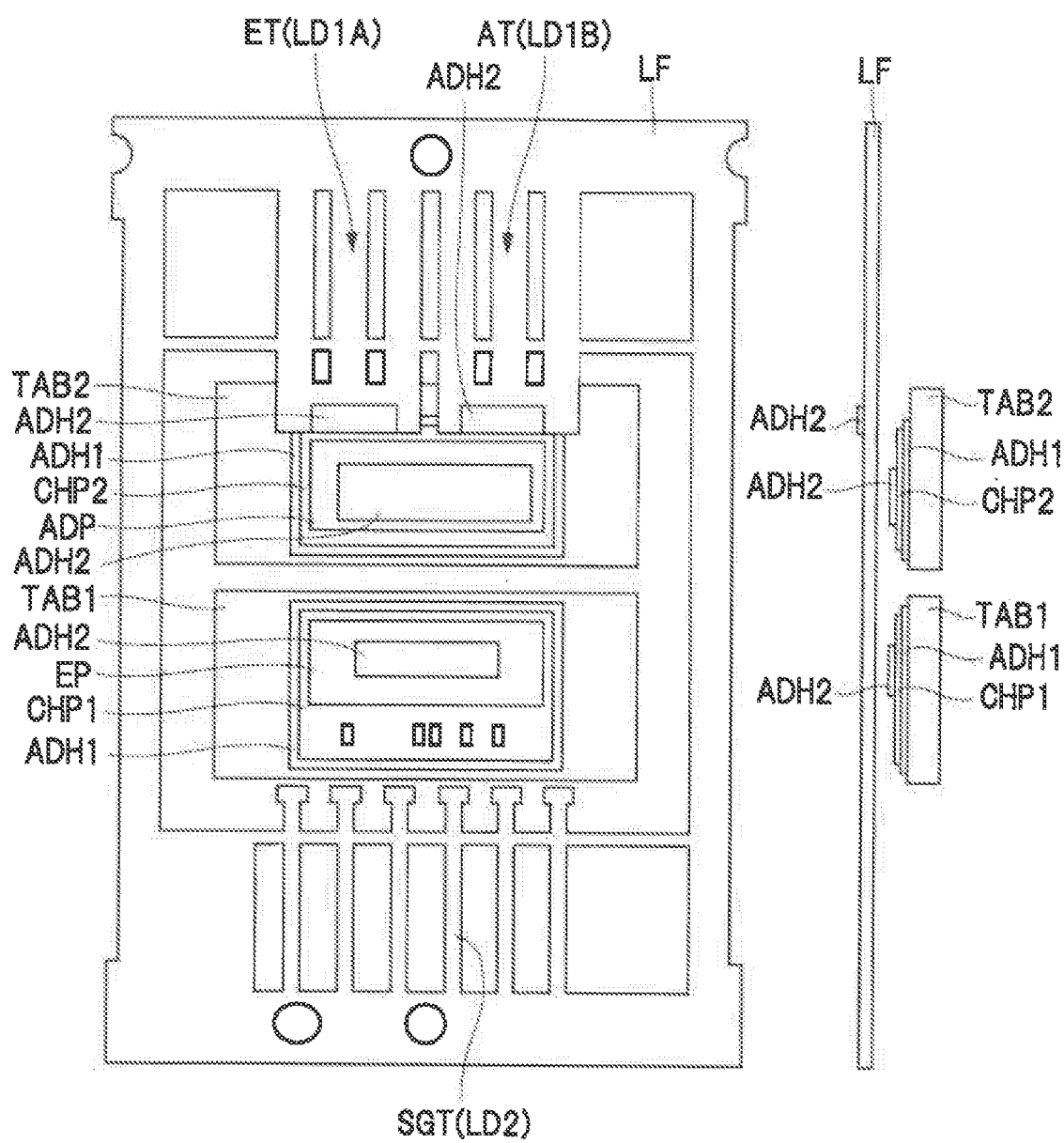
FIG. 20 is a diagram illustrating a manufacturing process for the semiconductor device, continued from FIG. 19.

Subsequently, as illustrated in FIG. 20, the conductive adhesive ADH2 is applied onto the anode electrode pad ADP of the semiconductor chip CHP2 and also onto the emitter electrode pad EP of the semiconductor chip CHP1. The conductive adhesive ADH2 is applied also onto a partial region of the leads LD1A and onto a partial region of the leads LD1B.

Also as the conductive adhesive ADH2, silver paste, solder with a high melting point, etc., can be used. The conductive adhesive ADH2 may be made of the same material as that of the conductive adhesive ADH1, or a different material therefrom.

Figure 21:
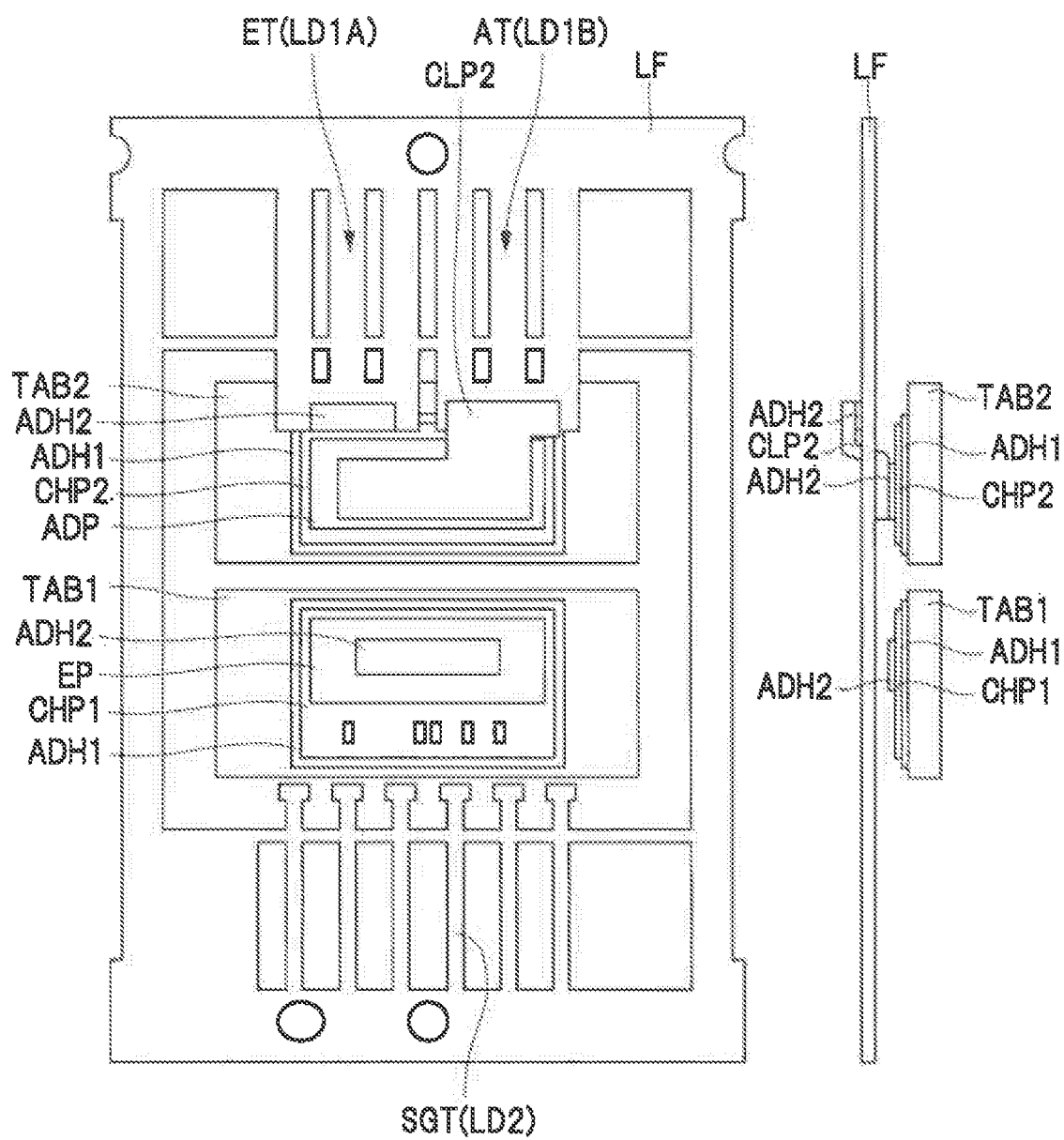
FIG. 21 is a diagram illustrating a manufacturing process for the semiconductor device, continued from FIG. 20.
Figure 22:
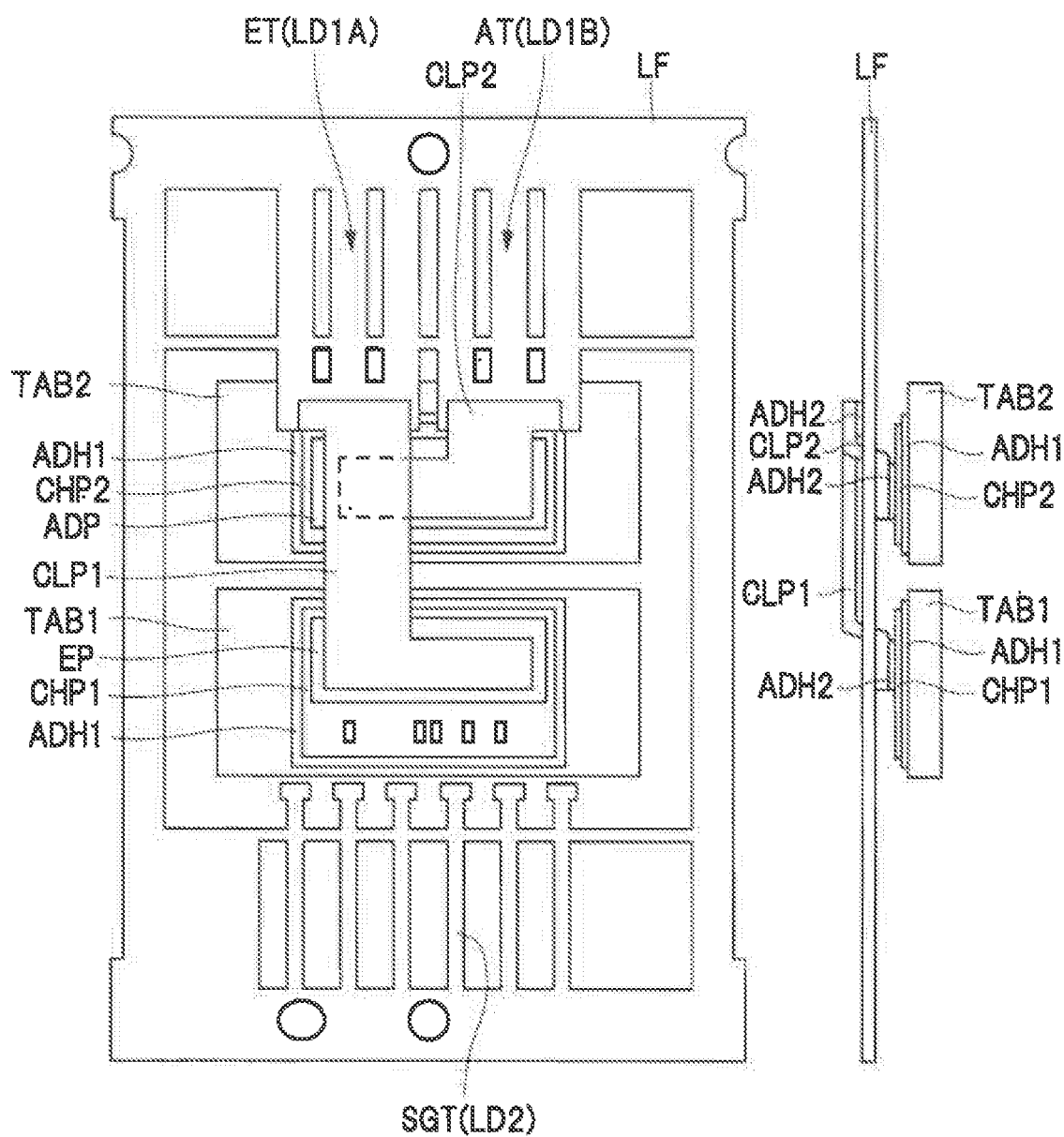
FIG. 22 is a diagram illustrating a manufacturing process for the semiconductor device, continued from FIG. 21.

Then, the leads LD1A are electrically connected to the semiconductor chip CHP1, while the leads LD1B are electrically connected to the semiconductor chip CHP2. Specifically, first, as illustrated in FIG. 21, the clip CLP2 is mounted on the anode electrode pad ADP of the semiconductor chip CHP2 and the leads LD1B, so that the anode electrode pad ADP is electrically connected to the leads LD1B. Then, as illustrated in FIG. 22, the clip CLP1 is mounted on the emitter electrode pad EP of the semiconductor chip CHP1 and the leads LD1A, so that the emitter electrode pad EP is electrically connected to the leads LD1A. At this time, as illustrated in FIG. 22, the clip CLP1 is mounted so that the clip CLP1 passes above a part of the clip CLP2. Through this process, the lead frame LF and the chip mounting portions TAB1 and TAB2 are formed to be integrated. Then, a heat treatment is performed to the integrated lead frame LF and chip mounting portions TAB1 and TAB2.

Figure 23:
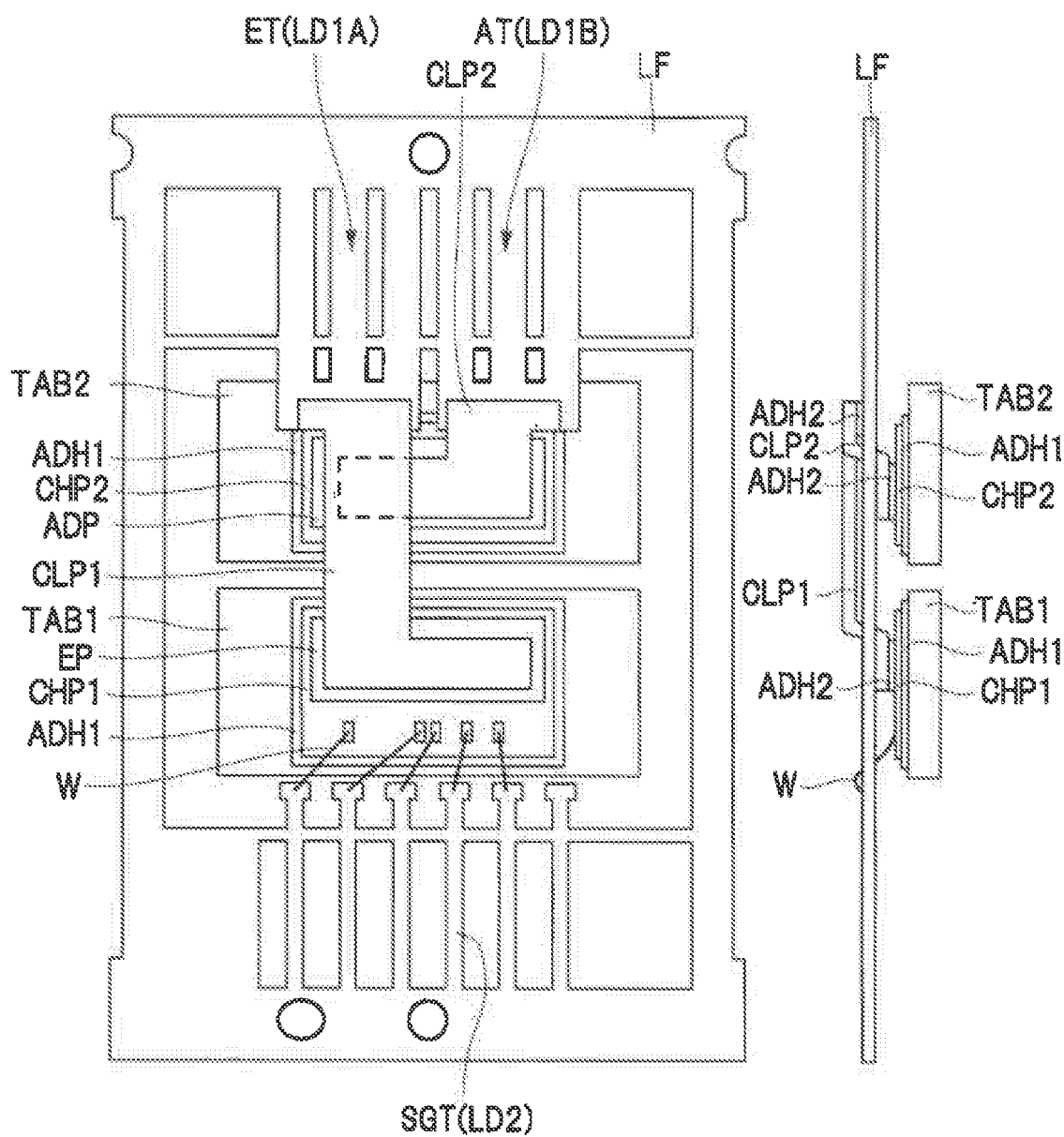
FIG. 23 is a diagram illustrating a manufacturing process for the semiconductor device, continued from FIG. 22.

Next, as illustrated in FIG. 23, a wire bonding process is performed. For example, as illustrated in FIG. 23, a lead LD2 is electrically connected to a gate electrode pad GP by a wire W, and a lead LD2 is electrically connected to a temperature detecting electrode pad by a wire. And, a lead LD2 is electrically connected to a temperature detecting electrode pad by a wire, and a lead LD2 is electrically connected to a current detecting electrode pad by a wire. Further, a lead LD2 is electrically connected to a Kelvin detecting electrode pad KP by a wire. Here, according to the present first embodiment, the leads LD2 are arranged so as to be opposite to the leads LD1A to which the clip CLP1 is connected and to the leads LD1B to which the clip CLP2 is connected, and therefore, the wire bonding process can be performed without taking account of interference among the wires W, the clip CLP1, and the clip CLP2.

5. Sealing (Molding) Process

Figure 24:
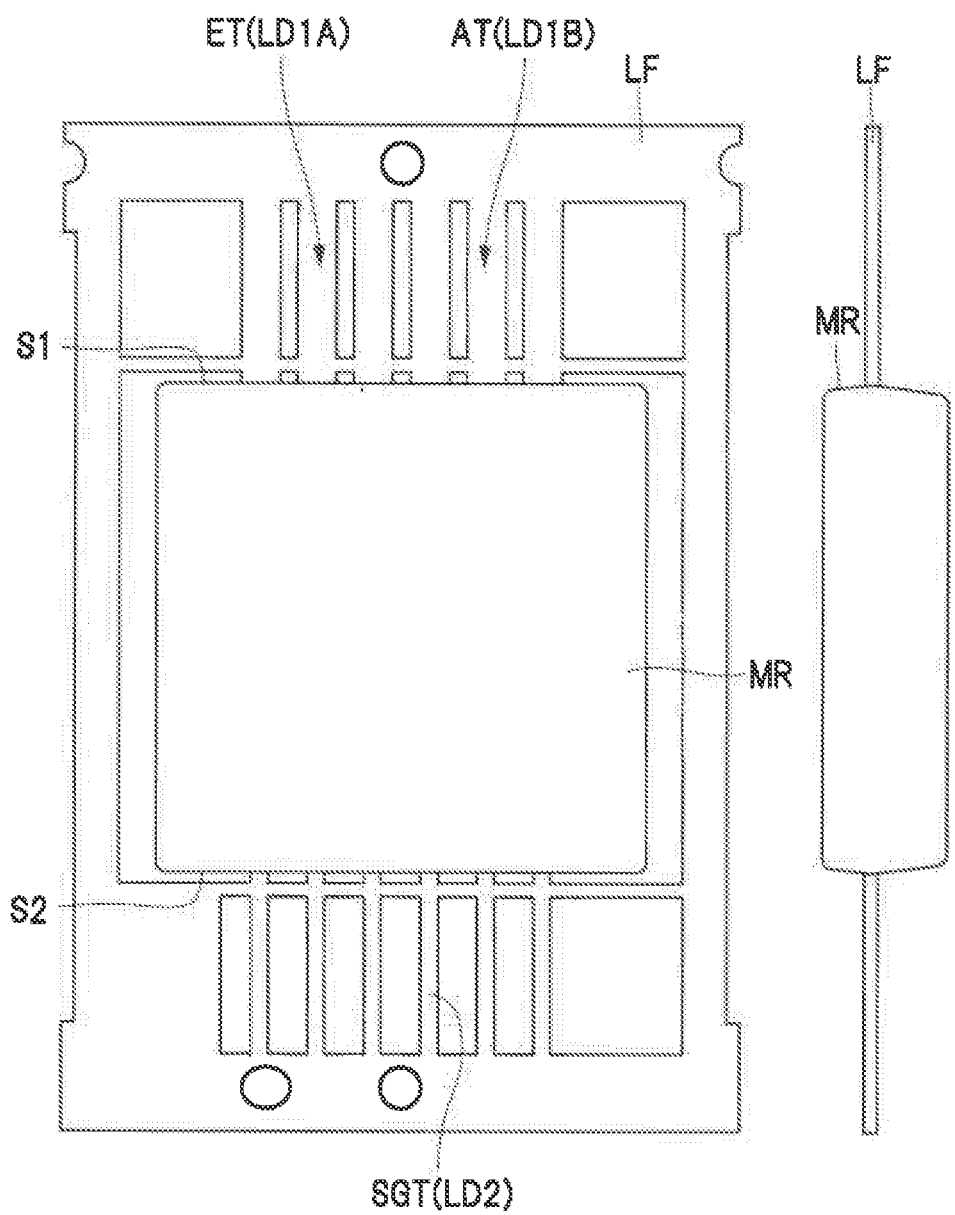
FIG. 24 is a diagram illustrating a manufacturing process for the semiconductor device, continued from FIG. 23.

Next, as illustrated in FIG. 24, a sealing material MR is formed by sealing the semiconductor chip CHP1, the semiconductor chip CHP2, a part of the chip mounting portion TAB1, a part of the chip mounting portion TAB2, a part of the lead LD1A, a part of the lead LD1B, a part of each of the plurality of leads LD2, the clip CLP1, the clip CLP2, and the wire W.

At this time, the sealing material MR has an upper surface, a lower surface opposite to the upper surface, a first side surface located between the upper surface and the lower surface in the thickness direction of the sealing material MR, and a second side surface opposite to the first side surface. FIG. 24 illustrates the side S1 along the first side surface and the side S2 along the second side surface. In the sealing material MR, the leads LD1A and LD1B protrude from the first side surface (side S1) of the sealing material MR, and the plurality of leads LD2 protrude from the second side surface (side S2) of the sealing material MR.

Although not illustrated in FIG. 24, note that a lower surface of the chip mounting portion TAB1 and a lower surface of the chip mounting portion TAB2 are exposed from the lower surface of the above-described sealing material MR.

6. Exterior Plating Process

Figure 25:
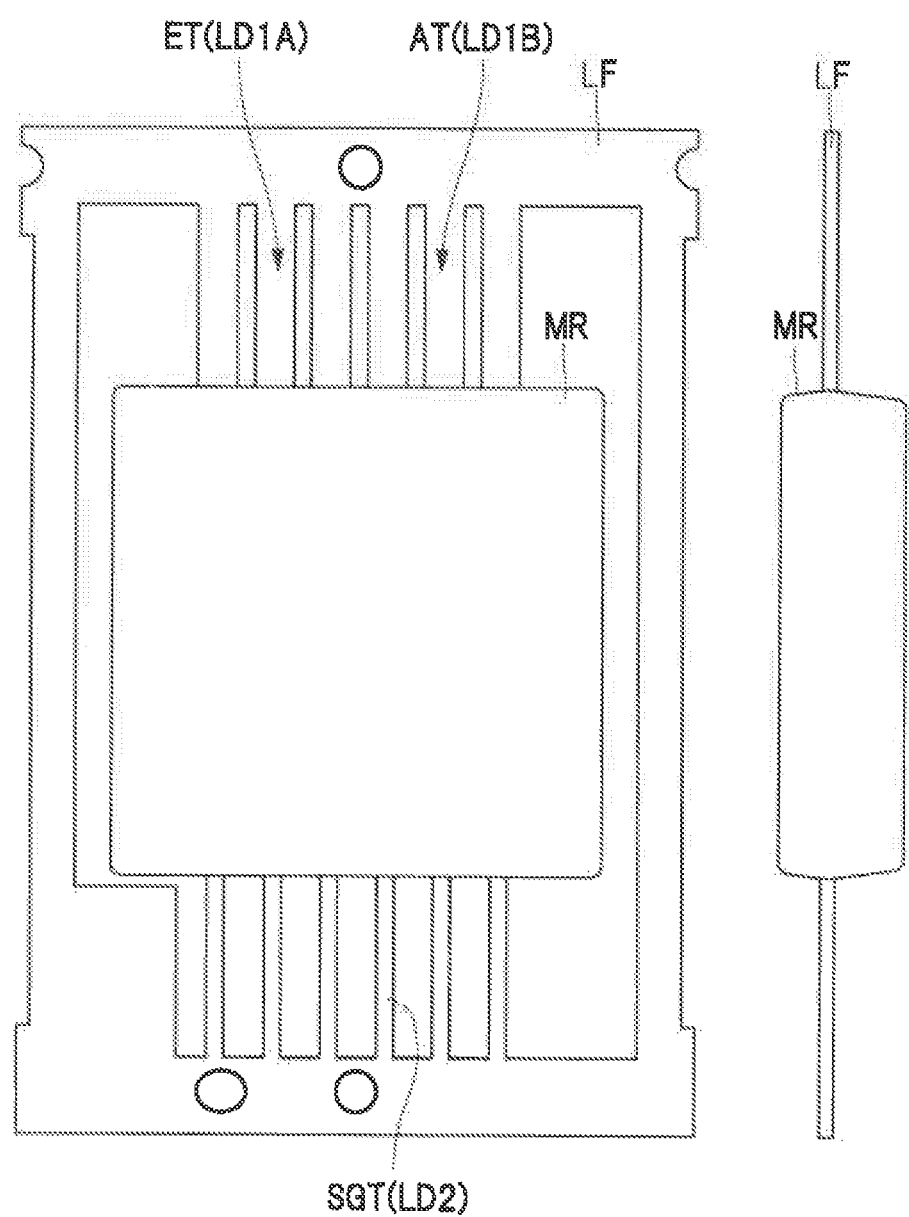
FIG. 25 is a diagram illustrating a manufacturing process for the semiconductor device, continued from FIG. 24.
Figure 26:
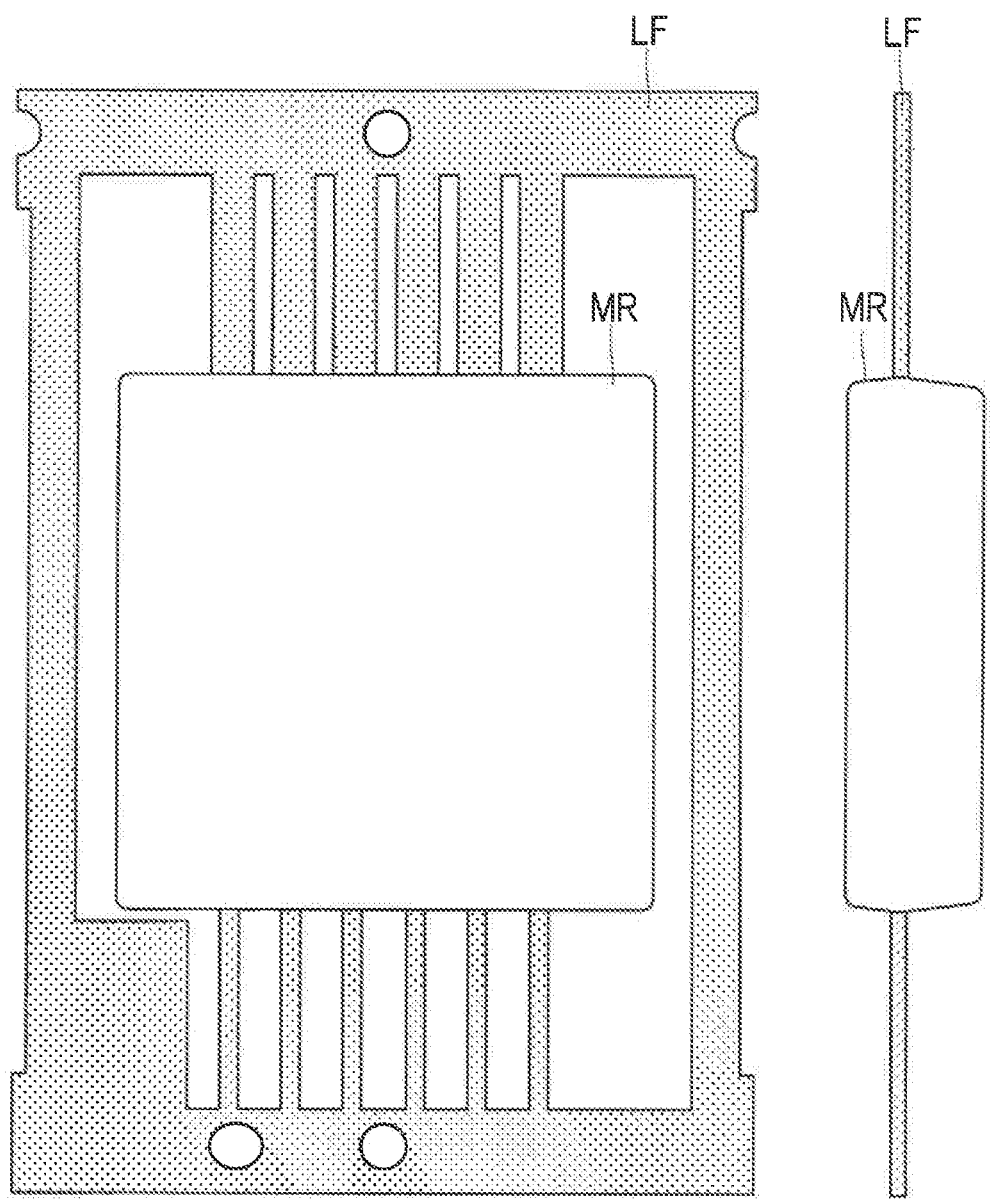
FIG. 26 is a diagram illustrating a manufacturing process for the semiconductor device, continued from FIG. 25.

Then, as illustrated in FIG. 25, a tie bar attached to the lead frame LF is cut. And, as illustrated in FIG. 26, a plating layer (tin film), which is a conductive film, is formed on the chip mounting portions TAB1 and TAB2, on the surface of a part of the lead LD1A, on the surface of a part of the lead LD1B, and on the surface of a part of the lead LD2, which are exposed from the lower surface of the sealing material MR. That is, the plating layer is formed on the exposed parts of the leads LD1A and LD1B from the sealing material MR, on the exposed parts of the plurality of leads LD2 from the sealing material MR, and on the lower surfaces of the chip mounting portions TAB1 and TAB2.

7. Marking Process

Then, information (a mark) indicating a product name and a model number is formed on the front surface of the sealing material MR made of resin. As a method for making the mark, note that a printing method by a printing system or a stamping method by irradiating the front surface of the sealing material with laser can be used.

8. Piece Making Process

Subsequently, the lead LD1A, the lead LD1B, and the plurality of leads LD2 are separated from the lead frame LF by cutting a part of the lead LD1A, a part of the lead LD1B, and a part of each of the plurality of leads LD2. Hence the semiconductor device PAC1 of the present first embodiment can be manufactured. Then, the lead LD1A, the lead LD1B, and each of the plurality of leads LD2 are formed. And, for example, a test process of testing the semiconductor device PAC1 for its electric properties is performed, and then, if the semiconductor device PAC1 is determined to be non-defective, the semiconductor device PAC1 is shipped out.

<First Modification>

Next, a first modification of the semiconductor device PAC1 of the present first embodiment will be described. FIGS. 27A to 27C are diagrams illustrating an internal structure of a semiconductor device PAC2 according to the first modification. Specifically, FIG. 27A is a plan view illustrating the internal structure of the semiconductor device PAC2 according to the first modification, FIG. 27B is a cross-sectional view taken along a line A-A of FIG. 27A, and FIG. 27C is a cross-sectional view taken along a line B-B of FIG. 27A.

In FIG. 27A, a feature of the semiconductor device PAC2 of the first modification is the wider clip CLP1 of the semiconductor device PAC2 than the clip CLP1 of the semiconductor device PAC1 illustrated in FIG. 12A. That is, the size of the clip CLP1 of the semiconductor device PAC2 is larger than the size of the clip CLP1 of the semiconductor device PAC1 of FIG. 12A. As a result, according to the first modification, based on an assumption that the anode electrode pad ADP of the semiconductor chip CHP2 has a first region overlapping the clip CLP1 and a second region not overlapping the clip CLP1 in a plan view, an area of the first region of the anode electrode pad ADP is larger than an area of the second region of the anode electrode pad ADP because of the wider clip CLP1.

According to the clip CLP1 of the first modification, by the wider clip CLP1, a parasitic resistance and a parasitic inductance between the emitter electrode pad EP of the semiconductor chip CHP1 and the emitter terminal ET can be reduced. That is, also in the semiconductor device PAC2 of the first modification, the semiconductor chip CHP1 is disposed between the emitter terminal ET and the semiconductor chip CHP2. As a result, the clip CLP1 connecting the emitter terminal ET to the semiconductor chip CHP2 tends to be longer, and the parasitic resistance and the parasitic inductance of the clip CLP1 tends to increase. However, in the present first modification, since the width of the clip CLP1 is increased, the parasitic resistance and the parasitic inductance of the clip CLP1 can be reduced, so that the performance of the semiconductor device PAC2 can be improved.

Note that the semiconductor device PAC2 of the present first modification can be applied to both of the upper and lower arms of the inverter circuit.

<Second Modification>

Subsequently, a second modification of the semiconductor device PAC1 of the present first embodiment will be described. FIGS. 28A to 28C are diagrams illustrating an outer appearance configuration of a semiconductor device PAC3 according to the present second modification. Particularly, FIG. 28A is a plan view of the semiconductor device PAC3 of the present second modification that is viewed from its front surface (upper surface), FIG. 28B is a side view of the semiconductor device PAC3 of the present second modification that is viewed from its side surface, and FIG. 28C is a plan view of the semiconductor device PAC3 of the present second modification that is viewed from its back surface (lower surface). FIGS. 29A to 29C are diagrams illustrating an internal structure of the semiconductor device PAC3 of the present second modification. Particularly, FIG. 29A is a plan view illustrating the internal structure of the semiconductor device PAC3 of the present second modification, FIG. 29B is a cross-sectional view taken along a line A-A of FIG. 29A, and FIG. 29C is a cross-sectional view taken along a line B-B of FIG. 29A.

As illustrated in FIGS. 28A and 28C, a feature of the semiconductor device PAC3 of the present second modification is a larger distance L between the emitter terminal ET and the anode terminal AT. Specifically, as illustrated in FIG. 29A, the lead LD1A which is the emitter terminal ET has a first portion sealed with the sealing material MR and a second portion exposed from the sealing material MR. Similarly, the lead LD1B which is the anode terminal AT has a third portion sealed with the sealing material MR and a fourth portion exposed from the sealing material MR. At this time, in a plan view, the distance L of the furthest part between the second portion of lead LD1A and the fourth portion of lead LD1B is larger than the distance of the closest part between the first portion of lead LD1A and the third portion of lead LD1B.

In this manner, according to the semiconductor device PAC3 of the present second modification, a breakdown voltage between the emitter terminal ET and the anode terminal AT can be improved.

Particularly, a case of usage of the semiconductor device PAC3 of the present second modification as a component of the inverter circuit can be effective in application of the semiconductor device PAC3 of the present second modification to the upper arm. This is because, for example, a potential difference is caused between the emitter terminal ET and anode terminal AT since the emitter terminal ET and the anode terminal AT are connected to the different wirings from each other in the semiconductor device making up the upper arm as illustrated in FIG. 15.

On the other hand, a case of usage of the semiconductor device PAC3 of the present second modification as a component of the inverter circuit has no technical signification in application of the semiconductor device PAC3 of the present second modification to the lower arm. This is because, for example, a potential difference is caused between the emitter terminal ET and anode terminal AT since the emitter terminal ET and the anode terminal AT are connected to the same wiring WL(N) as each other in the semiconductor device making up the lower arm as illustrated in FIG. 15.

<Third Modification>

Figures 30A, 30B, 30C:
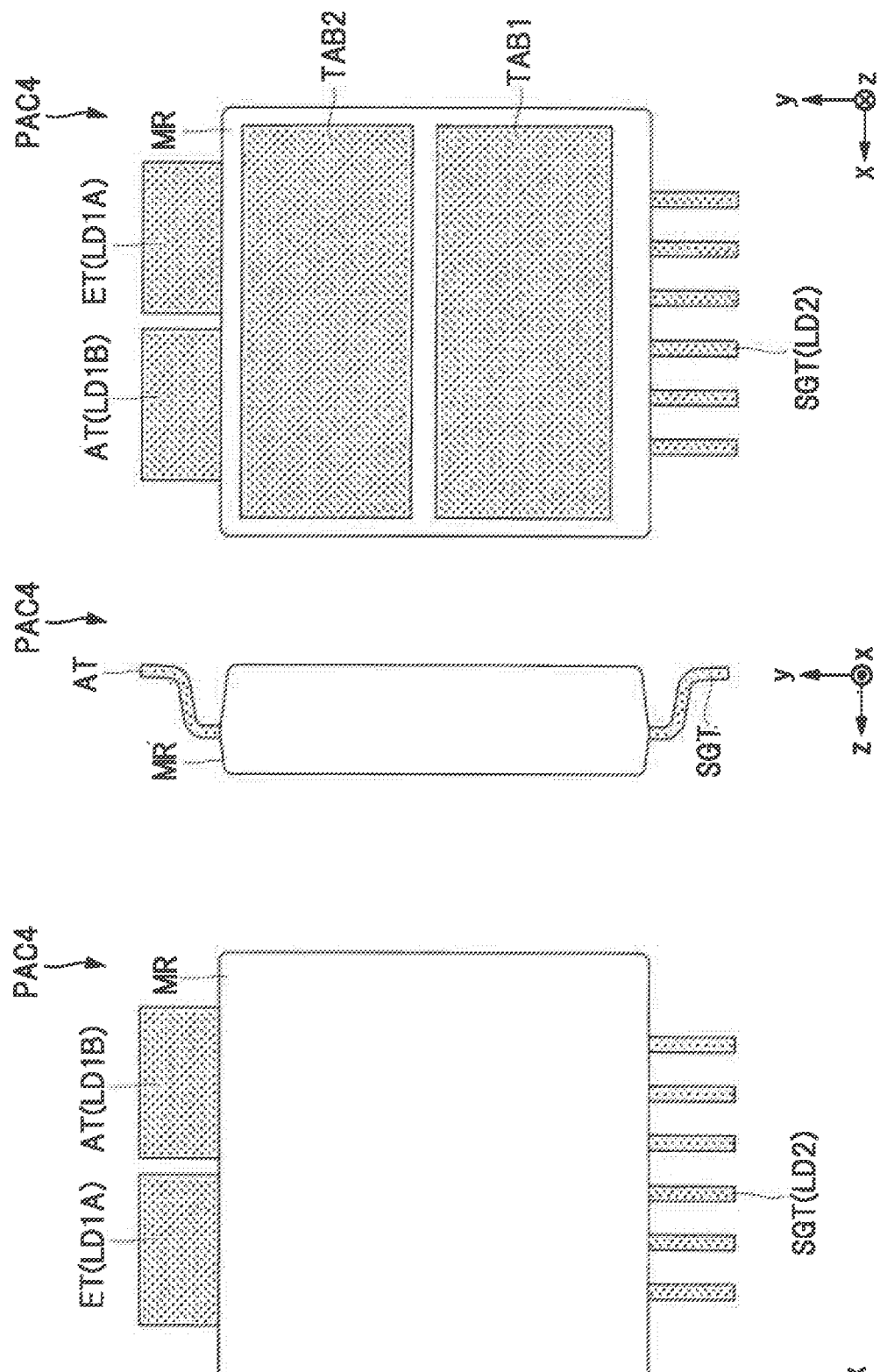
FIG. 30A is a plan view of a semiconductor device of a third modification that is viewed from its front surface.
FIG. 30B is a side view of the semiconductor device of the third modification that is viewed from its one side.
FIG. 30C is a plan view of the semiconductor device of the third modification that is viewed from its back surface.

Next, a third modification of the semiconductor device PAC1 of the present first embodiment will be described. FIGS. 30A to 30C are diagrams illustrating an outer appearance configuration of a semiconductor device PAC4 according to the present third modification. Particularly, FIG. 30A is a plan view of the semiconductor device PAC4 of the present third modification that is viewed from its front surface (upper surface), FIG. 30B is a side view of the semiconductor device PAC4 of the present third modification that is viewed from its side surface, and FIG. 30C is a plan view of the semiconductor device PAC4 of the present third modification that is viewed from its back surface (lower surface). FIGS. 31A to 31C are diagrams illustrating an internal structure of the semiconductor device PAC4 of the present third modification. Particularly, FIG. 31A is a plan view illustrating the internal structure of the semiconductor device PAC4 of the present third modification, FIG. 31B is a cross-sectional view taken along a line A-A of FIG. 31A, and FIG. 31C is a cross-sectional view taken along a line B-B of FIG. 31A.

In FIGS. 30A and 30C, a feature of the semiconductor device PAC4 of the present third modification is the wider lead LD1A which is the emitter terminal ET by eliminating the slits of the leads LD1 to integrate the leads LD1A and the wider lead LD1B which is the anode terminal AT by eliminating the slits of the leads LD1 to integrate the leads LD1B. At this time, as illustrated in FIG. 31A, openings OP1 are formed on the lead LD1A and on the lead LD1B, respectively, and each opening OP1 is filled with a part of the sealing material MR.

According to the semiconductor device PAC4 of the present third modification configured as described above, by the wider lead LD1A which is the emitter terminal ET and the wider lead LD1B which is the anode terminal AT, an allowable value of a current capacity of each of the lead LD1A and the lead LD1B can be increased, so that the semiconductor device PAC4 capable of handling a large current can be provided.

Note that the semiconductor device PAC4 of the present third modification can be applied to both of the upper and lower arms of the inverter circuit.

<Fourth Modification>

Subsequently, a fourth modification of the semiconductor device PAC1 of the present first embodiment will be described. FIGS. 32A to 32C are diagrams illustrating an outer appearance configuration of a semiconductor device PAC5 according to the present fourth modification. Particularly, FIG. 32A is a plan view of the semiconductor device PAC5 of the present fourth modification that is viewed from its front surface (upper surface), FIG. 32B is a side view of the semiconductor device PAC5 of the present fourth modification that is viewed from its side surface, and FIG. 32C is a plan view of the semiconductor device PAC5 of the present fourth modification that is viewed from its back surface (lower surface). FIGS. 33A to 33C are diagrams illustrating an internal structure of the semiconductor device PAC5 of the present fourth modification. Particularly, FIG. 33A is a plan view illustrating the internal structure of the semiconductor device PAC5 of the present fourth modification, FIG. 33B is a cross-sectional view taken along a line A-A of FIG. 33A, and FIG. 33C is a cross-sectional view taken along a line B-B of FIG. 33A.

As illustrated in FIG. 32C and FIGS. 33A to 33C, a feature of the semiconductor device PAC5 of the fourth modification is that the chip mounting portions TAB are integrally formed to be one chip mounting portion TAB on which the semiconductor chip CHP1 having the IGBT and the semiconductor chip CHP2 having the diode are mounted. In this case, the back surface of the semiconductor chip CHP1 is electrically connected to the back surface of the semiconductor chip CHP2 by the one chip mounting portion TAB. Therefore, the collector electrode pad formed on the back surface of the semiconductor chip CHP1 is electrically connected to the cathode electrode pad formed on the back surface of the semiconductor chip CHP2. On the other hand, as illustrated in FIG. 33A, also in the semiconductor device PAC5 of the present fourth modification, the clip CLP1 is separated electrically from the clip CLP2, and therefore, the emitter terminal ET connected to the clip CLP1 is separated electrically from the anode terminal AT connected to the clip CLP2.

Figure 34:
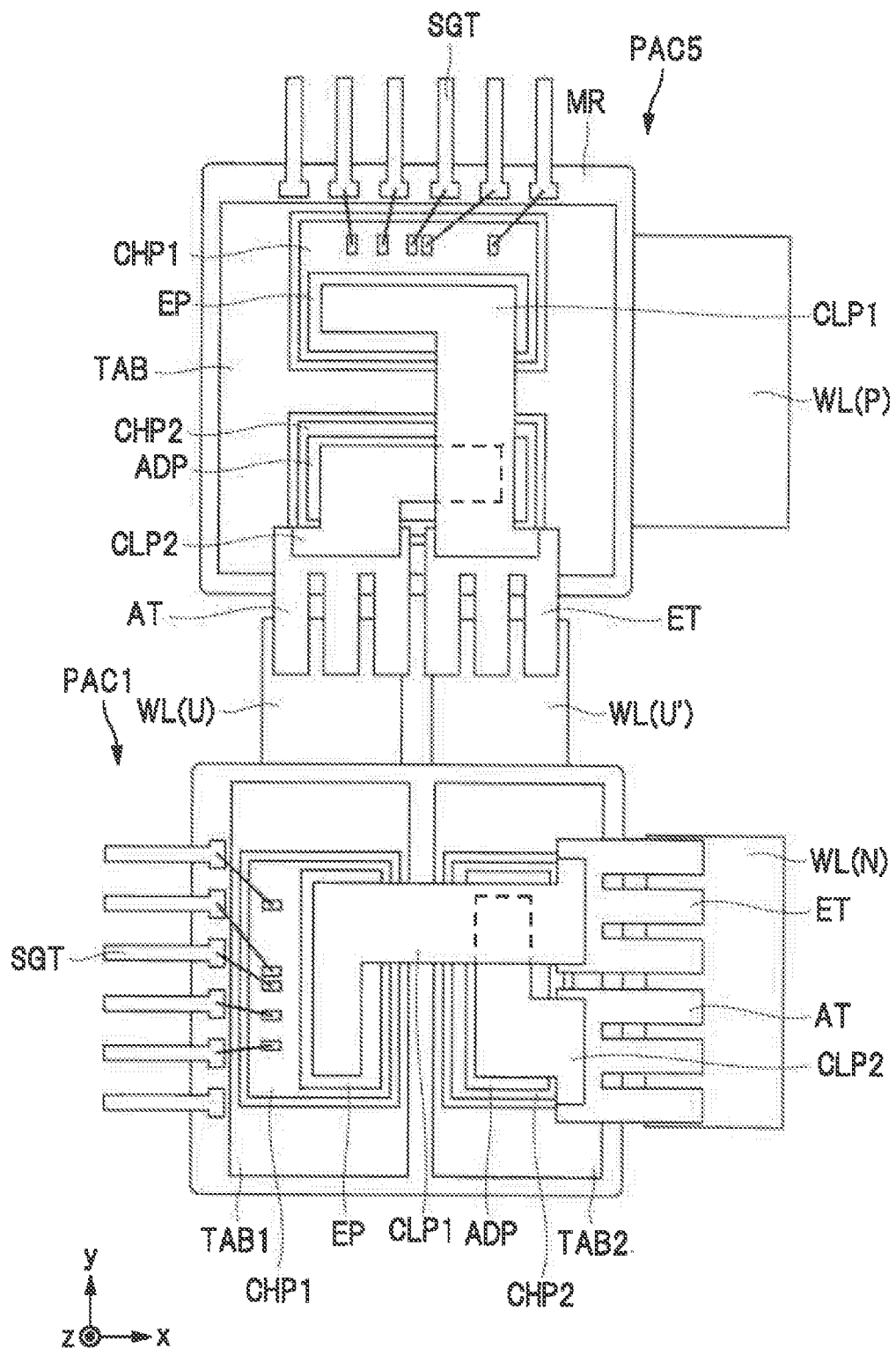
FIG. 34 is a diagram illustrating an example of a mounting configuration that realizes a part of the inverter circuit for the SR motor of FIG. 4B by combining the semiconductor device of the fourth modification with the semiconductor device of the present first embodiment.

The inverter circuit can be embodied by combining the semiconductor device PAC5 of the present fourth modification configured as described above with the semiconductor device PAC1 of the first embodiment. FIG. 34 is a diagram illustrating an example of a mounting configuration that embodies a part of the inverter circuit for the SR motor illustrated in FIG. 4B by combining the semiconductor device PAC5 of the present fourth modification with the semiconductor device PAC1 of the first embodiment. In FIG. 34, the semiconductor device PAC5 located on the upper side makes up the upper arm, while the semiconductor device PAC1 located on the lower side makes up the lower arm. That is, in the upper arm, for example, the chip mounting portion TAB1 and the chip mounting portion TAB2 are electrically connected to the same wiring WL(P) as illustrated in FIG. 15, and therefore, it is not required to separate the chip mounting portion TAB1 and the chip mounting portion TAB2 from each other, so that the semiconductor device PAC1 can be replaced with the semiconductor device PAC5 of the present fourth modification having one chip mounting portion TAB as illustrated in FIG. 34.

However, as illustrated in FIG. 34, in the lower arm, it is required to electrically separate the chip mounting portion TAB1 and the chip mounting portion TAB2 from each other, and therefore, the semiconductor device PAC5 of the present fourth modification cannot be used. Therefore, when a part of the inverter circuit for the SR motor illustrated in FIG. 4B is achieved by using the semiconductor device PAC5 of the present fourth modification, it is required to use the semiconductor device PAC5 of the present fourth modification as the upper arm and the semiconductor device PAC1 of the first embodiment as the lower arm as illustrated in FIG. 34.

From the above description, the mounting configuration that embodies a part of the inverter circuit for the SR motor illustrated in FIG. 4B can include, for example, a configuration with usage of the semiconductor device PAC1 of the first embodiment for both of the upper arm and the lower arm as illustrated in FIG. 15 and a configuration with usage of the semiconductor device PAC5 of the present fourth modification for the upper arm and usage of the semiconductor device PAC1 of the first embodiment for the lower arm as illustrated in FIG. 34.

Here, in the case of the configuration with the usage of the semiconductor device PAC1 of the first embodiment for both of the upper arm and the lower arm as illustrated in FIG. 15, the same semiconductor device PAC1 can be used for the upper arm and the lower arm, and therefore, an advantage of sharing a component can be obtained. From the viewpoint of achieving a shared component, the configuration with the usage of the semiconductor device PAC1 of the first embodiment for both of the upper arm and the lower arm as illustrated in FIG. 15 is desirable. However, the mounting configuration that embodies a part of the inverter circuit for the SR motor illustrated in FIG. 4B is not limited to this configuration, and the mounting configuration illustrated in FIG. 34 can also be adopted.

<Fifth Modification>

Figure 35:
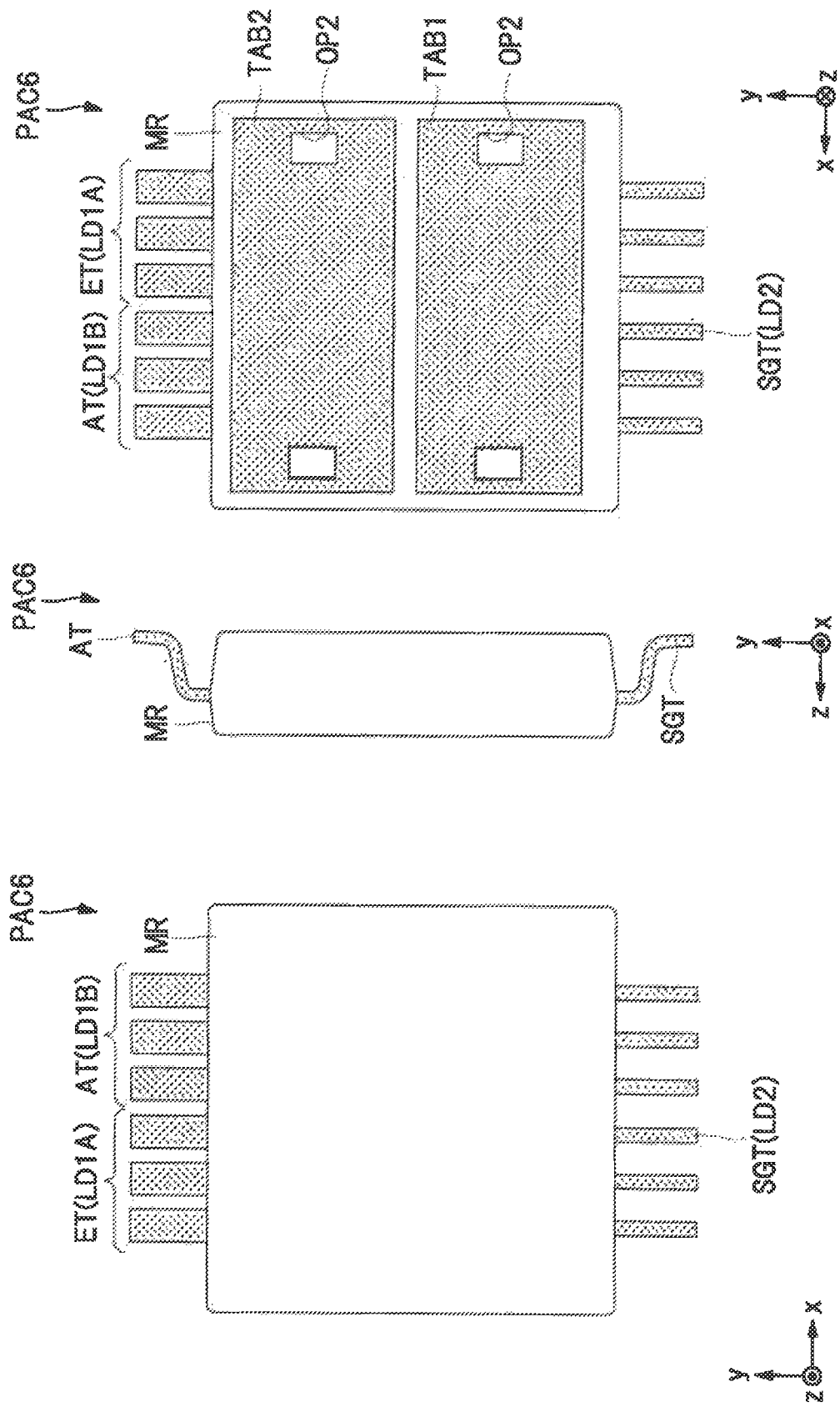
FIG. 35A is a plan view of a semiconductor device of a fifth modification that is viewed from its front surface.
FIG. 35B is a side view of the semiconductor device of the fifth modification that is viewed from its one side.
FIG. 35C is a plan view of the semiconductor device of the fifth modification that is viewed from its back surface.
Figure 36:
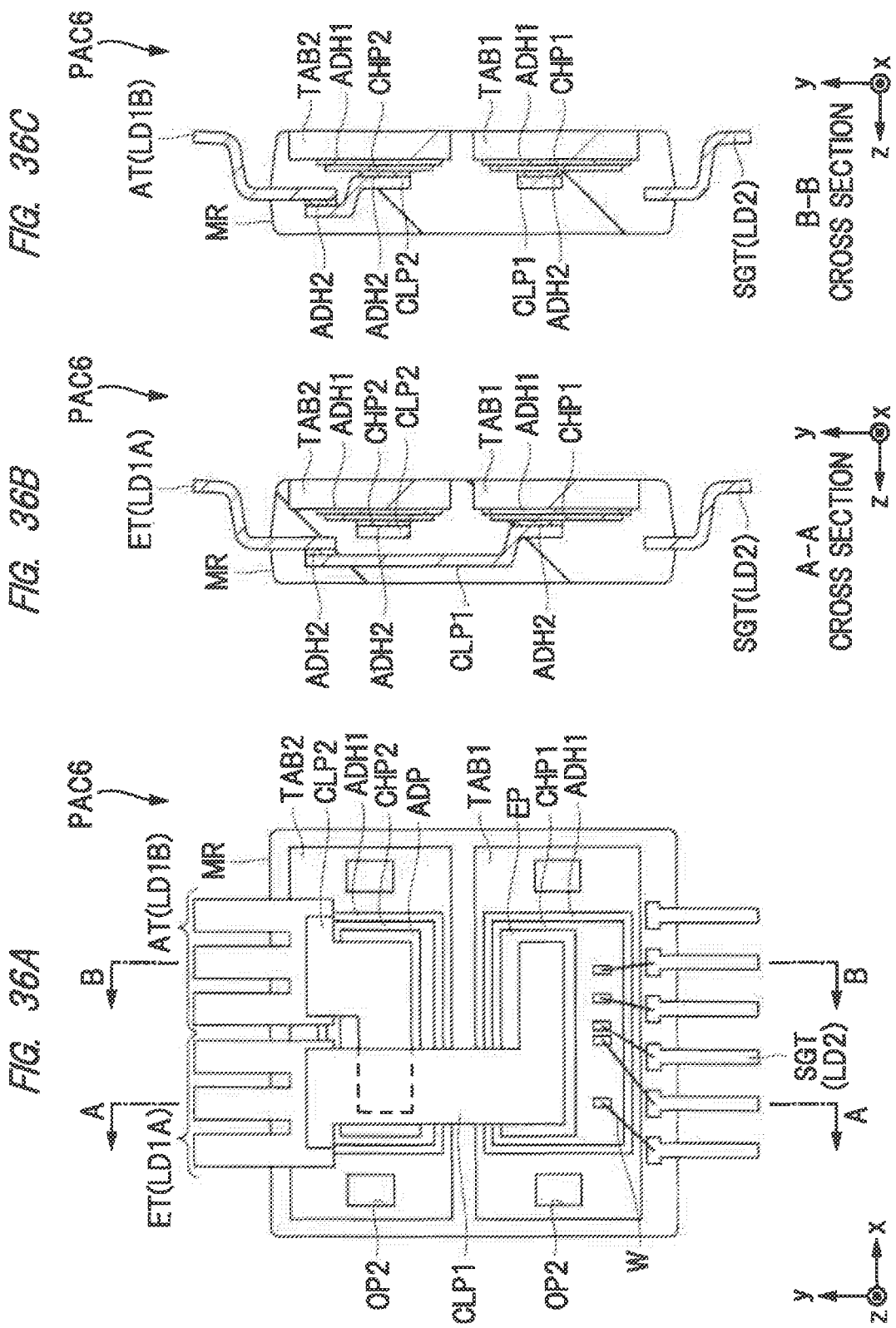
FIG. 36A is a plan view illustrating an internal structure of the semiconductor device of the fifth modification.
FIG. 36B is a cross-sectional view taken along a line A-A of FIG. 36A.
FIG. 36C is a cross-sectional view taken along a line B-B of FIG. 36A.

Next, a fifth modification of the semiconductor device PAC1 of the present first embodiment will be described. FIGS. 35A to 34C are diagrams illustrating an outer appearance configuration of a semiconductor device PAC6 according to the present fifth modification. Particularly, FIG. 35A is a plan view of the semiconductor device PAC6 of the present fifth modification that is viewed from its front surface (upper surface), FIG. 35B is a side view of the semiconductor device PAC6 of the present fifth modification that is viewed from its side surface, and FIG. 35C is a plan view of the semiconductor device PAC6 of the present fifth modification that is viewed from its back surface (lower surface). FIGS. 36A to 36C are diagrams illustrating an internal structure of the semiconductor device PAC6 of the present fifth modification. Particularly, FIG. 36A is a plan view illustrating the internal structure of the semiconductor device PAC6 of the present fifth modification, FIG. 36B is a cross-sectional view taken along a line A-A of FIG. 36A, and FIG. 36C is a cross-sectional view taken along a line B-B of FIG. 36A.

As illustrated in FIGS. 35C and 36A, a feature of the semiconductor device PAC6 of the present fifth modification is that an opening OP2 is formed on the chip mounting portion TAB1, and besides, an opening OP2 is also formed on the chip mounting portion TAB2, and the opening OP2 is filled with a part of the sealing material MR. That is, in a plan view, the openings OP2 are formed on a part of chip mounting portion TAB1 that does not overlap the semiconductor chip CHP1 and on a part of chip mounting portion TAB2 that does not overlap the semiconductor chip CHP2, respectively, and these openings OP2 are filled with a part of the sealing material MR.

As a result, according to the semiconductor device PAC6 of the present fifth modification, the adhesiveness between the chip mounting portion TAB1 and the sealing material MR can be improved by an anchoring effect created by the filling of the part of the sealing material MR into the opening OP2 formed on the chip mounting portion TAB1. Similarly, according to the semiconductor device PAC6 of the present fifth modification, the adhesiveness between the chip mounting portion TAB2 and the sealing material MR can be improved by an anchoring effect created by the filling of the part of the sealing material MR into the opening OP2 formed on the chip mounting portion TAB2.

As a result, according to the semiconductor device PAC6 of the present fifth modification, moisture resistance and temperature cycle property can be improved, and therefore, the reliability of the semiconductor device PAC6 can be improved.

Note that the semiconductor device PAC6 of the present fifth modification can be applied to both of the upper and lower arms of the inverter circuit.

<Sixth Modification>

Figure 37:
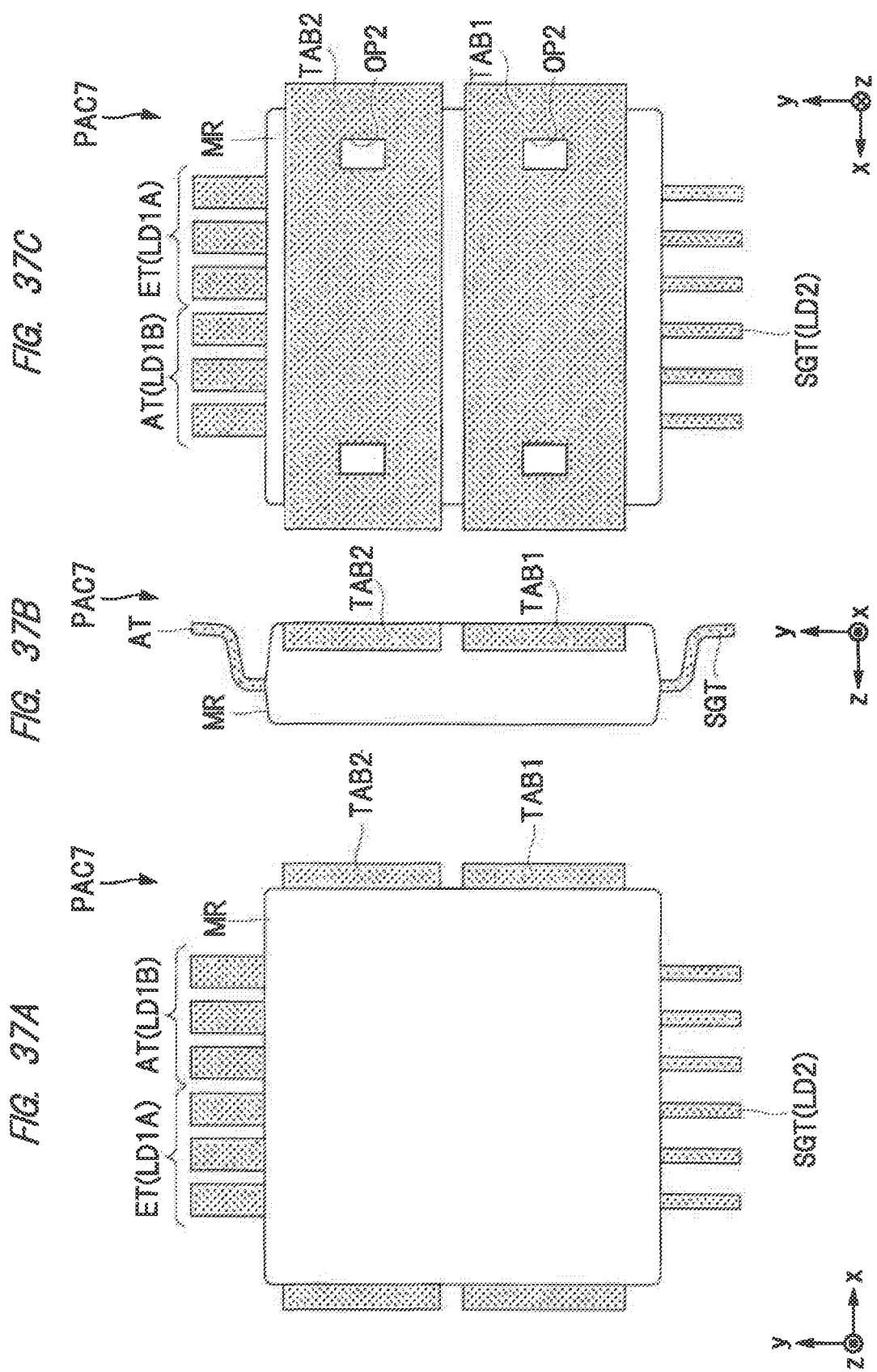
FIG. 37A is a plan view of a semiconductor device of a sixth modification that is viewed from its front surface.
FIG. 37B is a side view of the semiconductor device of the sixth modification that is viewed from its one side.
FIG. 37C is a plan view of the semiconductor device of the sixth modification that is viewed from its back surface.
Figure 38:
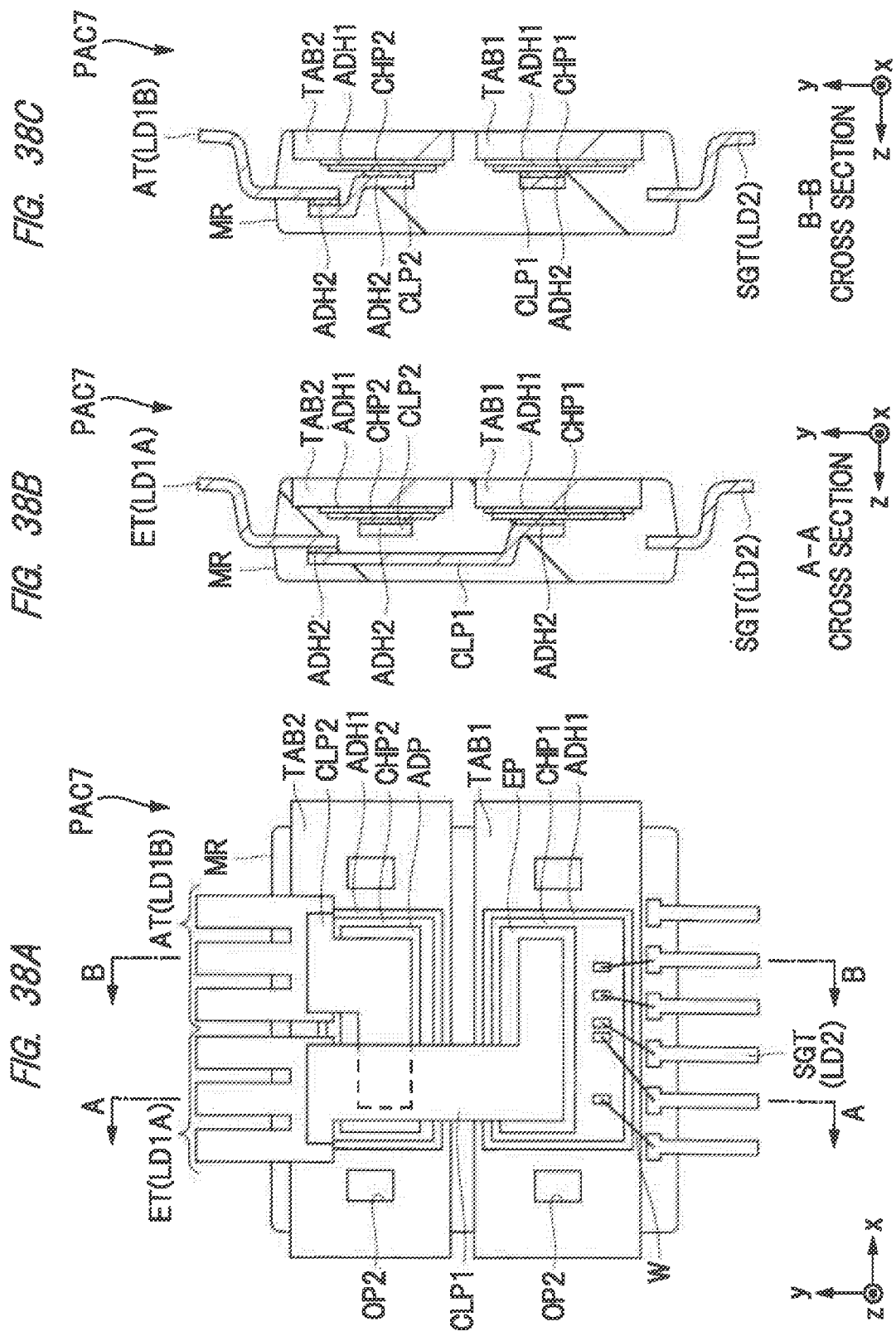
FIG. 38A is a plan view illustrating an internal structure of the semiconductor device of the sixth modification.
FIG. 38B is a cross-sectional view taken along a line A-A of FIG. 38A.
FIG. 38C is a cross-sectional view taken along a line B-B of FIG. 38A.

Subsequently, a sixth modification of the semiconductor device PAC1 of the present first embodiment will be described. FIGS. 37A to 37C are diagrams illustrating an outer appearance configuration of a semiconductor device PAC7 according to the present sixth modification. Particularly, FIG. 37A is a plan view of the semiconductor device PAC7 of the present sixth modification that is viewed from its front surface (upper surface), FIG. 37B is a side view of the semiconductor device PAC7 of the present sixth modification that is viewed from its side surface, and FIG. 37C is a plan view of the semiconductor device PAC7 of the present sixth modification that is viewed from its back surface (lower surface). FIGS. 38A to 38C are diagrams illustrating an internal structure of the semiconductor device PAC7 of the present sixth modification. Particularly, FIG. 38A is a plan view illustrating the internal structure of the semiconductor device PAC7 of the present sixth modification, FIG. 38B is a cross-sectional view taken along a line A-A of FIG. 38A, and FIG. 38C is a cross-sectional view taken along a line B-B of FIG. 38A.

Here, a feature of the semiconductor device PAC7 of the present sixth modification is that the lower surface of the chip mounting portion TAB1 and the lower surface of the chip mounting portion TAB2 are exposed from the lower surface of the sealing material MR and that a part of the chip mounting portion TAB1 and a part of the chip mounting portion TAB2 protrude from the side surfaces of the sealing material MR as illustrated in FIGS. 37A and 37C.

In this manner, according to the present sixth modification, an exposed area of the chip mounting portion TAB1 and an exposed area of the chip mounting portion TAB2 are increased, and therefore, heat release efficiency can be improved.

According to the present sixth modification, for example, in a testing process of measuring a large current, a test terminal can be brought into contact with a part of chip mounting portion TAB1 and a part of the chip mounting portion TAB2, which protrude from the side surfaces of the sealing material MR, and therefore, the contact property in the testing process can be improved.

Further, according to the semiconductor device PAC7 of the present sixth modification, a part of chip mounting portion TAB1 and a part of the chip mounting portion TAB2 are protruded from the sealing material MR, and therefore, a size of the sealing material MR itself is small. This means that a package size of the semiconductor device PAC7 of the present sixth modification (a size of the sealing material MR) is small, so that the mounting area of the semiconductor device PAC7 can be reduced.

According to the present sixth modification, a part of chip mounting portion TAB1 and a part of the chip mounting portion TAB2 are protruded and exposed from the sides of the sealing material MR, and therefore, a solder filet can be formed on these protruded and exposed parts. That is, according to the semiconductor device PAC7 of the present sixth modification, not only the emitter terminal ET, anode terminal AT, and signal terminals SGT but also the protruded part of the chip mounting portion TAB1 and the protruded part of the chip mounting portion TAB2 can be connected to the mounting substrate by solder. Therefore, the mounting reliability of the semiconductor device PAC7 on the mounting substrate can be improved. With regard to this, according to the present sixth modification, the wettability of the solder can be checked easily, so that the soldering reliability in the mounting of the semiconductor device PAC7 can be also improved.

The semiconductor device PAC7 of the sixth modification can be applied to both of the upper and lower arms of the inverter circuit.

<System Configuration of Electronic Apparatus of First Embodiment>

The semiconductor device PAC1 of the present first embodiment is provided by arranging one IGBT and one diode which are the components of the inverter circuit INV for the SR motor of FIG. 2, into one package. By using six semiconductor devices PAC1 of the present first embodiment, the electronic apparatus (power module) including the three-phase inverter circuit INV can be made up.

Figure 39:
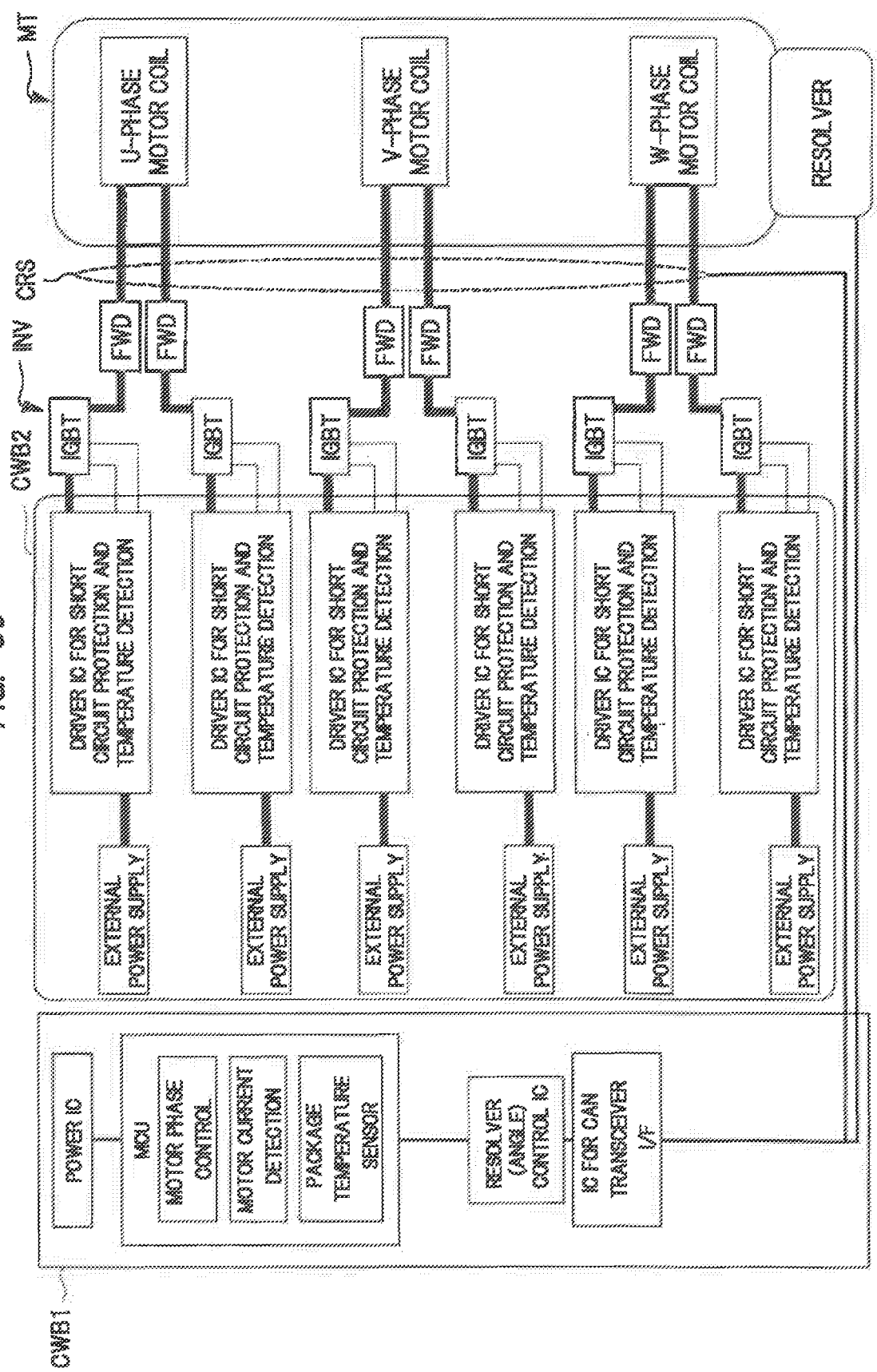
FIG. 39 is a block diagram illustrating a system configuration of an electronic apparatus according to the present first embodiment.

First, a system configuration of an electronic apparatus EA1 according to the present first embodiment will be described below. FIG. 39 is a block diagram illustrating the system configuration of the electronic apparatus EA1 according to the present first embodiment. In FIG. 39, the electronic apparatus EA1 of the present first embodiment includes a control board CWB1, a control board CWB2, the inverter circuit INV, a current sensor CRS, and the SR motor MT.

The SR motor MT has a U-phase motor coil, a V-phase motor coil, and a W-phase motor coil, and the SR motor MT is rotated by causing a current to flow by sequentially switching these coils. The SR motor MT is provided with a resolver that detects a rotation angle of the SR motor.

The inverter circuit INV has a function of causing a current to flow by sequentially switching the U-phase motor coil, V-phase and is configured by six IGBTs and six diodes (FWDs). Specifically, according to the present first embodiment, by using six semiconductor devices PAC1 each of which is provided by arranging one IGBT and one diode into one package, the inverter circuit INV illustrated in FIG. 2 can be made up.

Subsequently, on the control board CWB2, an external power supply and a driver IC are mounted. The external power supply is, for example, a circuit (DC/DC converter)

having a function of generating a drive voltage of the driver IC from an in-vehicle battery (12 V). The driver IC has a function of controlling the IGBT making up the inverter circuit INV, and corresponds to, for example, the gate control circuit GCC of the inverter circuit INV illustrated in FIG. 2. Specifically, the driver IC has a function of controlling (switching) on/off of the IGBT making up the inverter circuit INV, and also has a function of protecting the IGBT from short circuit and a function of detecting (monitoring) the temperature of the IGBT.

Next, the control board CWB1 is a board on which a microcomputer is mounted. Specifically, a power IC, a micro controller unit (MCU), a resolver (angle) control IC, and an IC for a controller area network (CAN) transceiver I/F are mounted on the control board CWB1.

The power IC is, for example, a circuit having a function of generating a drive voltage of the MCU from the in-vehicle battery (12 V), and has the function similar to that of the external power supply (e.g., DC/DC converter) mounted on the control board CWB2.

The MCU has, for example, a function of controlling the motor phases (U phase, V phase, and W phase) of the SR motor. Specifically, the MCU has a function of generating a control signal for rotating the SR motor by controlling waveforms typified by a sine wave or others. The MCU also has a function of detecting (monitoring) a motor current based on an output signal from a current sensor CRS, and besides, a function of detecting (monitoring) a temperature of a case (housing) based on an output signal from a housing temperature sensor.

The IC for the CAN transceiver I/F has a function of building an interface among the resolver, the current sensor CRS, and the MCU. The resolver control IC is configured to receive an incoming rotation angle signal on the rotation angle of the SR motor output from the resolver via the IC for the CAN transceiver I/F and to process the rotation angle signal.

The MCU outputs a control signal that controls each of the motor phases (U phase, V phase, and W phase) of the SR motor at a proper timing to the driver IC mounted on the control board CWB2 based on the rotation angle signal processed by the resolver control IC, and the driver IC drives the inverter circuit INV based on the control signal output from the MUC.

As described above, the system of the electronic apparatus EA1 of the present first embodiment is configured. A mounting configuration of the electronic apparatus EA1 of the present first embodiment whose system is configured as described above will be described below.

<Mounting Configuration of Electronic Apparatus of First Embodiment>

Figure 40:
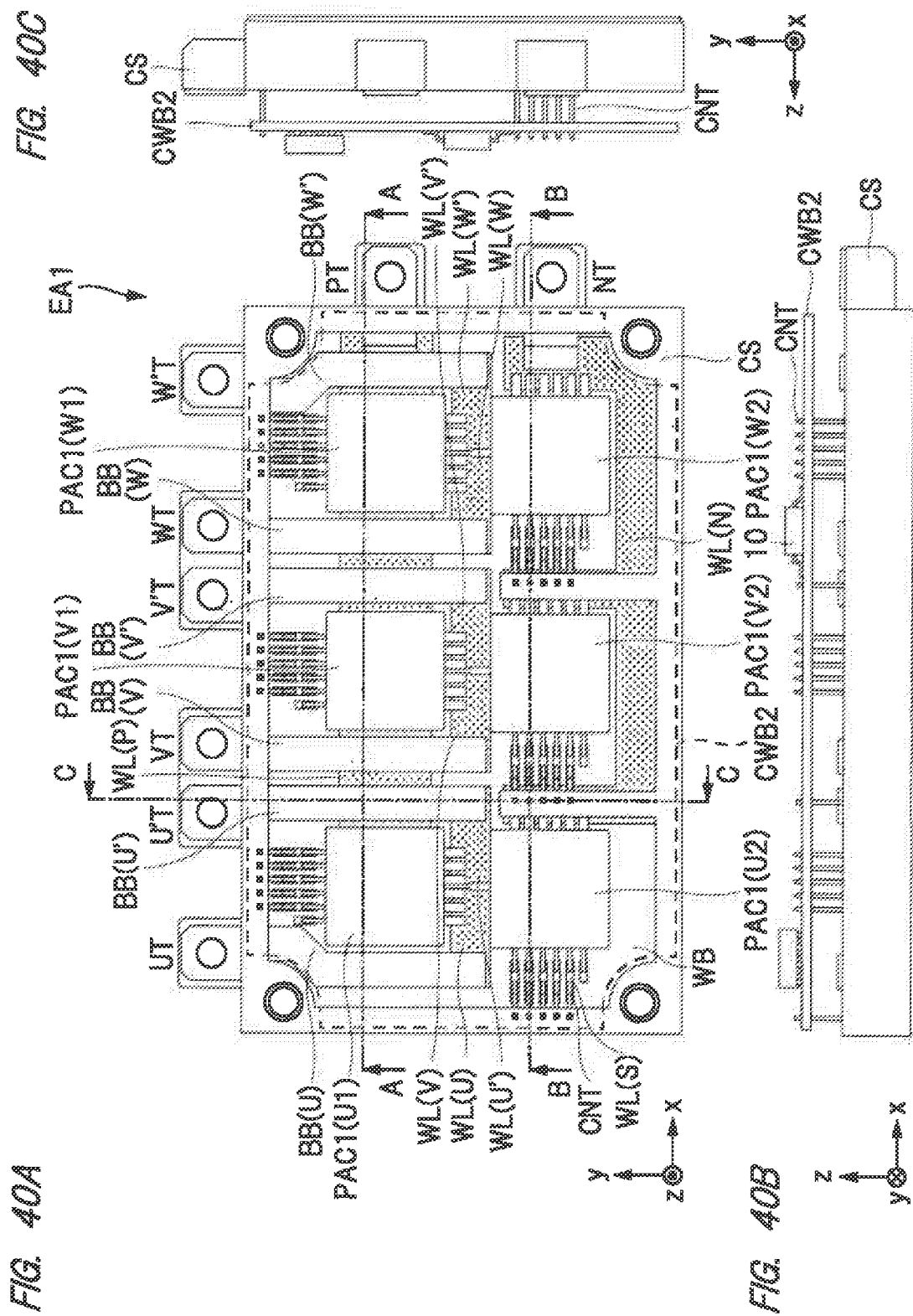
FIG. 40A is a plan view illustrating a configuration of the electronic apparatus of the present first embodiment.
FIG. 40B is a side view that is viewed from the lower side in FIG. 40A.
FIG. 40C is a side view that is viewed from the right side in FIG. 40B.

FIGS. 40A to 40C are diagrams illustrating a mounting configuration of the electronic apparatus EA1 of the present first embodiment. Particularly, FIG. 40A is a plan view illustrating a configuration of the electronic apparatus EA1 of the present first embodiment, FIG. 40B is a side view that is viewed from a lower side of a sheet of FIG. 40A, and FIG. 40C is a side view that is viewed from a right side of a sheet of FIG. 40B.

First, a mounting configuration of the inverter circuit included in the electronic apparatus EA1 of the present first embodiment will be described.

As illustrated in FIG. 40A, the electronic apparatus EA1 of the present first embodiment includes a wiring board WB surrounded by a case CS, and six semiconductor devices PAC1(U1), PAC1(U2), PAC1(V1), PAC1(V2), PAC1(W1), and PAC1(W2) are mounted on the wiring board WB. When it is not particularly required to distinguish these six semiconductor devices PAC1(U1), PAC1(U2), PAC1(V1), PAC1(V2), PAC1(W1), and PAC1(W2) from one another, note that they are collectively simply referred to as "semiconductor device PAC1" in some cases.

As illustrated in FIG. 40A, the right side (right side surface) of the case CS is provided with a power terminal PT to which a power source potential can be externally supplied and with a reference terminal (ground terminal) NT to which a reference potential (e.g., ground voltage) can be externally supplied. The upper side (upper side surface) of the case is provided with a U terminal UT, a U' terminal U'T, a V terminal VT, a V' terminal V'T, a W terminal WT, and a W' terminal W'T, which are connected to the SR motor.

On the main surface of the wiring board WB disposed on the lower surface of the case CS, a power wiring WL(P), a reference wiring WL(N), a wiring WL(U), a wiring WL(U'), a wiring WL(V), a wiring WL(V'), a wiring WL(W), a wiring WL(W'), and a plurality of wirings WL(S) are formed. When it is not particularly required to distinguish these power wiring WL(P), reference wiring WL(N), wiring WL(U), wiring WL(U'), wiring WL(V), wiring WL(V'), wiring WL(W), wiring WL(W'), and wirings WL(S), note that they are collectively simply referred to as "wiring WL" in some cases.

At this time, the power wiring WL(P) is electrically connected to the power terminal PT, and the reference wiring WL(N) is electrically connected to the reference terminal NT. The wiring WL(U) is electrically connected to the U terminal UT via a bus bar BB(U), and the wiring WL(U') is electrically connected to the U' terminal U'T via a bus bar BB(U').

Also, the wiring WL(V) is electrically connected to the V terminal VT via a bus bar BB(V), and the wiring WL(V') is electrically connected to the V' terminal V'T via a bus bar BB(V').

Similarly, the wiring WL(W) is electrically connected to the W terminal WT via a bus bar BB(W), and the wiring WL(W') is electrically connected to the W' terminal W' T via a bus bar BB(W'). When it is not particularly required to distinguish a bus bar BB(U), a bus bar BB(U'), a bus bar BB(V), a bus bar BB(V'), a bus bar BB(W), and a bus bar BB(W'), note that they are collectively simply referred to as "bus bar BB" in some cases. Here, in a plan view, the bus bar BB is arranged so as to pass above the power wiring WL(P).

The wirings WL(S) are electrically connected to a driver IC 10 disposed on the control board CWB2, via connection terminals CNT.

The wiring board WB is composed of, for example, an insulated metal substrate (IMS). This insulated metal substrate is formed so that a resin insulating layer is formed on, for example, an aluminum base made of aluminum, and a copper foil making up the wirings WL is formed on the resin insulating layer. Six semiconductor devices PAC1 are connected to the wirings WL made of the copper foil formed on the surface of the insulated metal substrate, by soldering.

According to the present first embodiment, by using the insulated metal substrate as the wiring board WB, heat resistance can be reduced. This is because that the insulated metal substrate has the thin resin insulating layer and the thick aluminum base with high heat conductivity, and therefore, the heat release efficiency can be improved. As a result, a rise in the temperature of the electronic apparatus EA1 of the present first embodiment can be suppressed, so that the reliability of the electronic apparatus EA1 can be improved. According to the present first embodiment, the insulated metal substrate is used as the wiring board WB. However, the wiring board is not limited to this, and, for example, a ceramic substrate can be also used. However, according to the present first embodiment, costs of members can be also reduced by using an insulated metal substrate that is more inexpensive than the ceramic substrate as the wiring board WB.

In FIG. 40A, six semiconductor devices PAC1 are mounted on the main surface of the wiring board WB. At this time, in combination of FIG. 15 with FIG. 40A, the emitter terminal ET of the semiconductor device PAC1(U1) is electrically connected to the wiring WL(U'), and the chip mounting portion TAB2 of the semiconductor device PAC1 (U2) is also electrically connected to the wiring WL(U'). As a result, via the wiring WL(U'), the emitter terminal ET of the semiconductor device PAC1(U1) is electrically connected to the chip mounting portion TAB2 (cathode terminal) of the semiconductor device PAC1(U2).

Meanwhile, the anode terminal AT of the semiconductor device PAC1(U1) is electrically connected to the wiring WL(U), and the chip mounting portion TAB1 of the semiconductor device PAC1(U2) is also electrically connected to the wiring WL(U). As a result, via the wiring WL(U), the anode terminal AT of the semiconductor device PAC1(U1) is electrically connected to the chip mounting portion TAB1 (collector terminal) of the semiconductor device PAC1(U2).

Further, in combination of FIG. 15 with FIG. 40A, the chip mounting portion TAB1 (collector terminal) and chip mounting portion TAB2 (cathode terminal), which are exposed from the lower surface of the semiconductor device PAC1(U1), are electrically connected to the power wiring WL(P). Meanwhile, both of the emitter terminal ET and anode terminal AT of the semiconductor device PAC1(U2) are electrically connected to the power wiring WL(N). Therefore, the emitter terminal ET and anode terminal AT of the semiconductor device PAC1(U2) are electrically connected to each other via the power wiring WL(N).

In combination of FIG. 15 with FIG. 40A, the signal terminals SGT of the semiconductor device PAC1(U1) are connected to the wirings WL(S), and the wirings WL(S) are electrically connected to the driver IC 10 disposed on the control board CWB2, via the connection terminals CNT. The signal terminals SGT of the semiconductor device PAC1 (U2) are connected to the wirings WL(S), and the wirings WL(S) are electrically connected to the driver IC 10 disposed on the control board CWB2, via the connection terminals CNT.

Similarly, in combination of FIG. 15 with FIG. 40A, the emitter terminal ET of the semiconductor device PAC1(V1) is electrically connected to the wiring WL(V'), and the chip mounting portion TAB2 of the semiconductor device PAC1 (V2) is also electrically connected to the wiring WL(V'). As a result, via the wiring WL(V'), the emitter terminal ET of the semiconductor device PAC1(V1) is electrically connected to the chip mounting portion TAB2 (cathode terminal) of the semiconductor device PAC1(V2).

Meanwhile, the anode terminal AT of the semiconductor device PAC1(V1) is electrically connected to the wiring WL(V), and the chip mounting portion TAB1 of the semiconductor device PAC1(V2) is also electrically connected to the wiring WL(V). As a result, via the wiring WL(V), the anode terminal AT of the semiconductor device PAC1(V1) is electrically connected to the chip mounting portion TAB1 (collector terminal) of the semiconductor device PAC1(V2).

Further, in combination of FIG. 15 with FIG. 40A, the chip mounting portion TAB1 (collector terminal) and chip mounting portion TAB2 (cathode terminal), which are exposed from the lower surface of the semiconductor device PAC1(V1), are electrically connected to the power wiring WL(P). Meanwhile, both of the emitter terminal ET and anode terminal AT of the semiconductor device PAC1(V2) are electrically connected to the power wiring WL(N). Therefore, the emitter terminal ET and anode terminal AT of the semiconductor device PAC1(V2) are electrically connected to each other via the power wiring WL(N).

In combination of FIG. 15 with FIG. 40A, the signal terminals SGT of the semiconductor device PAC1(V1) are connected to the wirings WL(S), and the wirings WL(S) are electrically connected to the driver IC 10 disposed on the control board CWB2, via the connection terminals CNT. The signal terminals SGT of the semiconductor device PAC1 (V2) are connected to the wirings WL(S), and the wirings WL(S) are electrically connected to the driver IC 10 disposed on the control board CWB2, via the connection terminals CNT.

Similarly, in combination of FIG. 15 with FIG. 40A, the emitter terminal ET of the semiconductor device PAC1(W1) is electrically connected to the wiring WL(W'), and the chip mounting portion TAB2 of the semiconductor device PAC1 (W2) is also electrically connected to the wiring WL(W'). As a result, via the wiring WL(W'), the emitter terminal ET of the semiconductor device PAC1(W1) is electrically connected to the chip mounting portion TAB2 (cathode terminal) of the semiconductor device PAC1(W2).

Meanwhile, the anode terminal AT of the semiconductor device PAC1(W1) is electrically connected to the wiring WL(W), and the chip mounting portion TAB1 of the semiconductor device PAC1(W2) is also electrically connected to the wiring WL(W). As a result, via the wiring WL(W), the anode terminal AT of the semiconductor device PAC1(W1) is electrically connected to the chip mounting portion TAB1 (collector terminal) of the semiconductor device PAC1(W2).

Further, in combination of FIG. 15 with FIG. 40A, the chip mounting portion TAB1 (collector terminal) and chip mounting portion TAB2 (cathode terminal), which are exposed from the lower surface of the semiconductor device PAC1(W1), are electrically connected to the power wiring WL(P). Meanwhile, both of the emitter terminal ET and anode terminal AT of the semiconductor device PAC1(W2) are electrically connected to the power wiring WL(N). Therefore, the emitter terminal ET and anode terminal AT of the semiconductor device PAC1(W2) are electrically connected to each other via the power wiring WL(N).

In combination of FIG. 15 with FIG. 40A, the signal terminals SGT of the semiconductor device PAC1(W1) are connected to the wirings WL(S), and the wirings WL(S) are electrically connected to the driver IC 10 disposed on the control board CWB2, via the connection terminals CNT. The signal terminals SGT of the semiconductor device PAC1 (W2) are connected to the wirings WL(S), and the wirings WL(S) are electrically connected to the driver IC 10 disposed on the control board CWB2, via the connection terminals CNT.

Subsequently, according to the electronic apparatus EA1 of the present first embodiment, as illustrated in FIG. 40A, for example, the semiconductor device PAC1(U1) and the semiconductor device PAC1(U2) are arranged so as to line to each other in the y direction, the semiconductor device PAC1(V1) and the semiconductor device PAC1(V2) are arranged so as to line to each other in the y direction, and the semiconductor device PAC1(W1) and the semiconductor device PAC1(W2) are arranged so as to line to each other in the y direction.

At this time, the semiconductor device PAC1(U1) makes up the upper arm UA(U) of the first leg LG1 of FIG. 2, while the semiconductor device PAC1(U2) makes up the lower arm BA(U) of the first leg LG1 of FIG. 2. Similarly, the semiconductor device PAC1(V1) makes up the upper arm UA(V) of the second leg LG2 of FIG. 2, while the semiconductor device PAC1(V2) makes up the lower arm BA(V) of the second leg LG2 of FIG. 2. The semiconductor device PAC1(W1) makes up the upper arm UA(W) of the third leg LG3 of FIG. 2, while the semiconductor device PAC1(W2) makes up the lower arm BA(W) of the third leg LG3 of FIG. 2.

As illustrated in FIG. 40A, for example, the semiconductor device PAC1(U1), semiconductor device PAC1(V1), and semiconductor device PAC1(W1) are arranged so as to line to each other in the x direction, and the semiconductor device PAC1(U2), semiconductor device PAC1(V2), and semiconductor device PAC1(W2) are also arranged so as to line to each other in the x direction.

Therefore, according to the electronic apparatus EA1 of the present first embodiment, each of the three semiconductor devices PAC1(U1), PAC1(V1), and PAC1(W1) which are arranged on the upper side of the wiring board WB so as to line to each other in the x direction becomes a component of the upper arm of each of the first to third legs LG1 to LG3. On the other hand, each of the three semiconductor devices PAC1(U2), PAC1(V2), and PAC1(W2) which are arranged on the lower side of the wiring board WB so as to line to each other in the x direction becomes a component of the lower arm of each of the first to third legs LG1 to LG3.

At this time, when attention is paid to the semiconductor device PAC1(U1) and the semiconductor device PAC1(U2), the semiconductor device PAC1(U1) and the semiconductor device PAC1(U2) are mounted on the main surface of the wiring board WB so as to be in different directions from each other in a plan view.

For example, in FIG. 40A, the semiconductor device PAC1(U1) is mounted on the wiring board WB so that the emitter terminal ET and anode terminal AT protrude from the sealing material in the −y direction. On the other hand, in FIG. 40A, the semiconductor device PAC1(U2) is mounted on the wiring board WB so that the emitter terminal ET and anode terminal AT protrude from the sealing material in the +x direction.

Similarly, when attention is also paid to the semiconductor device PAC1(V1) and the semiconductor device PAC1(V2), the semiconductor device PAC1(V1) and the semiconductor device PAC1(V2) are mounted on the main surface of the wiring board WB so as to be in different directions from each other in a plan view.

For example, in FIG. 40A, the semiconductor device PAC1(V1) is mounted on the wiring board WB so that the emitter terminal ET and anode terminal AT protrude from the sealing material in the −y direction. On the other hand, in FIG. 40A, the semiconductor device PAC1(V2) is mounted on the wiring board WB so that the emitter terminal ET and anode terminal AT protrude from the sealing material in the +x direction.

Similarly, when attention is also paid to the semiconductor device PAC1(W1) and the semiconductor device PAC1(W2), the semiconductor device PAC1(W1) and the semiconductor device PAC1(W2) are mounted on the main surface of the wiring board WB so as to be in different directions from each other in a plan view.

For example, in FIG. 40A, the semiconductor device PAC1(W1) is mounted on the wiring board WB so that the emitter terminal ET and anode terminal AT protrude from the sealing material in the −y direction. On the other hand, in FIG. 40A, the semiconductor device PAC1(W2) is mounted on the wiring board WB so that the emitter terminal ET and anode terminal AT protrude from the sealing material in the +x direction.

Further, in the electronic apparatus EA1 of the present first embodiment, attention is paid to the arrangement relation between the semiconductor device PAC1(U1) and the semiconductor device PAC1(U2) with reference to, for example, FIGS. 15 and 40A.

In this case, in a plan view, the chip mounting portion TAB1 and chip mounting portion TAB2 of the semiconductor device PAC1(U1) are arranged between the side S1 and the side S2 of the sealing material MR, and the chip mounting portion TAB2 is arranged between the side S1 and the chip mounting portion TAB1 on which the semiconductor chip CHP1 is mounted.

Also, in a plan view, the chip mounting portion TAB1 and chip mounting portion TAB2 of the semiconductor device PAC1(U2) are arranged between the side S1 and the side S2 of the sealing material MR, and the chip mounting portion TAB2 is arranged between the side S1 and the chip mounting portion TAB1 on which the semiconductor chip CHP1 is mounted.

Further, in a plan view, the emitter terminal ET and anode terminal AT of the semiconductor device PAC1(U1) are arranged so as to line along the side S1 of the sealing material MR, and the emitter terminal ET is arranged between the anode terminal AT and a corner made by the side S1 and the side S4.

Similarly, in a plan view, the emitter terminal ET and anode terminal AT of the semiconductor device PAC1(U2) are arranged so as to line along the side S1 of the sealing material MR, and the emitter terminal ET is arranged between the anode terminal AT and a corner made by the side S1 and the side S4.

In a plan view, the semiconductor device PAC1(U1) and semiconductor device PAC1(U2) are mounted on the main surface of the wiring board WB such that the side S1 of the sealing material MR of the semiconductor device PAC1(U1) and the side S4 of the sealing material MR of the semiconductor device PAC1(U2) are oriented in an opposite direction to each other, and the side S4 of the sealing material MR of the semiconductor device PAC1(U1) and the side S1 of the sealing material MR of the semiconductor device PAC1(U2) are oriented in the same direction as each other.

Note that the explanation has been made in the attention paid to the arrangement relation between the semiconductor device PAC1(U1) and the semiconductor device PAC1(U2). This explanation is also applicable to the arrangement relation between the semiconductor device PAC1(V1) and the semiconductor device PAC1(V2), and to the arrangement relation between the semiconductor device PAC1(W1) and the semiconductor device PAC1(W2).

In the above-described manner, in FIG. 40A, the power wiring WL(P) is formed on the main surface of the wiring board WB so as to be electrically connected to the power terminal PT, the semiconductor device PAC1(U1), the semiconductor device PAC1(V1), and the semiconductor device PAC1(W1).

Also, in FIG. 40A, the reference wiring WL(N) is formed on the main surface of the wiring board WB so as to be electrically connected to the reference terminal NT, the semiconductor device PAC1(U2), the semiconductor device PAC1(V2), and the semiconductor device PAC1(W2).

In a plan view, the chip mounting portions TAB1 and TAB2 of each of the semiconductor device PAC1(U1), the semiconductor device PAC1(V1), and the semiconductor device PAC1(W1) are electrically connected to the power wiring WL(P) by mounting the semiconductor device PAC1 (U1), the semiconductor device PAC1(V), and the semiconductor device PAC1(W1) on the power wiring WL(P) so as to overlap a part of the power wiring WL(P).

Next, a mounting configuration of the control board CWB2 included in the electronic apparatus EA1 of the present first embodiment will be described.

First, in FIG. 40A, each of the six semiconductor devices PAC1 is provided with the signal terminals SGT (see FIG. 15), and the connection terminals CNT are formed on the main surface of the wiring board WB so as to be electrically connected to the signal terminals SGT. The connection terminals CNT are bent in the +z direction as illustrated in FIGS. 40B and 40C.

As illustrated in FIGS. 40B and 40C, the control board CWB2 is disposed above the case CS (in the +z direction), so that the connection terminals CNT bent in the +z direction are electrically connected to the control board CWB2. That is, the connection terminals CNT and the control board CWB2 are arranged so that the above-described connection terminals CNT penetrate the control board CWB2. As a result, electronic components formed on the control board CWB2 are electrically connected to the semiconductor device PAC1 mounted on the wiring board WB. Specifically, the connection terminals CNT are electrically connected to the control terminals SGT of the semiconductor device PAC1 which is a component of the inverter circuit and also electrically to the control board CWB2 on which the driver IC is mounted. As a result, the semiconductor device PAC1 which is the component of the inverter circuit is electrically connected to the driver IC.

Figure 41:
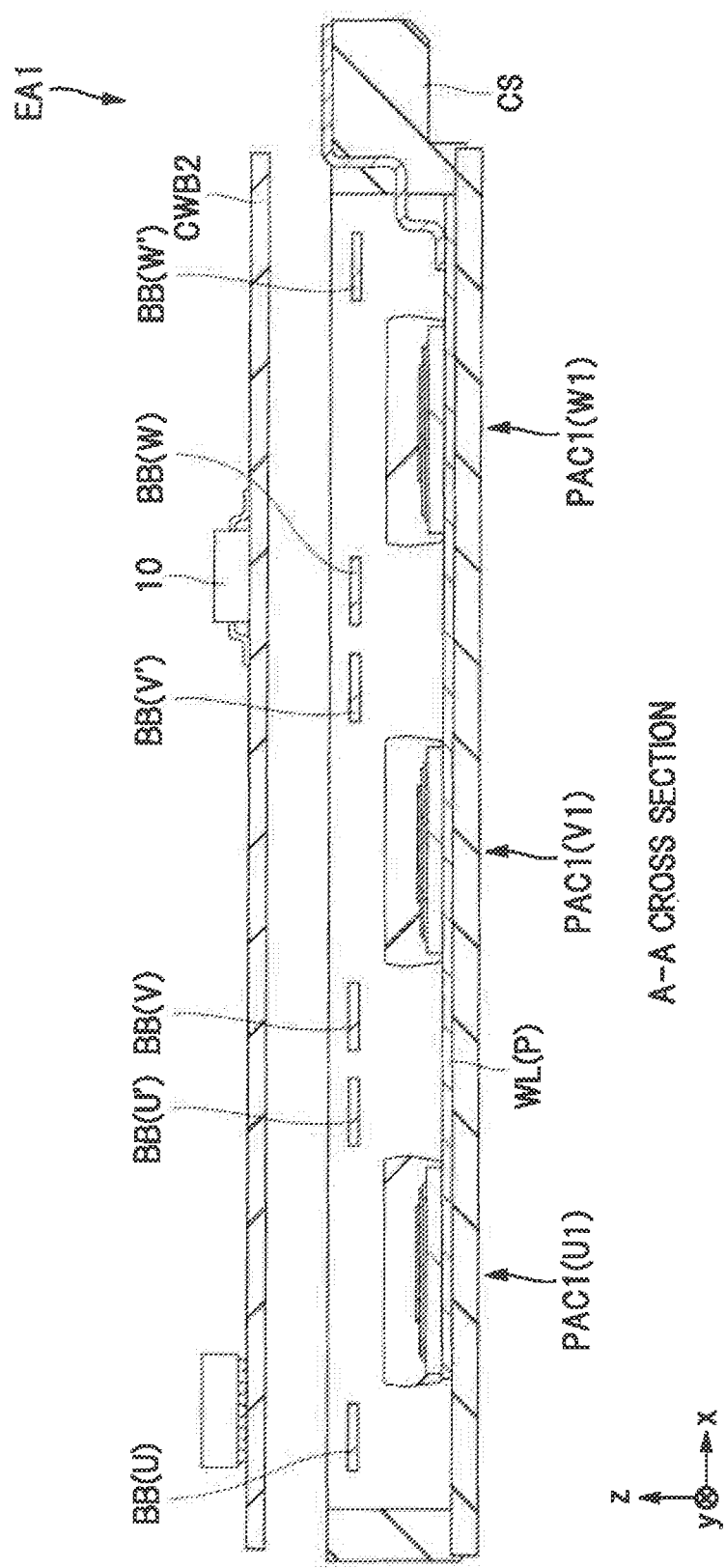
FIG. 41 is a cross-sectional view taken along a line A-A of FIG. 40A.

Subsequently, FIG. 41 is a cross-sectional view taken along a line A-A of FIG. 40A. As illustrated in FIG. 41, according to the electronic apparatus EA1 Of the present first embodiment, it could be understood that the inverter circuit is configured inside the case CS, and that the control board CWB2 on which the driver IC is mounted is disposed above the case CS (in the +z direction).

Figure 42:
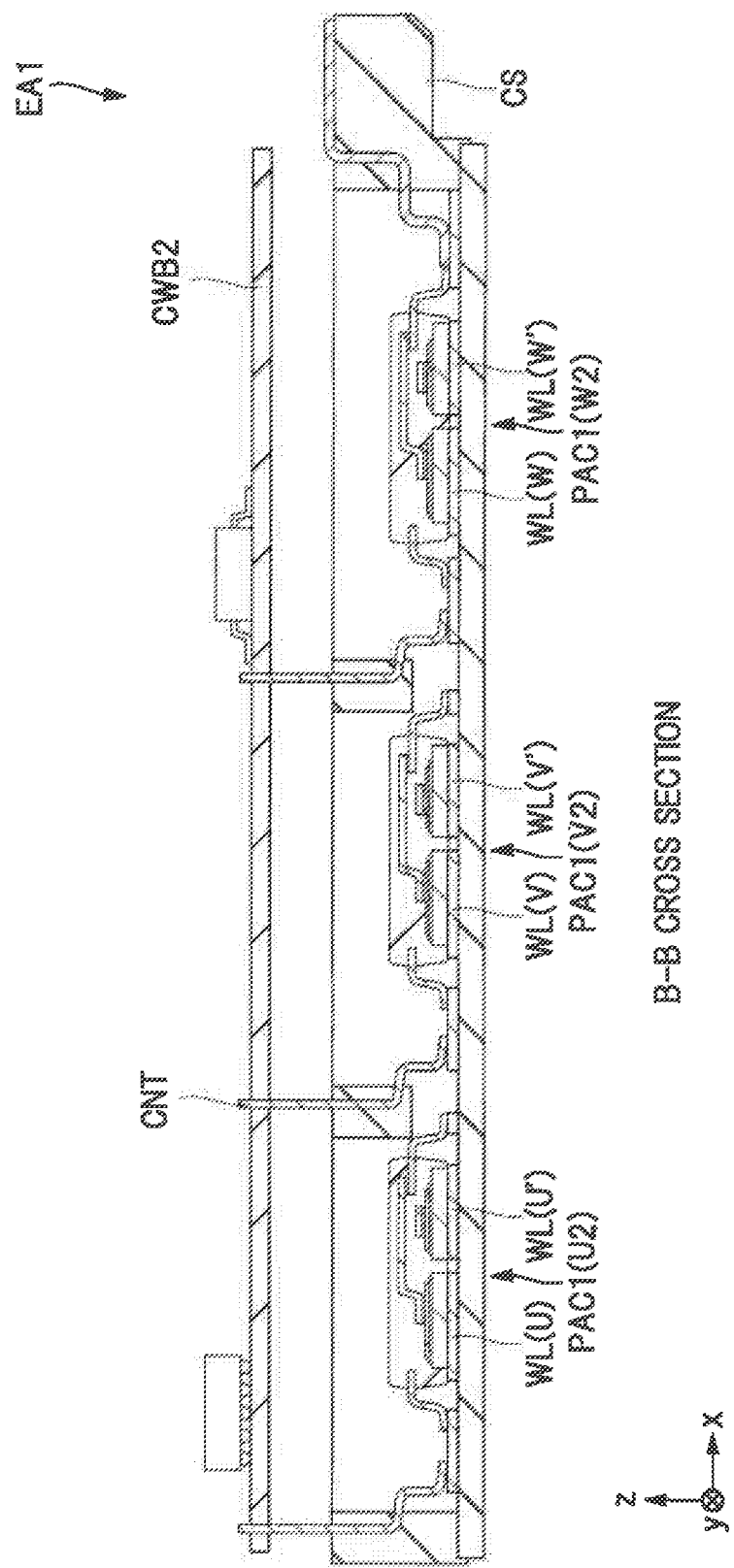
FIG. 42 is a cross-sectional view taken along a line B-B of FIG. 40A.
Figure 43:
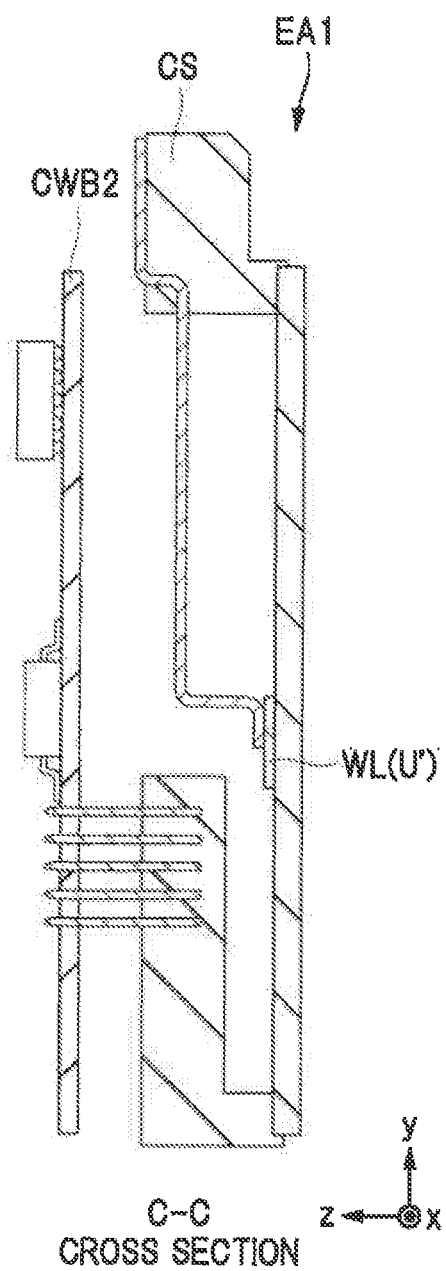
FIG. 43 is a cross-sectional view taken along a line C-C of FIG. 40A.

FIG. 42 is a cross-sectional view taken along a line B-B of FIG. 40A, and FIG. 43 is a cross-sectional view taken along a line C-C of FIG. 40A. As illustrated in FIGS. 42 and 43, it could be understood that the connection terminals CNT bent in the +z direction are arranged so as to penetrate the control board CWB2 disposed above the case CS (in the +z direction).

Although not illustrated in FIGS. 40B, 40C, 42, and 43, note that the control board CWB1 on which the MCU is mounted is mounted above the control board CWB2 (in the +z direction). As a result, the present first embodiment forms the mounting configuration of the electronic apparatus EA1 including the inverter circuit (six semiconductor devices PAC1), the control board CWB2 on which the driver IC is mounted, and the control board CWB1 on which the MCU is mounted. As described above, the mounting configuration of the electronic apparatus EA1 of the present first embodiment is achieved.

Figure 44:
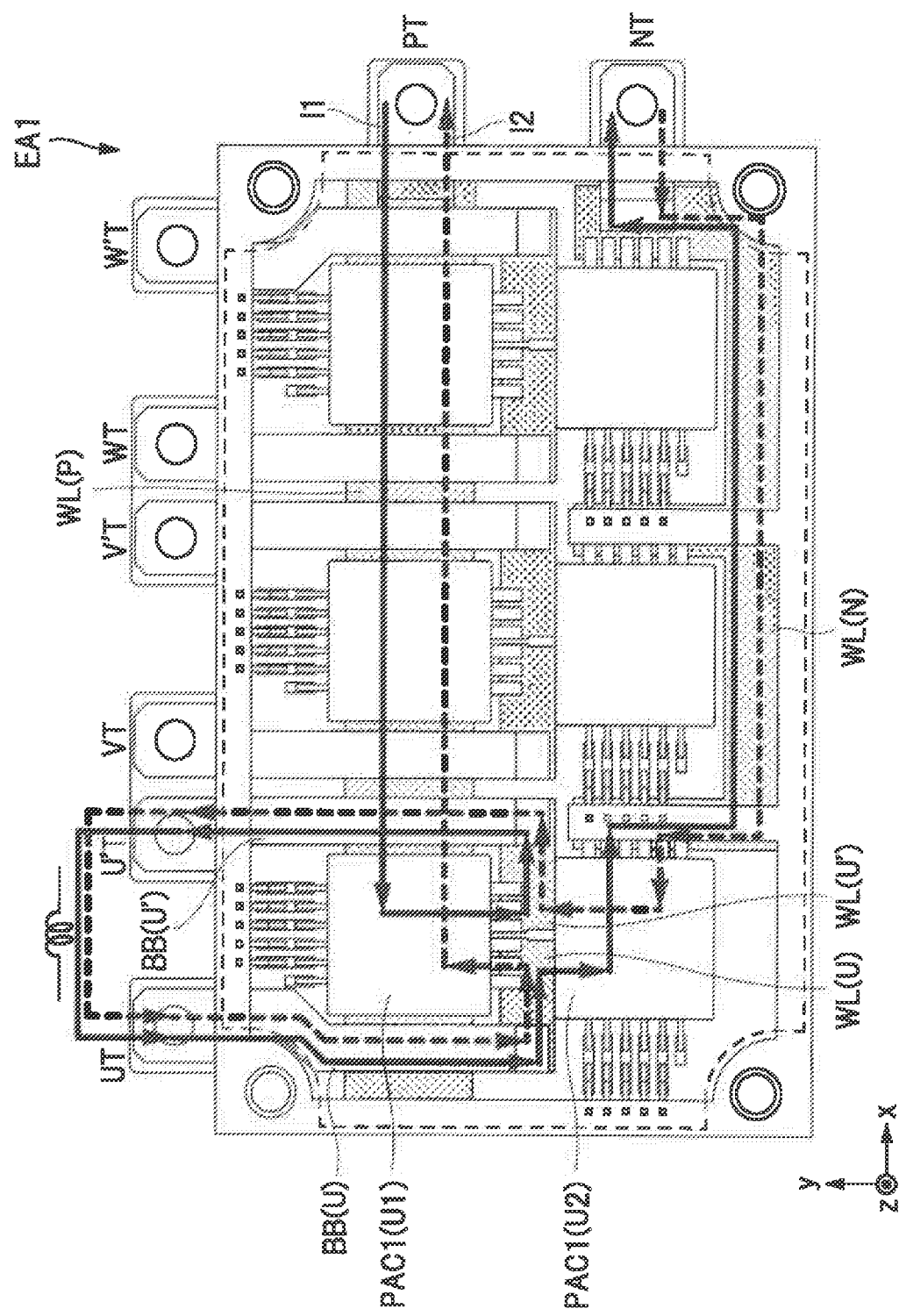
FIG. 44 is a diagram illustrating a main current flow through an IGBT and a regenerative current flow through a diode in the electronic apparatus of the present first embodiment.
Figure 45:
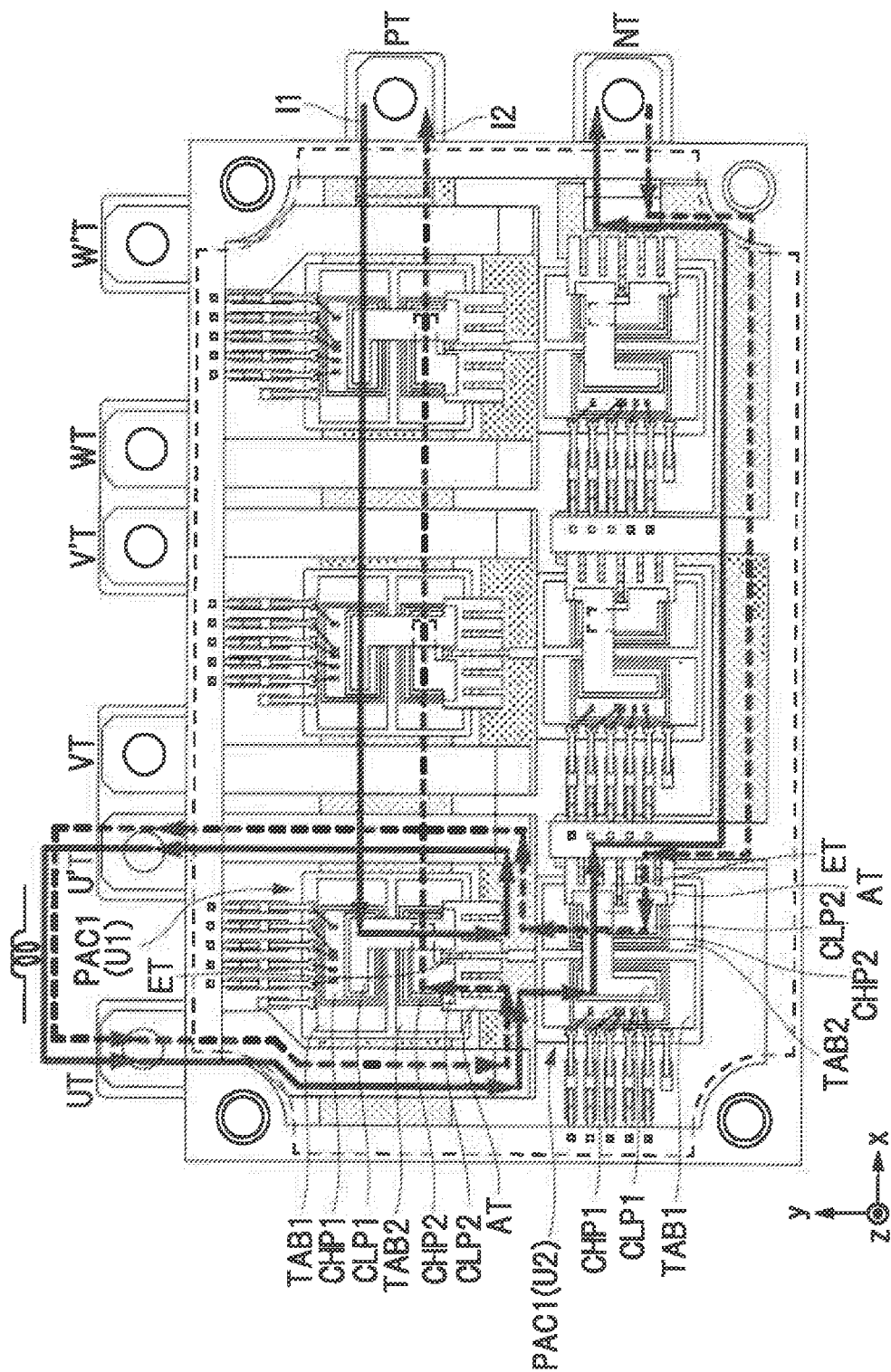
FIG. 45 is a diagram illustrating the main current flow through the IGBT and the regenerative current flow through the diode in a state of a perspective view of the sealing material of the semiconductor device making up the electronic apparatus of the present first embodiment.

Next, a current flow in the electronic apparatus EA1 of the present first embodiment will be described. FIG. 44 is a diagram illustrating a main current flow through the IGBTs and a regenerative current flow through the diodes in the electronic apparatus EA1 of the present first embodiment. FIG. 45 is a diagram illustrating the main current flow through the IGBTs and the regenerative current flow through the diodes, obtained when the sealing materials of the semiconductor devices PAC1 making up the electronic apparatus EA of the present first embodiment are transparently viewed.

First, in FIG. 44, the main current flow through the IGBTs is indicated by a solid arrow. Specifically, the main current I1 flows through the IGBTs in a path such as "power terminal PT"→"power wiring WL(P)"→"semiconductor device PAC1(U1)"→"wiring WL(U')"→"bus bar BB(U') "→"U' terminal U'T"→"SR motor"→"U terminal UT"→"bus bar BB(U)"→"wiring WL(U)"→"semiconductor device PAC1(U2)"→"reference wiring WL(N)"→"reference terminal NT".

Meanwhile, in FIG. 44, the regenerative current flow through the diodes is indicated by a broken arrow. Specifically, the regenerative current I2 flows through the diodes in a path such as "reference terminal NT"→"reference wiring WL(N)"→"semiconductor device PAC1(U2)"→"wiring WL(U')"→"bus bar BB(U')"→"U' terminal U' T"→"SR motor"→"U terminal UT"→"bus bar BB(U)"→"wiring WL(U)"→"semiconductor device PAC1(U1)"→"power wiring WL(P)"→"power terminal PT".

Subsequently, with reference to FIG. 45, explanation will be made about the flows of the main current I1 and the regenerative current I2 in the semiconductor device PAC1 (U1) and in the semiconductor device PAC1(U2).

In FIG. 45, the main current I1 flows through the IGBTs in a path such as "power wiring WL(P)"→"chip mounting portion TAB1 (semiconductor device PAC1(U1))"→"semiconductor chip CHP1"→"clip CLP1"→"emitter terminal ET"→"path in FIG. 44"→"chip mounting portion TAB1 (semiconductor device PAC1(U2))"-4 "semiconductor chip CHP1"→"clip CLP1"→"emitter terminal ET" →"path in FIG. 44".

On the other hand, in FIG. 45, the regenerative current I2 flows through the IGBTs in a path such as "reference wiring WL(N)"→"anode terminal AT (semiconductor device PAC1 (U2))"→"clip CLP2"→"semiconductor chip CHP2"→"chip mounting portion TAB2"→"path in FIG. 44"→"anode terminal AT (semiconductor device PAC1 (U1))"→"clip CLP2"→"semiconductor chip CHP2→chip mounting portion TAB2"→"path in FIG. 44".

From the above description, it could be understood that the U' terminal U'T functions as a current output terminal capable of outputting a current to an outside of the electronic apparatus EA1 and that the U terminal UT functions as a current input terminal capable of receiving an incoming current from the outside of the electronic apparatus EA1. Similarly, each of the V' terminal V'T and the W' terminal W'T functions as a current output terminal capable of outputting a current to an outside of the electronic apparatus EA1, and each of the V terminal VT and the W terminal WT functions as a current input terminal capable of receiving an incoming current from the outside of the electronic apparatus EA1.

<Features of Electronic Apparatus of First Embodiment>

Next, features of the electronic apparatus EA1 of the present first embodiment will be described. For example, as illustrated in FIG. 40A, a first feature of the electronic apparatus EA1 of the present first embodiment is that the power wiring WL(P) electrically connected to the power terminal PT extends in the x direction, and that the semiconductor devices PAC1(U), PAC1(V1), and PAC1(W1) are arranged on the power wiring WL(P) so as to line in the x direction. This configuration can reduce the wiring length of the power wiring WL(P) electrically connecting the power terminal PT to each of the semiconductor devices PAC1 (U1), PAC1(V1), and PAC1(W1) as much as possible. As a result, according to the electronic apparatus EA1 of the present first embodiment, the parasitic resistance and parasitic inductance of the power wiring WL(P) can be reduced.

Subsequently, a second feature of the electronic apparatus EA1 of the present first embodiment is that, for example, in attention paid to the semiconductor device PAC1(U1) and semiconductor device PAC1(U2) illustrated in FIG. 40A, wiring lengths of the wiring WL(U) and wiring WL(U') electrically connecting the semiconductor device PAC1(U1) to the semiconductor device PAC1(U2) are reduced as much as possible.

This feature is achieved by mounting the semiconductor device PAC1(U) and the semiconductor device PAC1(U2) on the main surface of the wiring board WB so as to be in different directions from each other in a plan view. That is, in FIG. 40A, the semiconductor device PAC1(U1) is mounted on the wiring board WB so that the emitter terminal and anode terminal protrude from the sealing material in the −y direction. On the other hand, in FIG. 40A, the semiconductor device PAC1(U2) is mounted on the wiring board WB so that the emitter terminal and anode terminal protrude from the sealing material in the +x direction. As a result, for example, as illustrated in FIG. 15, the emitter terminal ET of the semiconductor device PAC1(U1) and the chip mounting portion TAB2 of the semiconductor device PAC1(U2) are arranged linearly along the y direction. Therefore, the wiring length of the wiring WL(U') connecting the emitter terminal ET of the semiconductor device PAC1(U1) to the chip mounting portion TAB2 of the semiconductor device PAC1 (U2) can be reduced. Similarly, as illustrated in FIG. 15, the anode terminal AT of the semiconductor device PAC1(U1) and the chip mounting portion TAB1 of the semiconductor device PAC1(U2) are arranged linearly along the y direction. Therefore, the wiring length of the wiring WL(U) connecting the anode terminal ET of the semiconductor device PAC1(U1) to the chip mounting portion TAB1 of the semiconductor device PAC1(U2) can be reduced.

Hence, according to the electronic apparatus EA1 of the present first embodiment, the parasitic resistances and parasitic inductances of the power wiring WL(U) and the power wiring WL(U') can be reduced.

Since the wirings WL(V) and WL(V') and of the wirings WL(W) and WL(W') have the same configuration, note that their wiring lengths can also be reduced as similar to the WL(U) and WL(U'). Thus, according to the electronic apparatus EA1 of the present first embodiment, the parasitic resistances and parasitic inductances of the wiring WL(V), wiring WL(V'), wiring WL(W) and wiring WL(W') can also be reduced.

In this manner, by the first feature and second feature of the electronic apparatus EA1 of the present first embodiment, the wiring lengths of the power wiring WL(P), wiring WL(U), wiring WL(U'), wiring WL(V), wiring WL(V'), wiring WL(W) and wiring WL(W') can be reduced as much as possible. Meanwhile, as illustrated in FIG. 40A, as a result of the achievement of the above-described first and second features, the wiring length of the reference wiring WL(N) is not the shortest length but reduced as much as possible. This means that the electronic apparatus EA1 of the present first embodiment is devised so that the wiring lengths of the power wiring WL(P), reference wiring WL(N), wiring WL(U), wiring WL(U'), wiring WL(V), wiring WL(V'), wiring WL(W) and wiring WL(W') are reduced as a whole as much as possible.

As a result, according to the electronic apparatus EA1 of the present first embodiment, the parasitic resistances and parasitic inductances caused by the above-described wirings WL can be reduced, so that the performance of the electronic apparatus EA1 including the inverter circuit INV for the SR motor can be improved. Besides, the above-described fact that the wiring lengths of the wirings WL can be reduced as a whole as much as possible means that the electronic apparatus EA1 can be downsized.

Therefore, according to the electronic apparatus EA1 of the present first embodiment, by providing the above-described first and second features, not only the improvement in the performance of the electronic apparatus EA1 but also the downsizing of the electronic apparatus EA1 can be achieved.

Next, a third feature of the electronic apparatus EA1 of the present first embodiment is that, for example, the U terminal UT, U' terminal U'T, V terminal VT, V' terminal V'T, W terminal WT, and W' terminal W'T are attached to one side (one side surface) of the case CS as illustrated in FIG. 40A. All of these terminals are connected to the SR motor. Therefore, when all of these terminals are collectively provided to the one side (one side surface) of the case CS, easiness of connection between these terminals and the SR motor can be improved. The third feature of the electronic apparatus EA1 of the present first embodiment also can obtain an advantage which also becomes easy to arrange the bus bars BB as the above-described first and second features are adopted.

Subsequently, a fourth feature of the electronic apparatus EA1 of the present first embodiment is that, for example, the wirings WL are formed so as to be closely attached to the front surface of the wiring board WB while the bus bars BB are located in a floating state as illustrated in FIG. 40A. That is, in order to achieve all of the first to third features of the electronic apparatus EA1 of the present first embodiment, the wirings WL and the bus bars BB necessarily cross each other. Therefore, it is required to form either one of each wiring WL and each bus bar BB as the closely attached wiring that is closely attached to the front surface of the wiring board WB and form the other of the same as the floated wiring.

Here, the floated wiring is larger than the closely attached wiring in a parasitic inductance. Therefore, according to the present first embodiment, the wiring WL is formed of the closely attached wiring while the bus bar BB is formed of the floated wiring. This is because that the larger parasitic inductance of the wiring WL connected between the power terminal PT and the reference terminal NT causes reduction in the performance of the inverter circuit that performs high-speed switching operations. On the other hand, the bus bar BB is disposed in a portion connected to the coils of the SR motor. Therefore, even if the parasitic inductance of the bus bar BB itself is large, the influence of the parasitic inductance of the bus bar BB itself does not appear since the coil itself of the SR motor has a large inductance.

That is, the parasitic inductance of the wiring WL has a large influence on the performance of the inverter circuit, while the parasitic inductance of the bus bar BB has no influence on the performance of the inverter circuit. For this reason, according to the electronic apparatus EA1 of the present first embodiment, the wiring WL is formed of the closely attached wiring while the bus bar BB is formed of the floated wiring.

As described above, since the electronic apparatus EA1 of the present first embodiment has the above-described first to fourth features, the performance of the electronic apparatus EA1 including the inverter circuit for the SR motor and the downsizing of the same can be achieved.

<Modification>

Next, a modification of the electronic apparatus EA1 of the present first embodiment will be described. First, a configuration of a semiconductor device PAC8 which is a component of the electronic apparatus according to the present modification will be described.

Figure 46:
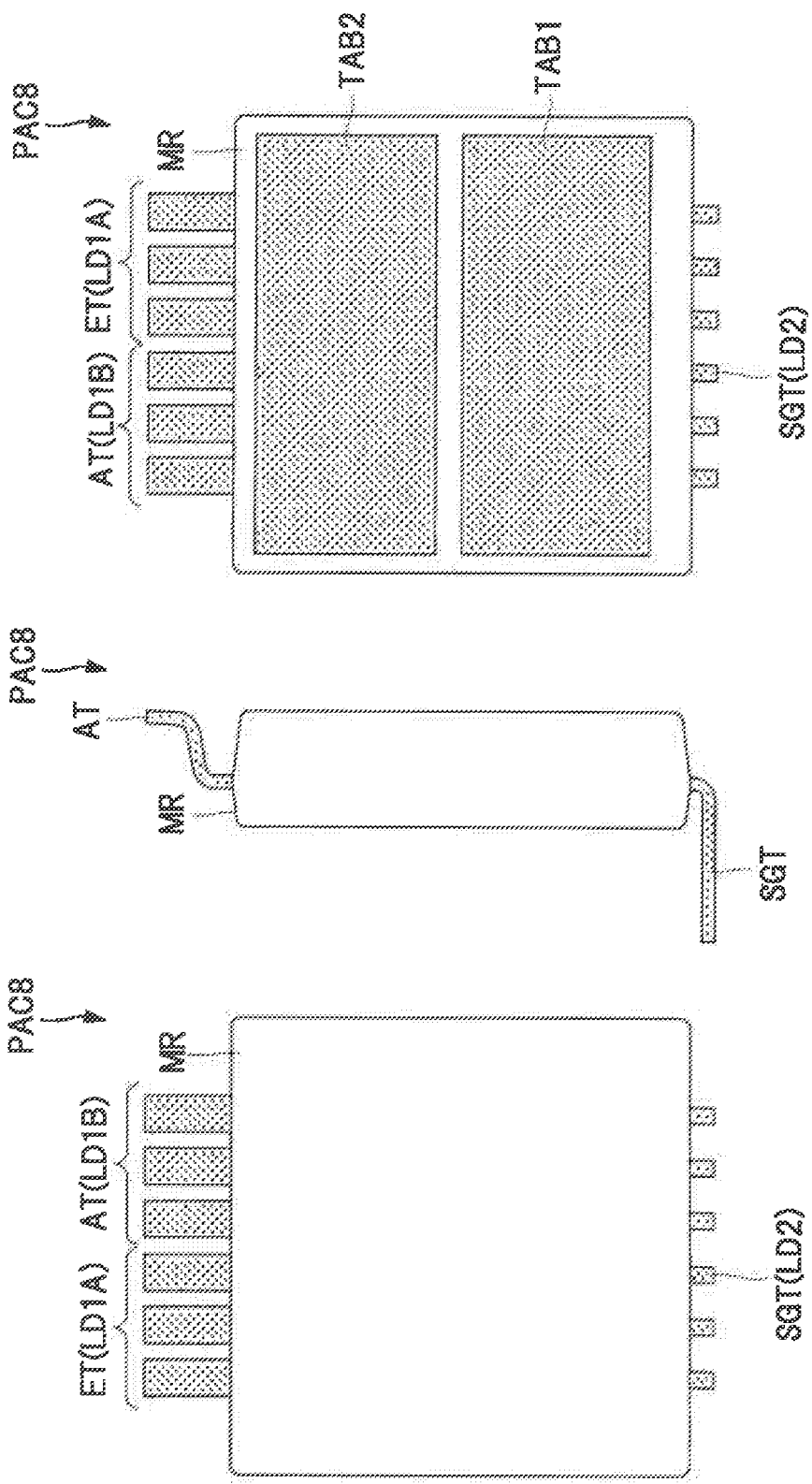
FIG. 46A is a plan view of a semiconductor device of a modification that is viewed from its front surface.
FIG. 46B is a side view of the semiconductor device of the modification that is viewed from its one side.
FIG. 46C is a plan view of the semiconductor device of the modification that is viewed from its back surface.

FIGS. 46A to 46C are diagrams illustrating an outer appearance configuration of the semiconductor device PAC8 of the present modification. Specifically, FIG. 46A is a plan view of the semiconductor device PAC8 of the present modification that is viewed from its front surface (upper surface), FIG. 46B is a side view of the semiconductor device PAC8 of the modification that is viewed from its side surface, and FIG. 46C is a plan view of the semiconductor device PAC8 of the modification that is viewed from its back surface (lower surface).

As particularly illustrated in FIG. 46B of FIGS. 46A to 46C, a feature of the semiconductor device PAC8 of the present modification is that the signal terminals SGT are bent in the +z direction. In other words, a tip of each of the plurality of signal terminals SGT is bent so as to locate above the upper surface of the sealing material MR. Other configurations than this bending configuration in the semiconductor device PAC8 of the present modification are the same as the configurations of the semiconductor device PAC1 of FIGS. 11A to 11C.

Figure 47:
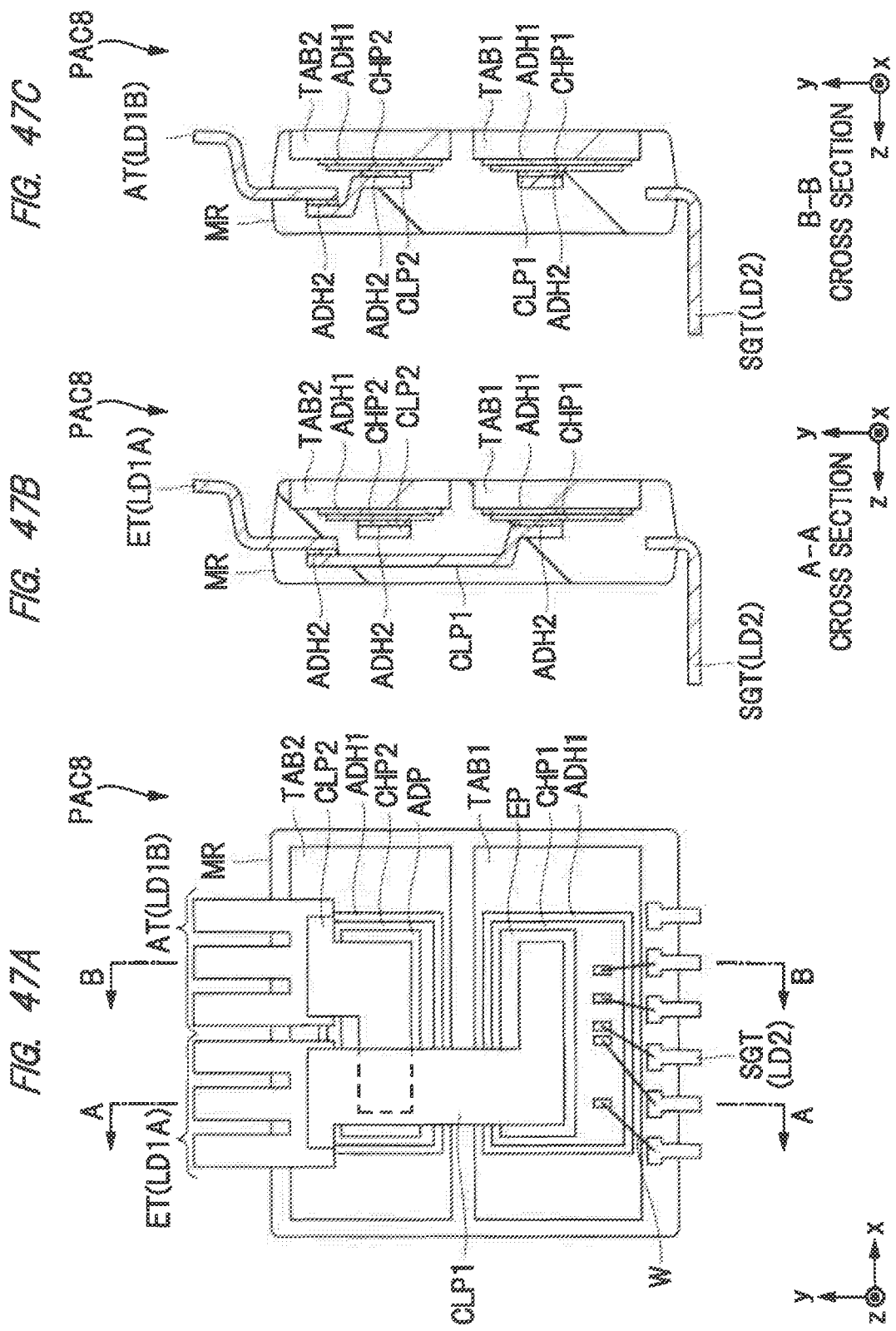
FIG. 47A is a plan view illustrating an internal structure of the semiconductor device of the modification.
FIG. 47B is a cross-sectional view taken along a line A-A of FIG. 47A.
FIG. 47C is a cross-sectional view taken along a line B-B of FIG. 47A.

FIGS. 47A to 47C are diagrams illustrating the internal structure of the semiconductor device PAC8 of the present modification. Specifically, FIG. 47A corresponds to a plan view, FIG. 47B corresponds to a cross-sectional view taken along a line A-A of FIG. 47A, and FIG. 47C corresponds to a cross-sectional view taken along a line B-B of FIG. 47A.

As illustrated in FIGS. 47B and 47C, according to the semiconductor device PAC8 of the present modification, it is understood that the signal terminals SGT are bent in the +z direction. Other configurations than this bonding configuration in the semiconductor device PAC8 of the present modification are the same as the configurations of the semiconductor device PAC1 of FIGS. 12A to 12C. As described above, the semiconductor device PAC8 of the present modification is configured.

Figure 48:
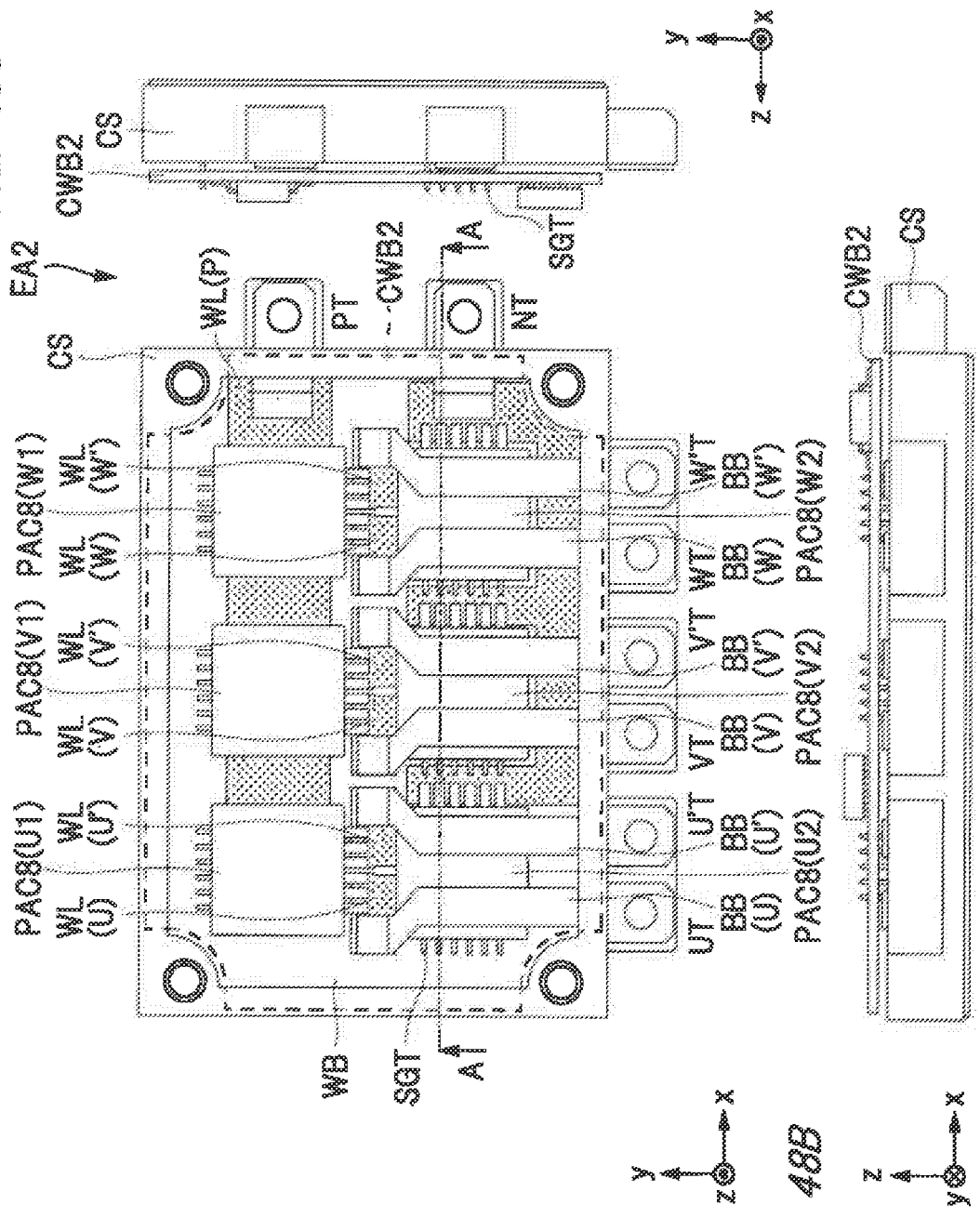
FIG. 48A is a plan view illustrating a configuration of the electronic apparatus of the modification.
FIG. 48B is a side view that is viewed from the lower side in FIG. 48A.
FIG. 48C is a side view that is viewed from the right side in FIG. 48B.
Figure 49:
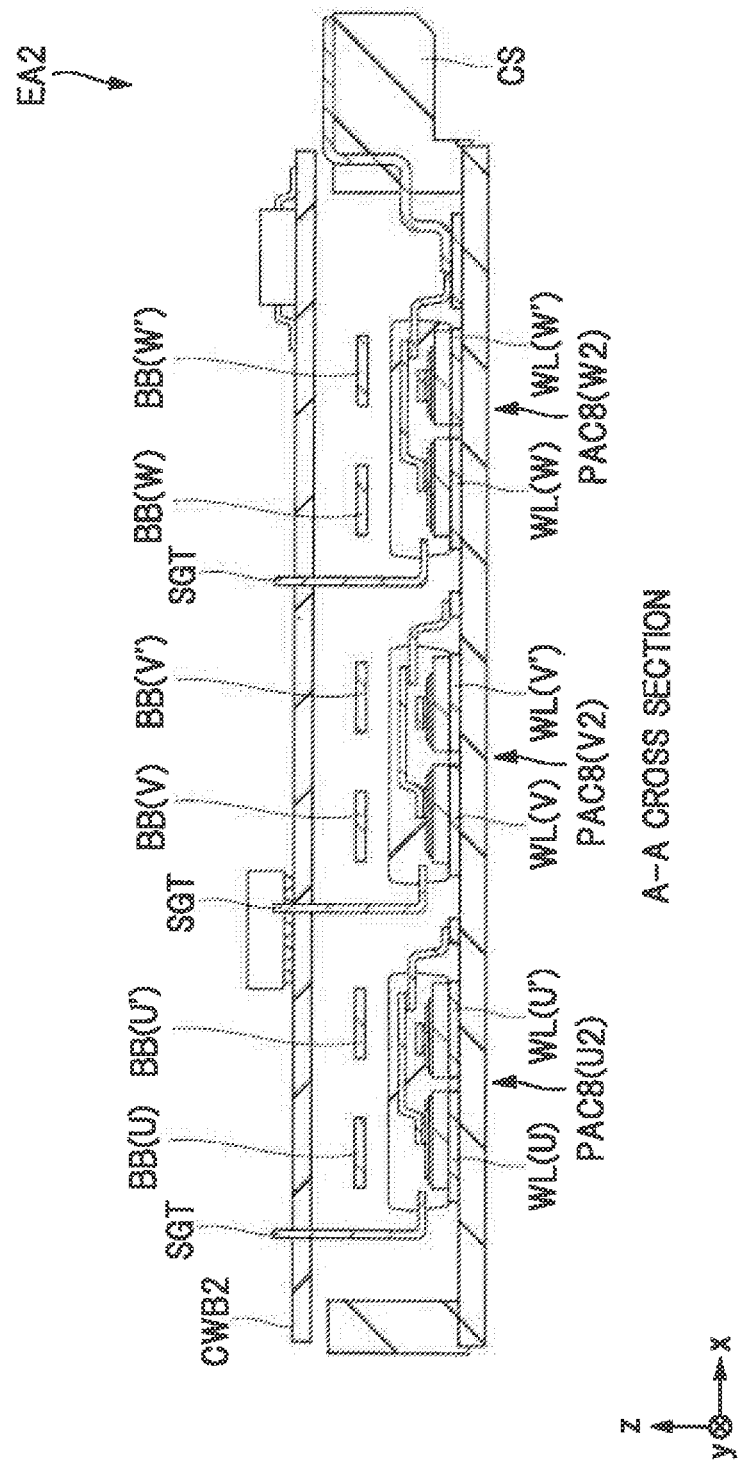
FIG. 49 is a cross-sectional view taken along a line A-A of FIG. 48A.

A mounting configuration of an electronic apparatus EA2 using the semiconductor device PAC8 of the present modification will be described below. FIGS. 48A to 48C are diagrams illustrating the mounting configuration of the electronic apparatus EA2 of the present modification. Particularly, FIG. 48A is a plan view illustrating a configuration of the electronic apparatus EA2 of the present modification, FIG. 48B is a side view that is viewed from the lower side in a sheet of FIGS. 48A to 48C, and FIG. 48C is a side view that is viewed from the right side in a sheet of FIGS. 48A to 48C. FIG. 49 is a cross-sectional view taken along a line A-A of FIG. 48A.

As illustrated in FIG. 48A, the electronic apparatus EA2 of the present modification includes a wiring board WB surrounded by a case CS, and six semiconductor devices PAC8(U1), PAC8(U2), PAC8(V1), PAC8(V2), PAC8(W1), and PAC8(W2) are mounted on the wiring board WB. When it is not particularly required to distinguish these six semiconductor devices PAC8(U1), PAC8(U2), PAC8(V1), PAC8 (V2), PAC8(W1), and PAC8(W2) from one another, note that they are collectively simply referred to as "semiconductor device PAC8" in some cases.

According to the electronic apparatus EA2 of the present modification, one side (one side surface) of the case is provided with a U terminal UT, a U' terminal U' T, a V terminal VT, a V' terminal V'T, a W terminal WT, and a W' terminal W'T, each of which is electrically connected to the bus bar BB. At this time, the bus bar BB is arranged so as to pass above the reference wiring WL(N).

Here, as illustrated in FIGS. 48B, 48C, and 49, in the semiconductor device PAC8 mounted on the electronic apparatus EA2 of the present modification, the signal terminals SGT are bent in the +z direction, and these bent signal terminals SGT are arranged so as to directly penetrate the control board CWB2. As a result, according to the electronic apparatus EA2 of the present modification, it is not required to provide the connection terminals CNT as different from the electronic apparatus EA1 of FIG. 42. Therefore, The electronic apparatus EA2 can be downsized by the fact that it is not required to secure the space for arranging the connection terminals CNT, and the cost of the electronic apparatus EA2 can be reduced by the fact that the connection terminals CNT serving as the members are not required.

Figure 50:
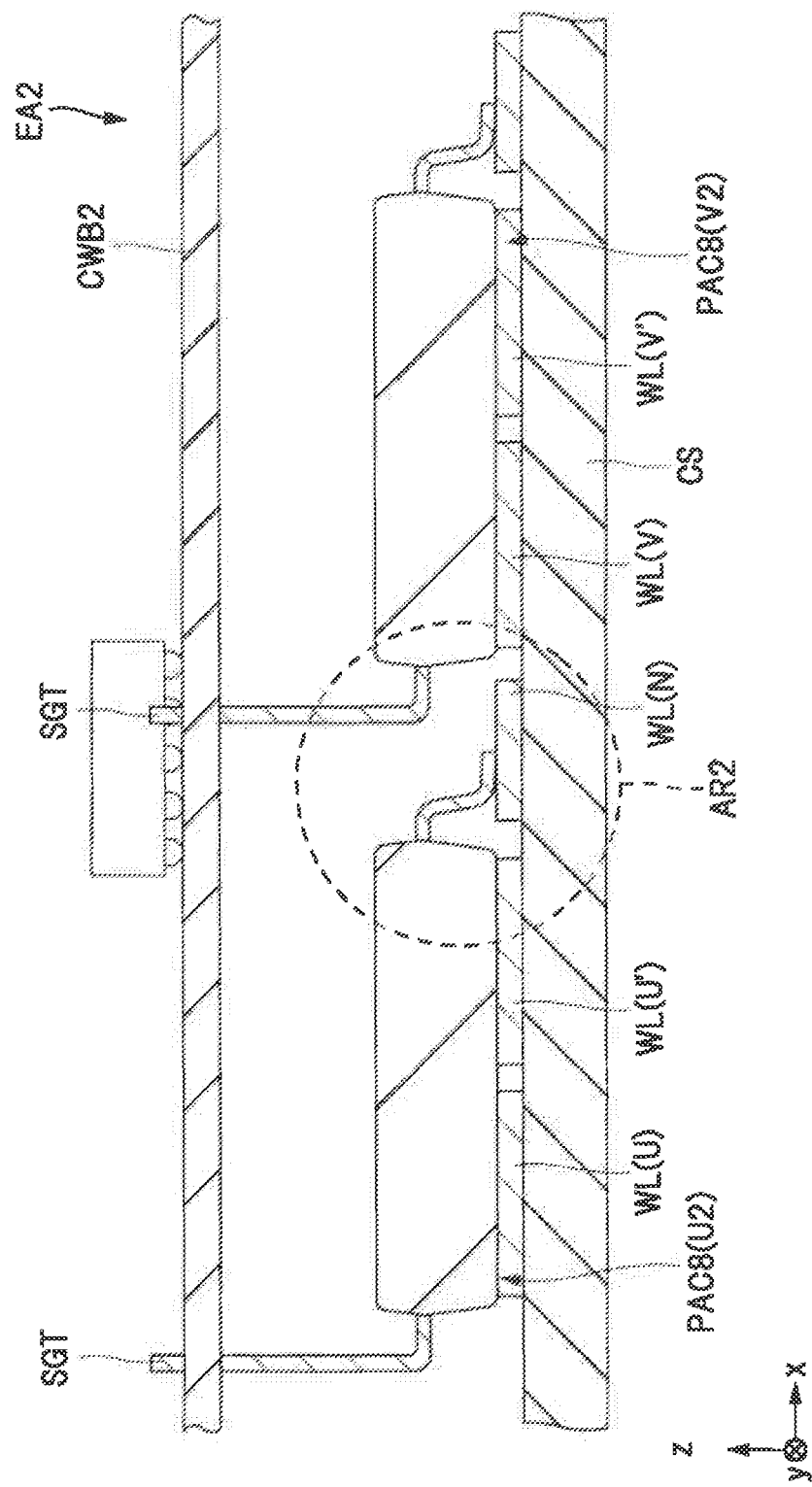
FIG. 50 is an enlarged schematic view of a part of FIG. 49.

For example, FIG. 50 is a schematic view illustrating an enlarged part of FIG. 49. In attention paid to an region AR2 of FIG. 50, the bent signal terminals SGT of the semiconductor device PAC8(V2) overlap the reference wiring WL(N) electrically connected to the semiconductor device PAC8(U2) in a plan view. In this manner, the electronic apparatus EA2 of the present modification can be downsized.

Second Embodiment

In the present second embodiment, a configuration example in which the lead frame and the chip mounting portion are mechanically joined to each other will be described. That is, the present second embodiment has a feature that the lead frame has a hanging lead, and that the chip mounting portion is mechanically joined to the hanging lead. Note that the hanging leads formed on the lead frame are cut when the semiconductor device is acquired by the cut of the lead frame, and therefore, the semiconductor device has the remains of the hanging leads after the cutting. In the present specification, the remains of the hanging leads after the cutting in the semiconductor device are referred to also as "hanging lead" for convenience of the expression.

Figure 51:
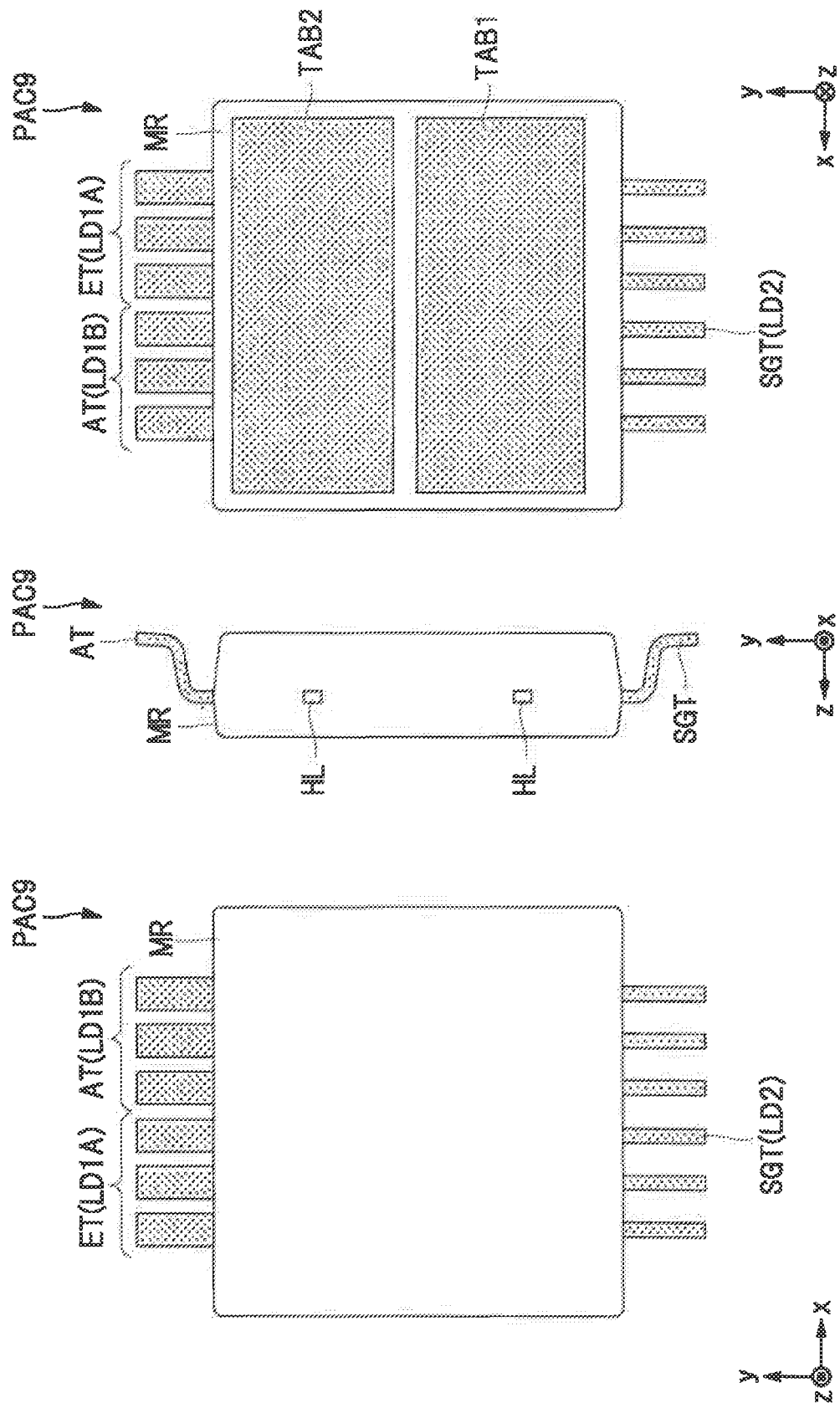
FIG. 51A is a plan view of a semiconductor device of a second embodiment that is viewed from its front surface.
FIG. 51B is a side view of the semiconductor device of the second embodiment that is viewed from its one side.
FIG. 51C is a plan view of the semiconductor device of the second embodiment that is viewed from its back surface.

FIGS. 51A to 51C are diagrams illustrating an outer appearance configuration of the semiconductor device PAC9 of the present second embodiment. Specifically, FIG. 51A is a plan view of the semiconductor device PAC9 of the present second embodiment that is viewed from its front surface (upper surface), FIG. 51B is a side view of the semiconductor device PAC9 of the present second embodiment that is viewed from its side surface, and FIG. 51C is a plan view of the semiconductor device PAC9 of the present second embodiment that is viewed from its back surface (lower surface).

As illustrated in FIG. 51B, according to the semiconductor device PAC9 of the present second embodiment, the cut surfaces of the hanging leads HL are exposed from a side surface of the sealing material MR.

Figure 52:
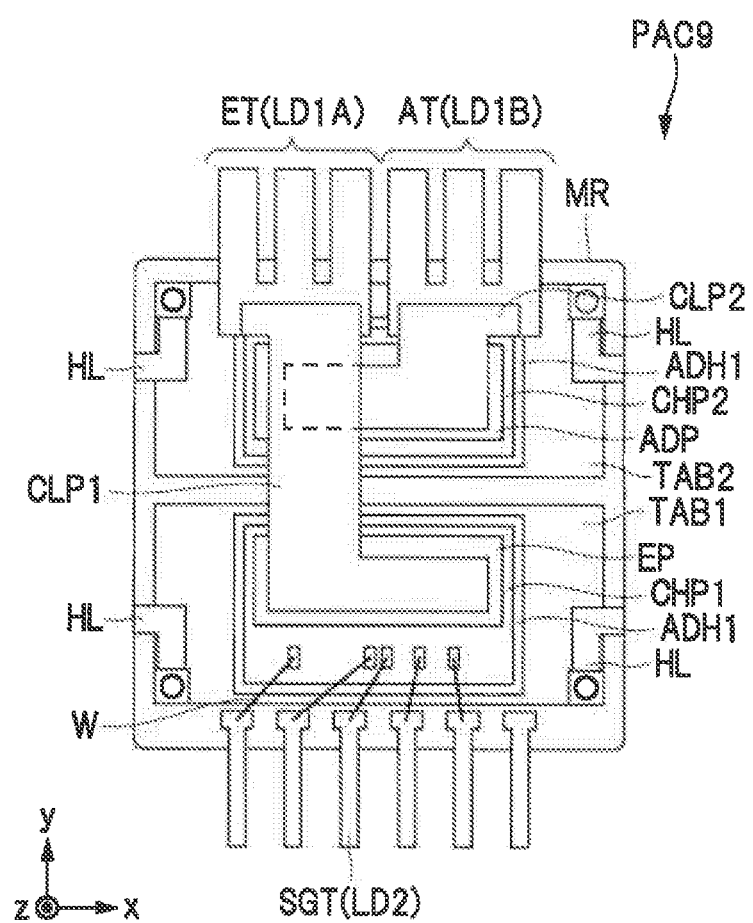
FIG. 52 is a diagram illustrating an internal structure of the semiconductor device of the second embodiment.

FIG. 52 is the internal structure of the semiconductor device PAC9 of the present second embodiment. As illustrated in FIG. 52, in the semiconductor device PAC9 of the present second embodiment, the hanging leads HL mechanically joined to the chip mounting portion TAB1 remain in the sealing material MR, and the hanging leads HL mechanically secured to the chip mounting portion TAB2 also remain in the sealing material MR. Note that other configurations of the semiconductor device PAC9 of the present second embodiment are the same as the configurations of the semiconductor device PAC1 of the first embodiment illustrated in FIG. 12A.

A method for manufacturing the semiconductor device PAC9 of the present second embodiment configured as described above will be described below with reference to drawings.

1. Base Material (Lead Frame) Preparation Process

Figure 53:
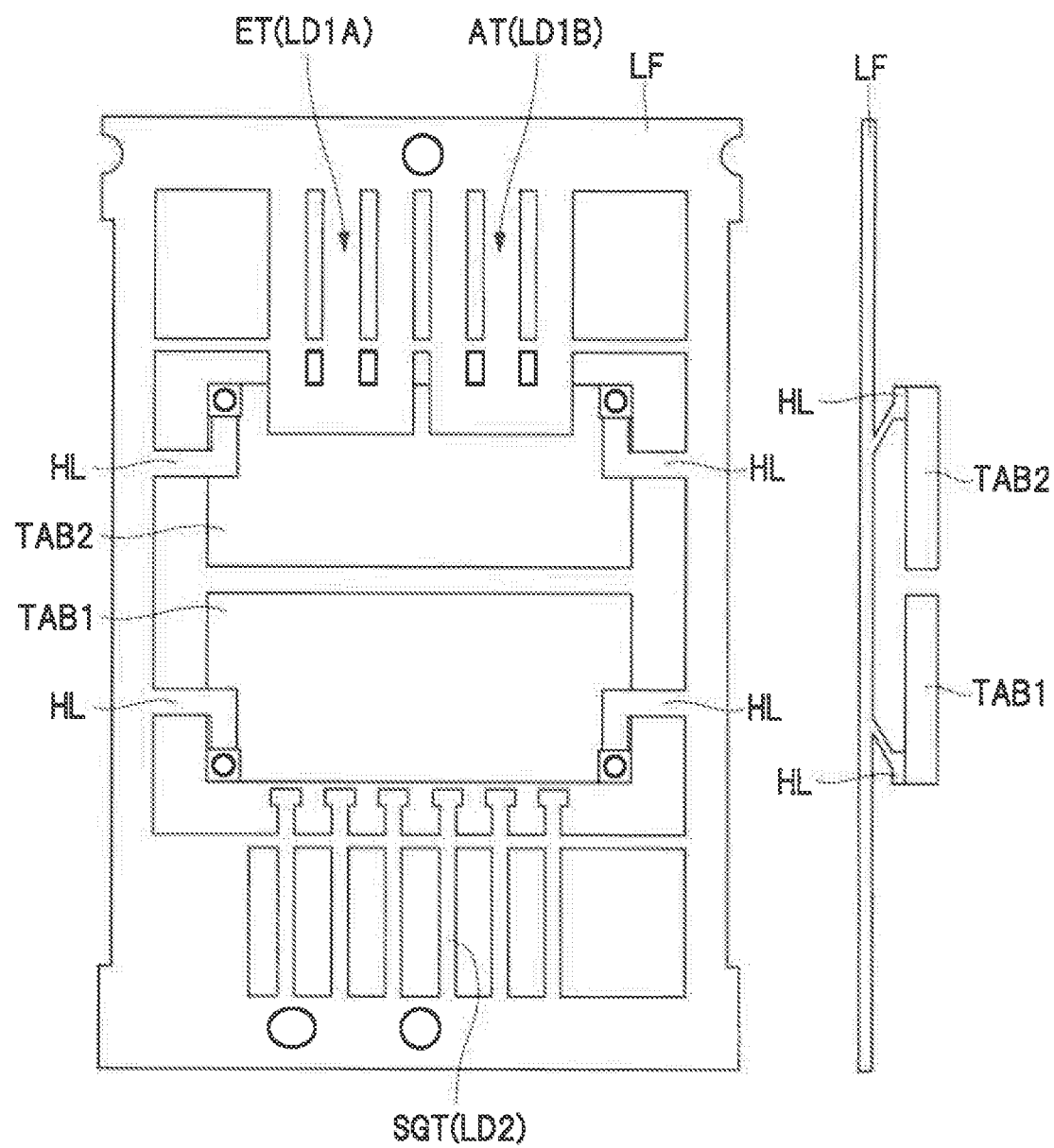
FIG. 53 is a diagram illustrating a manufacturing process for the semiconductor device, continued from FIG. 53.

First, as illustrated in FIG. 53, the lead frame LF, the chip mounting portion TAB1, and the chip mounting portion TAB2 are prepared. At this time, according to the present second embodiment, the lead frame LF is mechanically joined to the chip mounting portion TAB1 by the hanging lead HL, and the lead frame LF is also mechanically joined to the chip mounting portion TAB2 by the hanging lead HL. That is, according to the present second embodiment, the lead frame LF having the lead LD1A, the lead LD1B, and the plurality of hanging leads HL is prepared. Specifically, the lead frame LF is prepared so that the chip mounting portion TAB2 is arranged between the lead LD1A and the chip mounting portion TAB1, so that the chip mounting portion TAB2 is arranged between the lead LD1B and the chip mounting portion TAB1, and so that the chip mounting portion TAB1 and chip mounting portion TAB2 are connected to the plurality of hanging leads HL of the lead frame LF, respectively.

In this manner, according to the present second embodiment, the lead frame LF is prepared so as to be connected to the chip mounting portion TAB1 by the hanging lead HL and so as to be connected to the chip mounting portion TAB2 by the hanging lead HL. Therefore, in the present second embodiment, it is not required to use a positional alignment jig for the positioning between the lead frame LF and the chip mounting portion TAB1 and the positioning between the lead frame LF and the chip mounting portion TAB2, so that the present second embodiment can obtain an advantage which does not require the positional alignment. Note that the thickness of the chip mounting portion TAB1 and the thickness of the chip mounting portion TAB2 are larger than the thickness of the lead frame LF. That is, according to the present second embodiment, the thickness of the lead frame LF is different from the thickness of the chip mounting portion TAB1 and the thickness of the chip mounting portion TAB2. Therefore, the chip mounting portion TAB1 and chip mounting portion TAB2 are not formed integrally with the lead frame LF but formed separately from the lead frame LF. However, according to the present second embodiment, handling in a manufacturing process is facilitated by mechanically joining the lead frame to the chip mounting portion TAB1 and the chip mounting portion TAB2, which are separately formed.

2. Chip Mounting Process

Figure 54:
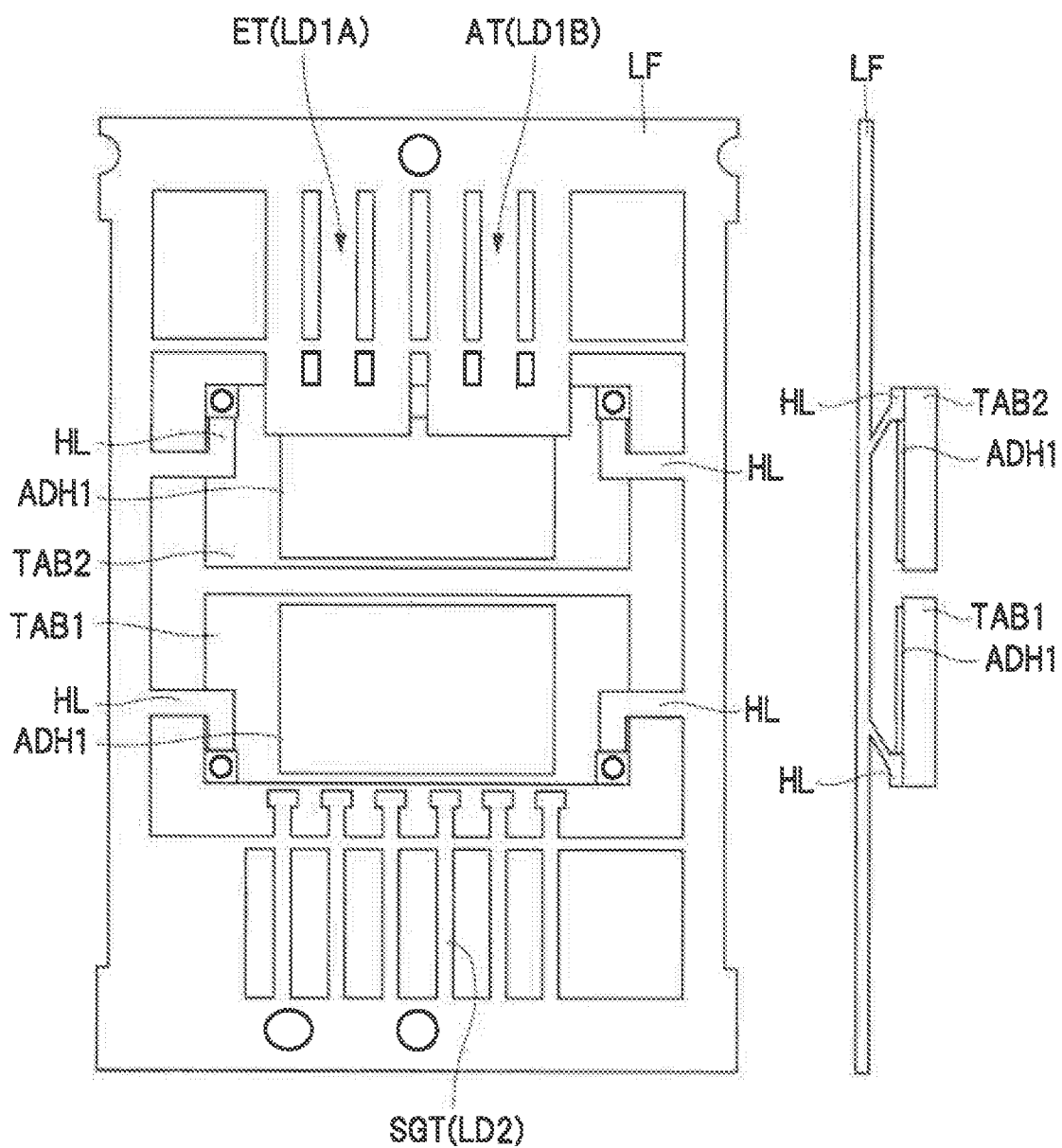
FIG. 54 is a diagram illustrating a manufacturing process for the semiconductor device, continued from FIG. 53.

Next, as illustrated in FIG. 54, the conductive adhesive ADH1 is applied onto the chip mounting portion TAB1, and the conductive adhesive ADH1 is applied also onto the chip mounting portion TAB2. As the conductive adhesive ADH1, for example, silver paste, solder with a high melting point, etc., can be used.

Figure 55:
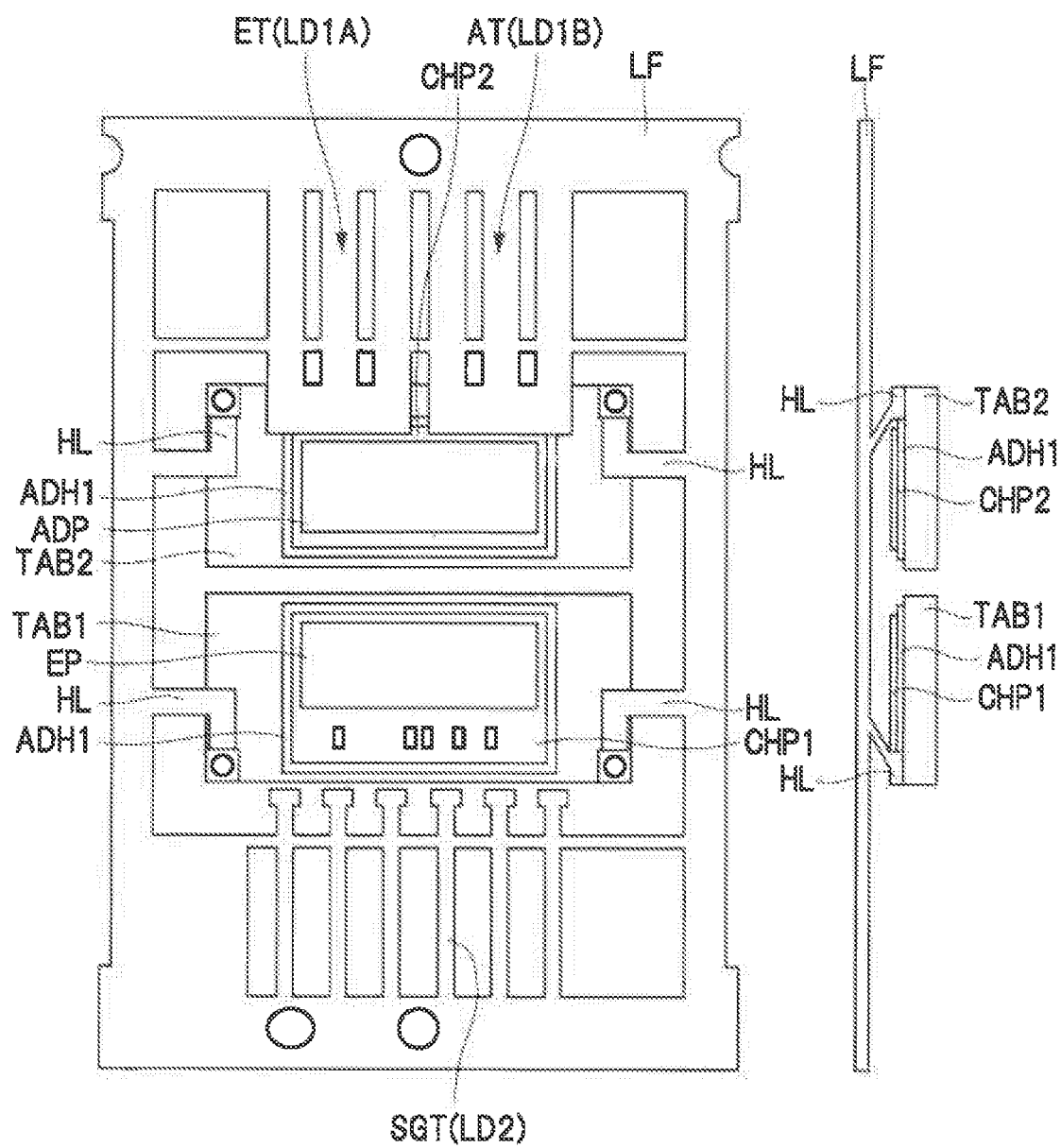
FIG. 55 is a diagram illustrating a manufacturing process for the semiconductor device, continued from FIG. 54.

Subsequently, as illustrated in FIG. 55, the semiconductor chip CHP1 having the IGBT is mounted on the chip mounting portion TAB1, while the semiconductor chip CHP2 having the diode is mounted on the chip mounting portion TAB2. Specifically, the semiconductor chip CHP1 is mounted on the chip mounting portion TAB1, the semiconductor chip CHP1 having the IGBT, a first front surface on which the emitter electrode pad EP is formed, and a first back surface on which the collector electrode is formed and which is opposite to the first front surface, and the chip mounting portion TAB1 is electrically connected to the first back surface of the semiconductor chip CHP1. Similarly, the semiconductor chip CHP2 is mounted on the chip mounting portion TAB2, the semiconductor chip CHP2 having the diode, a second front surface on which the anode electrode pad ADP is formed, and a second back surface on which the cathode electrode is formed and which is opposite to the second front surface, and the chip mounting portion TAB2 is electrically connected to the second back surface of the semiconductor chip CHP2.

In this manner, the semiconductor chip CHP2 having the diode is arranged so that the cathode electrode pad formed on the back surface of the semiconductor chip CHP2 is in contact with the chip mounting portion TAB2 via the conductive adhesive AHD1. As a result, the anode electrode pad ADP formed on the front surface of the semiconductor chip CHP2 is oriented upward.

On the other hand, the semiconductor chip CHP1 having the IGBT is arranged so that the collector electrode pad formed on the back surface of the semiconductor chip CHP1 is in contact with the chip mounting portion TAB1 via the conductive adhesive AHD1.

All of the emitter electrode pad EP and the plurality of electrode pads such as the gate electrode pad GP, the temperature detecting electrode pad TCP, the temperature detecting electrode pad TAP, the current detecting electrode pad SEP, and the Kelvin detecting electrode pad KP, which are formed on the front surface 16 of the semiconductor chip CHP2, are oriented upward.

As the mounting order of the semiconductor chip CHP1 having the IGBT and the semiconductor chip CHP2 having the diode, the semiconductor chip CHP1 may be mounted first, and then, the semiconductor chip CHP2 may be mounted later. Alternatively, the semiconductor chip CHP2 may be mounted first, and then, the semiconductor chip CHP1 may be mounted later.

Then, a heat treatment is performed to the chip mounting portion TAB1 on which the semiconductor chip CHP1 is mounted and the chip mounting portion TAB2 on which the semiconductor chip CHP2 is mounted.

3. Electrical Connection Process

Figure 56:
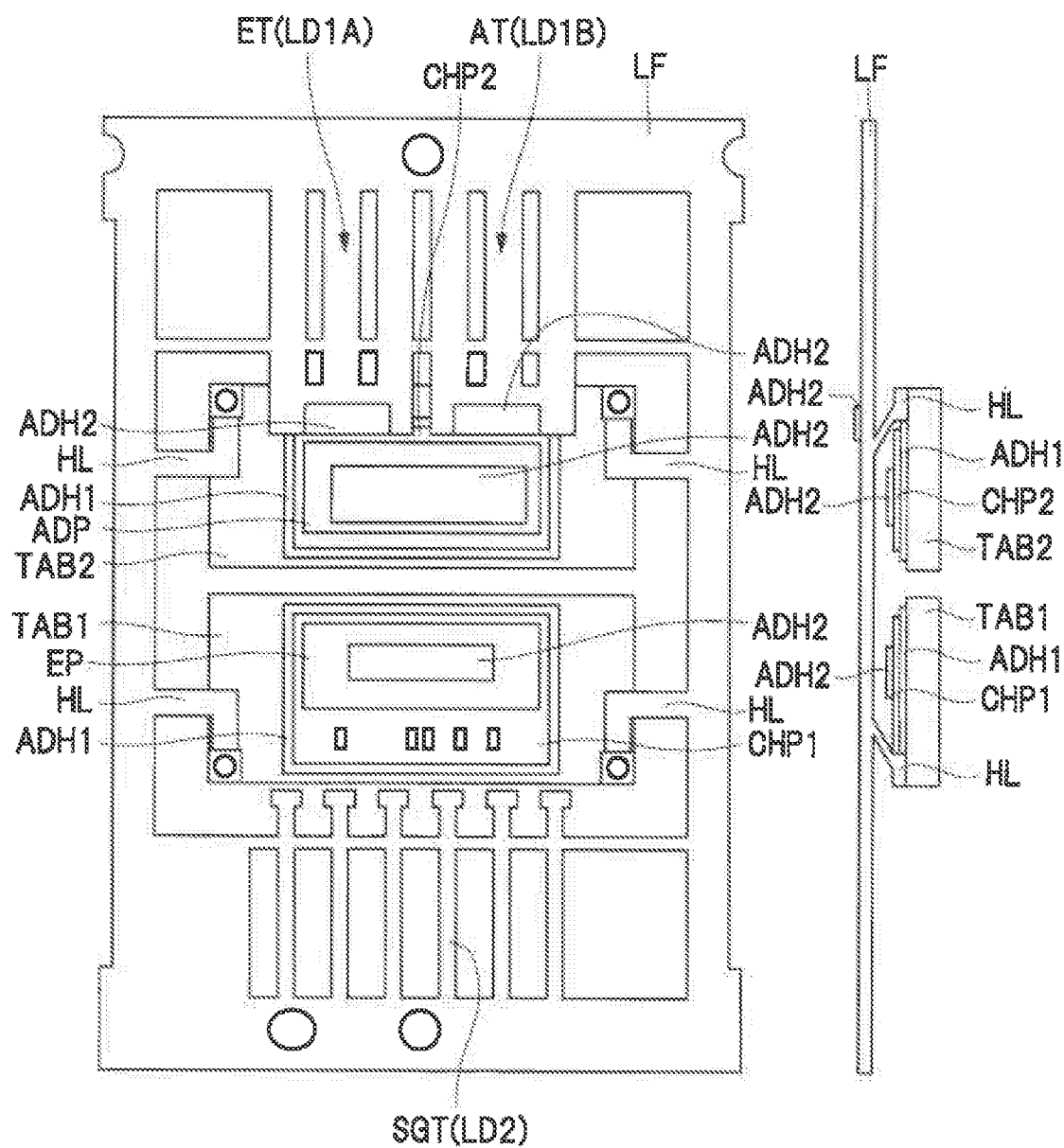
FIG. 56 is a diagram illustrating a manufacturing process for the semiconductor device, continued from FIG. 55.

Subsequently, as illustrated in FIG. 56, the conductive adhesive ADH2 is applied onto the anode electrode pad ADP of the semiconductor chip CHP2 and also onto the emitter electrode pad EP of the semiconductor chip CHP1. The conductive adhesive ADH2 is applied also onto a partial region of the leads LD1A and onto a partial region of the leads LD1B.

Also as the conductive adhesive ADH2, silver paste, solder with a high melting point, etc., can be used. The conductive adhesive ADH2 may be made of the same material as that of the conductive adhesive ADH1, or a different material therefrom.

Figure 57:
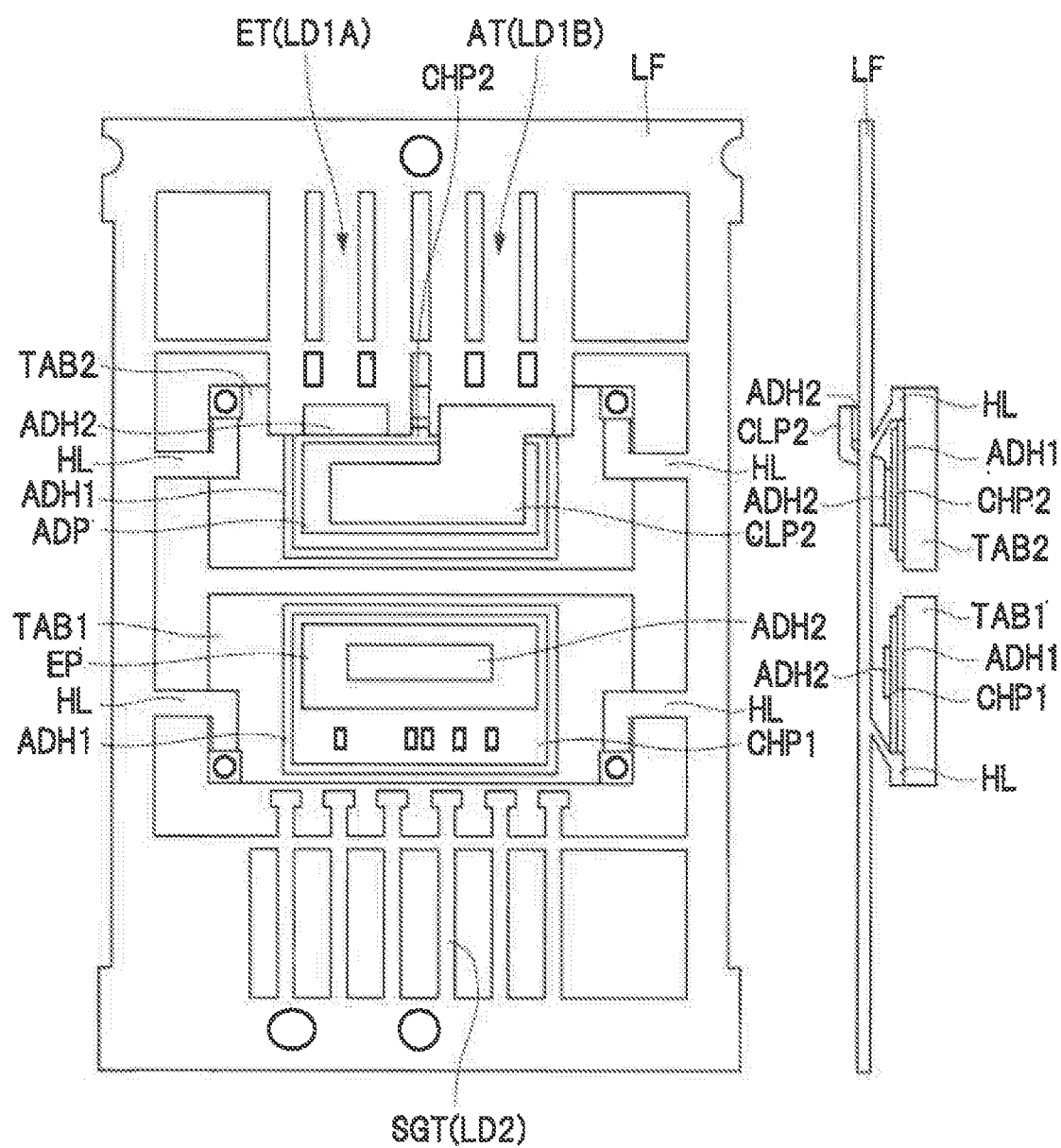
FIG. 57 is a diagram illustrating a manufacturing process for the semiconductor device, continued from FIG. 56.
Figure 58:
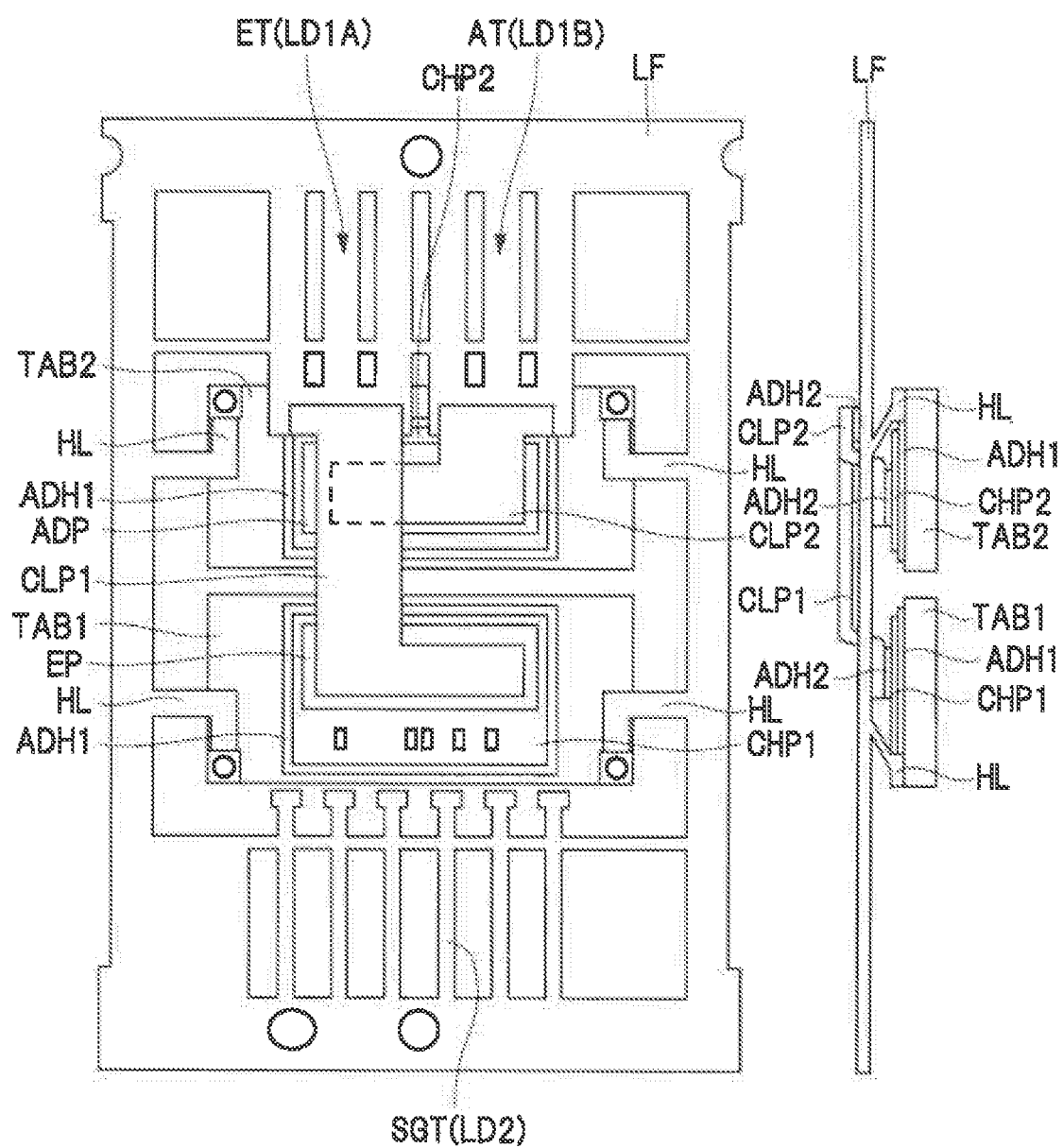
FIG. 58 is a diagram illustrating a manufacturing process for the semiconductor device, continued from FIG. 57.

Then, the leads LD1A are electrically connected to the semiconductor chip CHP1, while the leads LD1B are electrically connected to the semiconductor chip CHP2. Specifically, first, as illustrated in FIG. 57, the clip CLP2 is mounted on the anode electrode pad ADP of the semiconductor chip CHP2 and the leads LD1B, so that the anode electrode pad ADP is electrically connected to the leads LD1B. Then, as illustrated in FIG. 58, the clip CLP1 is mounted on the emitter electrode pad EP of the semiconductor chip CHP1 and the leads LD1A, so that the emitter electrode pad EP is electrically connected to the leads LD1A. At this time, as illustrated in FIG. 58, the clip CLP1 is mounted so that the clip CLP1 passes above a part of the clip CLP2. Then, a heat treatment is performed to the lead frame LF connected to the chip mounting portion TAB1 by the hanging lead HL and connected to the chip mounting portion TAB2 by the hanging lead HL.

Figure 59:
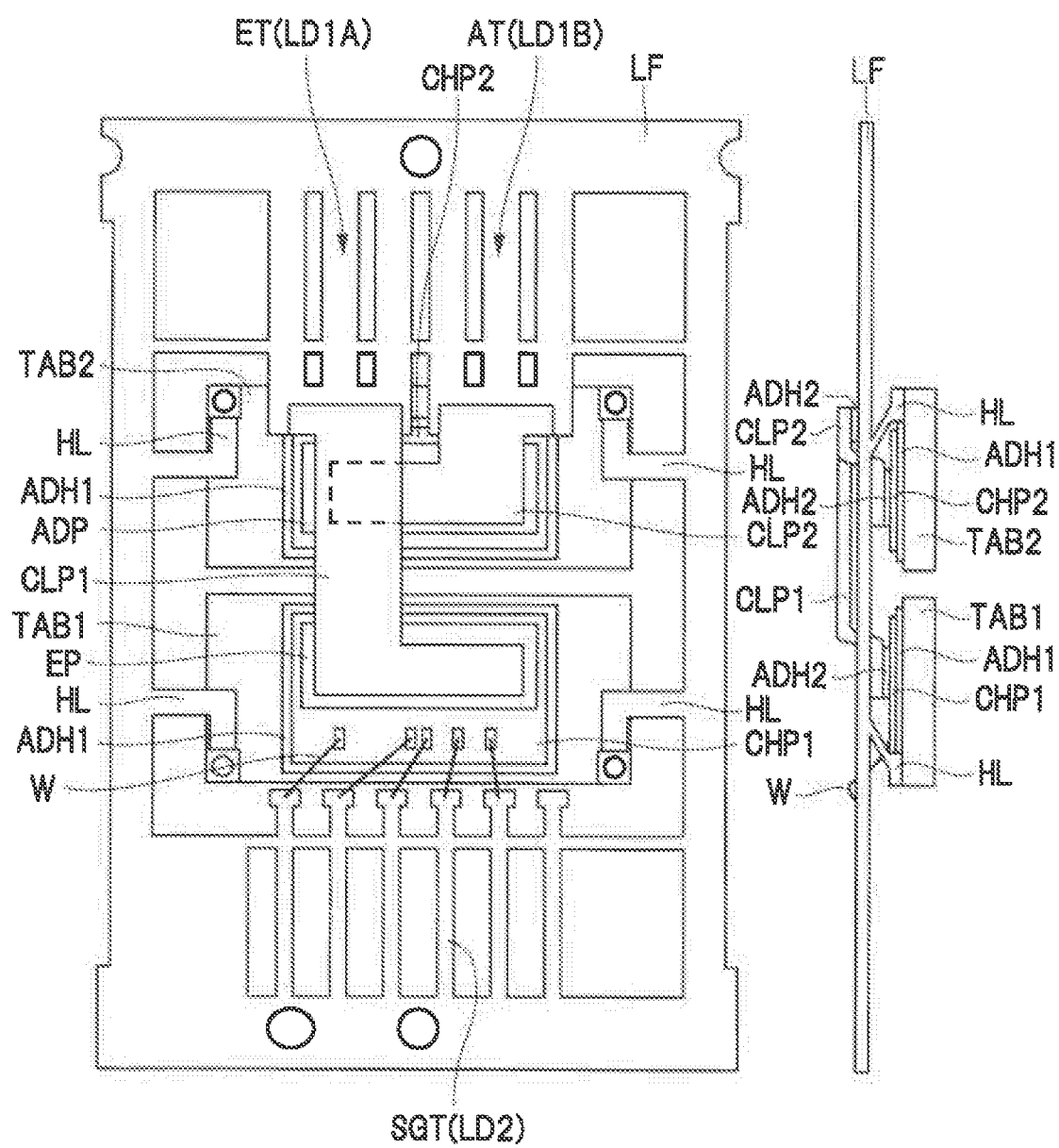
FIG. 59 is a diagram illustrating a manufacturing process for the semiconductor device, continued from FIG. 58.

Next, as illustrated in FIG. 59, a wire bonding process is performed. For example, as illustrated in FIG. 59, a lead LD2 is electrically connected to a gate electrode pad GP by a wire W, and a lead LD2 is electrically connected to a temperature detecting electrode pad by a wire W. And, a lead LD2 is electrically connected to a temperature detecting electrode pad by a wire W, and a lead LD2 is electrically connected to a current detecting electrode pad by a wire W. Further, a lead LD2 is electrically connected to a Kelvin detecting electrode pad KP by a wire W. Here, according to the present second embodiment, the leads LD2 are arranged so as to be opposite to the leads LD1A to which the clip CLP1 is connected and to the leads LD1B to which the clip CLP2 is connected, and therefore, the wire bonding process can be performed without taking account of interference among the wires W, the clip CLP1, and the clip CLP2.

4. Sealing (Molding) Process

Figure 60:
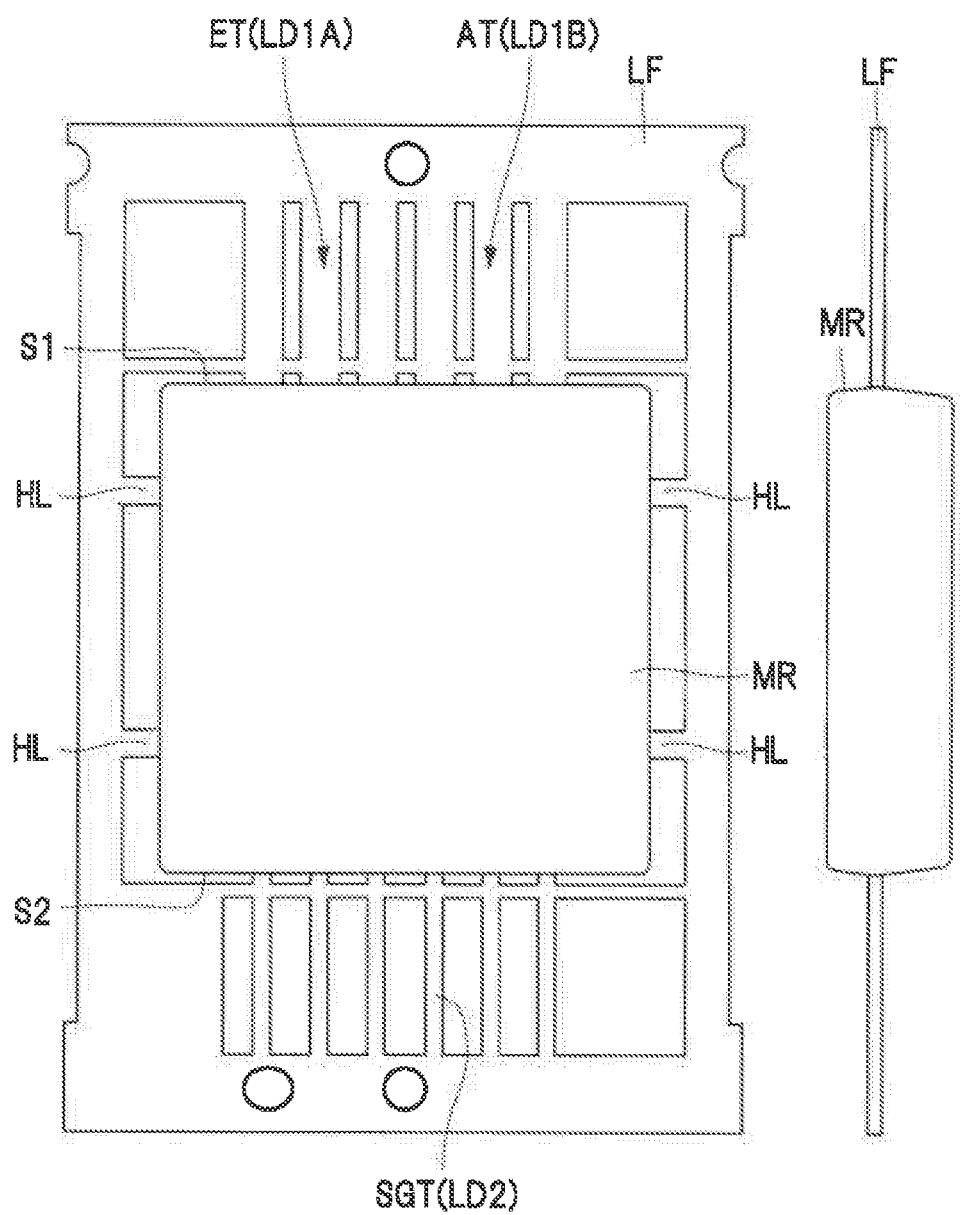
FIG. 60 is a diagram illustrating a manufacturing process for the semiconductor device, continued from FIG. 59.

Next, as illustrated in FIG. 60, a sealing material MR is formed by sealing the semiconductor chip CHP1, the semiconductor chip CHP2, a part of the chip mounting portion TAB1, a part of the chip mounting portion TAB2, a part of the lead LD1A, a part of the lead LD1B, a part of each of the plurality of leads LD2, the clip CLP1, the clip CLP2, and the wire W.

At this time, the sealing material MR has an upper surface, a lower surface opposite to the upper surface, a first side surface located between the upper surface and the lower surface in the thickness direction of the sealing material MR, and a second side surface opposite to the first side surface. FIG. 60 illustrates the side S1 along the first side surface and the side S2 along the second side surface. In the sealing material MR, the leads LD1A and LD1B protrude from the first side surface (side S1) of the sealing material MR, and the plurality of leads LD2 protrude from the second side surface (side S2) of the sealing material MR.

Although not illustrated in FIG. 60, note that a lower surface of the chip mounting portion TAB1 and a lower surface of the chip mounting portion TAB2 are exposed from the lower surface of the above-described sealing material MR.

5. Exterior Plating Process

Figure 61:
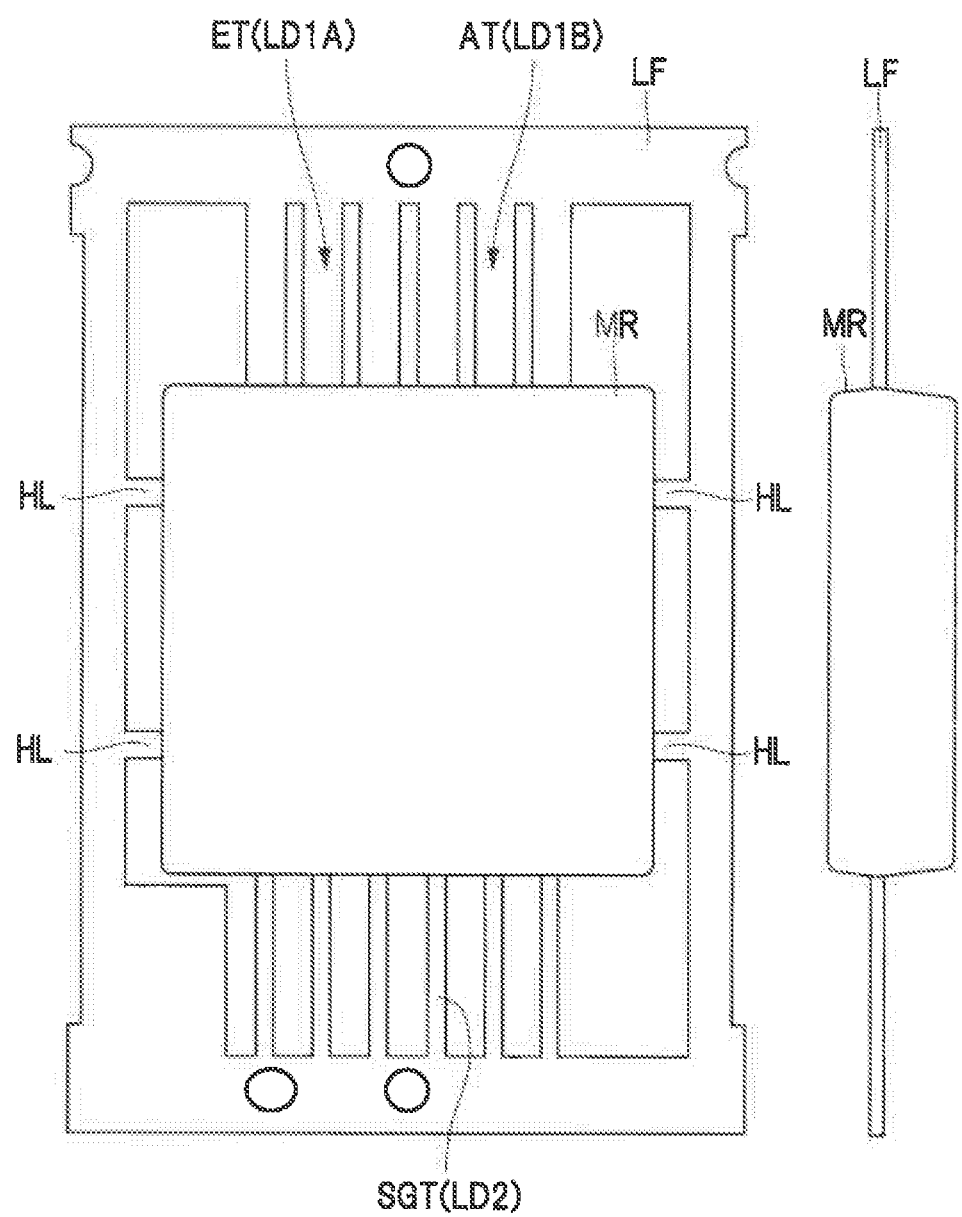
FIG. 61 is a diagram illustrating a manufacturing process for the semiconductor device, continued from FIG. 60.
Figure 62:
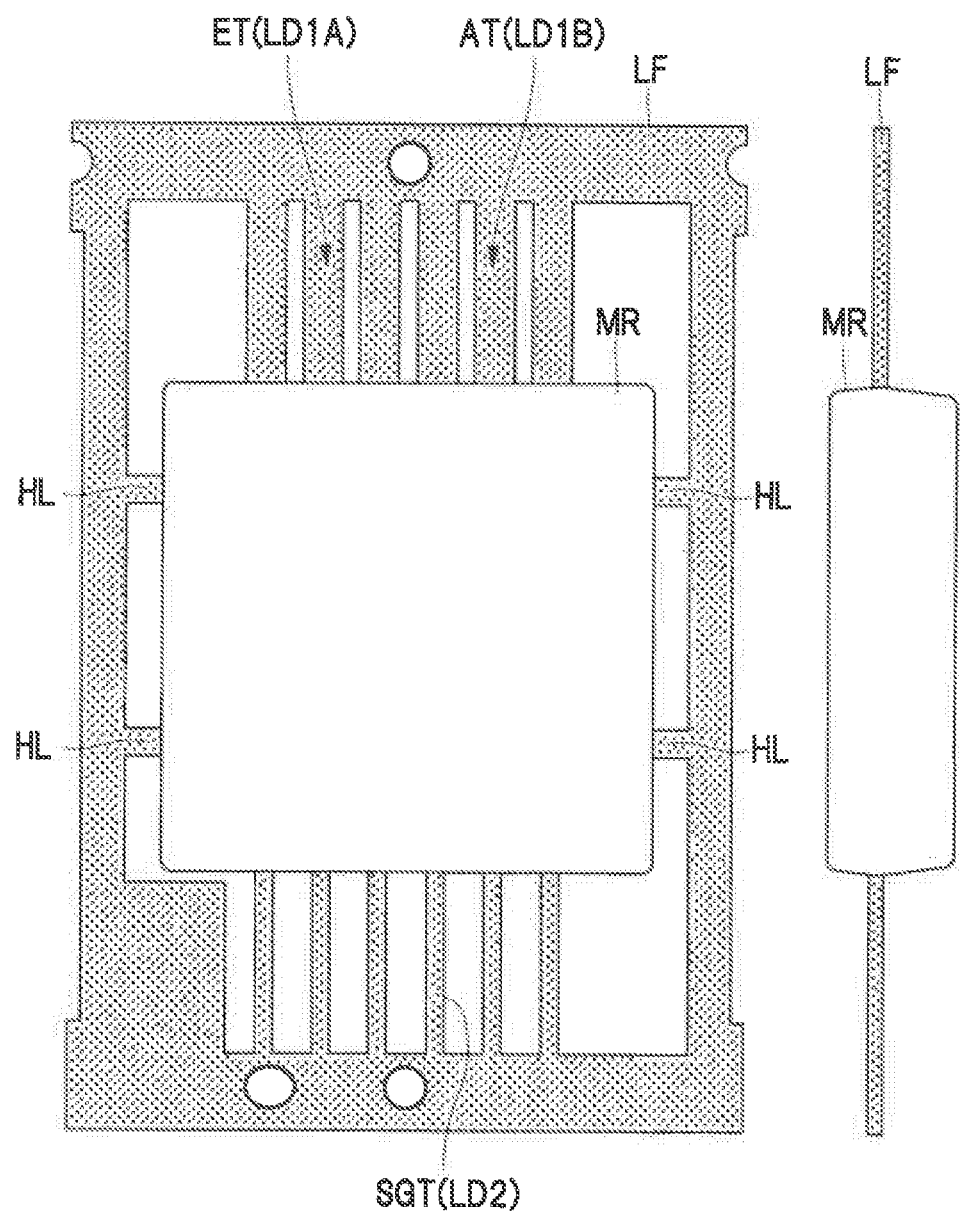
FIG. 62 is a diagram illustrating a manufacturing process for the semiconductor device, continued from FIG. 61.

Then, as illustrated in FIG. 61, a tie bar attached to the lead frame LF is cut. And, as illustrated in FIG. 62, a plating layer (tin film), which is a conductive film, is formed on the chip mounting portions TAB1 and TAB2, on the surface of a part of the lead LD1A, on the surface of a part of the lead LD1B, and on the surface of a part of the lead LD2, which are exposed from the lower surface of the sealing material MR. That is, the plating layer is formed on the exposed parts of the leads LD1A and LD1B from the sealing material MR, on the exposed parts of the plurality of leads LD2 from the sealing material MR, and on the lower surfaces of the chip mounting portions TAB1 and TAB2.

6. Marking Process

Then, information (a mark) indicating a product name and a model number is formed on the front surface of the sealing material MR made of resin. As a method for making the mark, note that a printing method by a printing system or a stamping method by irradiating the front surface of the sealing material with laser can be used.

7. Piece Making Process

Subsequently, the lead LD1A, the lead LD1B, and the plurality of leads LD2 are separated from the lead frame LF by cutting a part of the lead LD1A, a part of the lead LD1B, and a part of each of the plurality of leads LD2. At this time, the hanging lead HL that connects the lead frame LF and the chip mounting portion TAB1 and the hanging lead HL that connects the lead frame LF and the chip mounting portion TAB2 are also cut. In this manner, as illustrated in FIGS. 51A to 51C, the semiconductor device PAC9 of the present second embodiment can be manufactured.

At this time, as illustrated in FIG. 51B, the cut surfaces of the hanging leads HL are exposed from the side surface of the sealing material MR. In the method for manufacturing the semiconductor device PAC9 of the present second embodiment, this exposure indicates the fact that the lead frame LF and the chip mounting portion TAB1 are joined to each other by the hanging lead HLD and that the lead frame LF and the chip mounting portion TAB2 are joined to each other by the hanging lead HLD. Of course, inside the sealing material MR, as illustrated in FIG. 52, a corner of the chip mounting portion TAB1 has remains of mechanical joint between the hanging lead HL to the chip mounting portion TAB1, and a corner of the chip mounting portion TAB2 has remains of mechanical joint between the hanging lead HL and the chip mounting portion TAB2. Then, the lead LD1A, lead LD1B, and each of the plurality of leads LD2 is formed. And, for example, after a test process of testing the electric characteristics are performed, the semiconductor device PAC9 that has been determined to be non-defective is shipped out.

In the foregoing, the invention made by the present inventors has been concretely described based on the embodiments. However, it is needless to say that the present invention is not limited to the foregoing embodiments and various modifications and alterations can be made within the scope of the present invention.

The embodiments described above include aspects described below.

(Additional Note 1)

A semiconductor device includes: (a) a first semiconductor chip having an insulated gate bipolar transistor, a first front surface in which an emitter electrode pad is formed, and a first back surface in which a collector electrode is formed and which is a surface opposite to the first front surface; (b) a second semiconductor chip having a diode, a second front surface in which an anode electrode pad is formed, and a second back surface in which a cathode electrode is formed and which is a surface opposite to the second front surface; (c) a first chip mounting portion having a first upper surface on which the first semiconductor chip is mounted and which is electrically connected to the first back surface of the first semiconductor chip, and a first lower surface which is a surface opposite to the first upper surface; (d) a second chip mounting portion having a second upper surface on which the second semiconductor chip is mounted and which is electrically connected to the second back surface of the second semiconductor chip, and a second lower surface which is a surface opposite to the second upper surface; (e) a first lead electrically connected to the emitter electrode pad of the first semiconductor chip via a first conductive member; (f) a second lead electrically connected to the anode electrode pad of the second semiconductor chip via a second conductive member; and (g) a sealing material having a first main surface which has a first side and a second side opposite to the first side, and a second main surface which is a surface opposite to the first main surface, the sealing material sealing the first semiconductor chip, the second semiconductor chip, a part of the first chip mounting portion, a part of the second chip mounting portion, a part of the first lead, and a part of the second lead. The first lower surface of the first chip mounting portion and the second lower surface of the second chip mounting portion are exposed from the second main surface of the sealing material, the first lead and the second lead are arranged so as to line along the first side of the sealing material extending in a first direction in a plan view, the first chip mounting portion is separated from the second chip mounting portion, and the first conductive member is separated from the second conductive member.

(Additional Note 2) (PKG Example 1 (Division into a Plurality of Portions))

In the semiconductor device described in Additional Note 1, the first lead has a first portion sealed with the sealing material and a second portion exposed from the sealing material, the second lead has a third portion sealed with the sealing material and a fourth portion exposed from the sealing material, the second portion of the first lead is divided into a plurality of portions by formation of first slits, and the fourth portion of the second lead is divided into a plurality of portions by formation of second slits.

(Additional Note 3) (PKG Modification 2 (the Distance Between Different Leads is Large): A Breakdown Voltage is Ensured)

In the semiconductor device described in Additional Note 1, the first lead has a first portion sealed with the sealing material and a second portion exposed from the sealing material, the second lead has a third portion sealed with the sealing material and a fourth portion exposed from the sealing material, a distance of the furthest part between the second portion of the first lead and the fourth portion of the second lead is larger than a distance of the closest part between the first portion of the first lead and the third portion of the second lead in a plan view.

(Additional Note 4) (PKG Modification 3 (an Opening Essential to a Large Lead for Handing a Large Current))

In the semiconductor device described in Additional Note 1, an opening is formed in each of the first lead and the second lead, and the opening is filled with a part of the sealing material.

(Additional Note 5) (PKG Modification 6 (an Opening is Formed in a Chip Mounting Portion): Prevention of Pulling Out)

In the semiconductor device described in Additional Note 1, an opening is formed in each of a part of the first chip mounting portion which does not overlap the first semiconductor chip and in a part of the second chip mounting portion which does not overlap the second semiconductor chip in a plan view, and the opening is filled with a part of the sealing material.

(Additional Note 6) (PKG Modification 7 (a Chip Mounting Portion is Protruded): Improvement in Contact Property)

In the semiconductor device described in Additional Note 1, the second chip mounting portion is arranged between the first side of the sealing material and the first chip mounting portion in a plan view, a plurality of control electrode pads including a gate electrode pad which is arranged between the second side of the sealing material and the emitter electrode pad in a plan view are formed on the first front surface of the first semiconductor chip. The semiconductor device further includes: a plurality of third leads arranged so as to line along the second side of the sealing material; and a plurality of third conductive members electrically connected to the plurality of control electrode pads and the plurality of third leads, respectively, the first main surface of the sealing material includes: a third side extending in a second direction intersecting with the first direction; and a fourth side opposite to the third side, no lead is arranged along the third side and the fourth side of the sealing material, the sealing material includes: a third side surface sharing the third side with the first main surface; and a fourth side surface sharing the fourth side with the first main surface, and a part of the first chip mounting portion and a part of the second chip mounting portion protrude from the third side surface and the fourth side surface of the sealing material.

(Additional Note 7) (Manufacturing Method) (Example 1 (without Fixing))

A method for manufacturing a semiconductor device includes: (a) a step of preparing a first chip mounting portion and a second chip mounting portion; (b) a step of mounting a first semiconductor chip on the first chip mounting portion, the first semiconductor chip having a first front surface which has an insulated gate bipolar transistor and in which an emitter electrode pad is formed and a first back surface in which a collector electrode is formed and which is a surface opposite to the first front surface, to electrically connect the first chip mounting portion to the first back surface of the first semiconductor chip; (c) a step of mounting a second semiconductor chip on the second chip mounting portion, the second semiconductor chip having a second front surface which has a diode and in which an anode electrode pad is formed and a second back surface in which a cathode electrode is formed and which is a surface opposite to the second front surface, to electrically connect the second chip mounting portion to the second back surface of the second semiconductor chip; (d) a step of preparing a lead frame having a first lead and a second lead and arranging the first chip mounting portion, the second chip mounting portion, and the lead frame so that the second chip mounting portion is arranged between the first lead and the first chip mounting portion and between the second lead and the first chip mounting portion; (e) a step of electrically connecting the first lead to the first semiconductor chip and electrically connecting the second lead to the second semiconductor chip; and (f) after the step (e), a step of sealing a part of the first chip mounting portion, a part of the second chip mounting portion, the first semiconductor chip, the second semiconductor chip, a part of the first lead, and a part of the second lead, to form a sealing material. The step (e) includes: (e1) a step of mounting a second conductive member on the anode electrode pad of the second semiconductor chip and on the second lead, to electrically connect the anode electrode pad to the second lead; and (e2) after the step (e1), a step of mounting a first conductive member on the emitter electrode pad of the first semiconductor chip and on the first lead, to electrically connect the emitter electrode pad to the first lead. At the step (e2), the first conductive member is mounted so that the first conductive member passes above a part of the second conductive member.

(Additional Note 8) (Manufacturing Method) (Example 2 (with Fixing))

A method for manufacturing a semiconductor device includes: (a) a step of preparing a lead frame having a first lead, a second lead, and a plurality of hanging leads, the lead frame being structured so that a second chip mounting portion is arranged between the first lead and a first chip mounting portion and between the second lead and the first chip mounting portion, and so that the first chip mounting portion and the second chip mounting portion are connected to the plurality of hanging leads of the lead frame, respectively; (b) a step of mounting a first semiconductor chip on the first chip mounting portion, the first semiconductor chip having a first front surface which has an insulated gate bipolar transistor and in which an emitter electrode pad is formed and a first back surface in which a collector electrode is formed and which is a surface opposite to the first front surface, to electrically connect the first chip mounting portion to the first back surface of the first semiconductor chip; (c) a step of mounting a second semiconductor chip on the second chip mounting portion, the second semiconductor chip having a second front surface which has a diode and in which an anode electrode pad is formed and a second back surface in which a cathode electrode is formed and which is a surface opposite to the second front surface, to electrically connect the second chip mounting portion to the second back surface of the second semiconductor chip; (d) a step of electrically connecting the first lead to the first semiconductor chip and electrically connecting the second lead to the second semiconductor chip; and (e) after the step (d), a step of sealing a part of the first chip mounting portion, a part of the second chip mounting portion, the first semiconductor chip, the second semiconductor chip, a part of the first lead, a part of the second lead, and a part of each of the plurality of hanging leads, to form a sealing material. The step (d) includes: (d1) a step of mounting a second conductive member on the anode electrode pad of the second semiconductor chip and on the second lead, to electrically connect the anode electrode pad to the second lead; and (d2) after the step (d1), a step of mounting a first conductive member on the emitter electrode pad of the first semiconductor chip and on the first lead, to electrically connect the emitter electrode pad to the first lead. At the step (d2), the first conductive member is mounted so that the first conductive member passes above a part of the second conductive member.

EXPLANATION OF REFERENCE CHARACTERS

ADP anode electrode pad
CHP1 semiconductor chip
CHP2 semiconductor chip
CLP1 clip
CLP2 clip
EP emitter electrode pad
LD1A lead
LD1B lead
TAB1 chip mounting portion
TAB2 chip mounting portion

The invention claimed is:
1. An electronic apparatus, comprising:
a wiring board including a main surface on which a first wiring and a second wiring are formed;
a first semiconductor device mounted on the main surface of the wiring board; and
a second semiconductor device mounted on the main surface of the wiring board,
wherein each of the first semiconductor device and the second semiconductor device includes:
  a first semiconductor chip including an insulated gate bipolar transistor;
  a second semiconductor chip including a diode;
  a first lead electrically connected to an emitter electrode pad formed on a first front surface of the first semiconductor chip;
  a second lead electrically connected to an anode electrode pad formed on a second front surface of the second semiconductor chip;
  a first terminal electrically connected to a collector electrode formed on a first back surface of the first semiconductor chip;
  a second terminal electrically connected to a cathode electrode formed on a second back surface of the second semiconductor chip; and
  a sealing material sealing the first semiconductor chip and the second semiconductor chip,
wherein the first lead of the first semiconductor device is electrically connected to the second terminal of the second semiconductor device via the first wiring of the wiring board, and
wherein the second lead of the first semiconductor device is electrically connected to the first terminal of the second semiconductor device via the second wiring of the wiring board.

2. The electronic apparatus according to claim 1, wherein the first semiconductor device and the second semiconductor device are mounted on the main surface of the wiring board so as to orient in different directions from each other.

3. The electronic apparatus according to claim 2, wherein the sealing material of each of the first semiconductor device and the second semiconductor device includes:
a first main surface including a first side, a second side opposite to the first side, and a third side extending in a direction intersecting with an extending direction of each of the first side and the second side; and
a second main surface which includes a surface opposite to the first main surface,
wherein, in a plan view, the first terminal and the second terminal of the first semiconductor device are arranged between a first side and a second side of the sealing material, and the second terminal is arranged between the first side of the sealing material and the first chip mounting portion on which the first semiconductor chip is mounted,
wherein, in the plan view, the first terminal and the second terminal of the second semiconductor device are arranged between the first side of the sealing material and the second side of the sealing material, and the second terminal is arranged between the first side of the sealing material and the first chip mounting portion on which the first semiconductor chip is mounted,
wherein, in the plan view, the first lead and the second lead of the first semiconductor device are arranged so as to line along the first side of the sealing material, and the first lead is arranged between the second lead and a first corner formed by the first side and the third side,
wherein, in the plan view, the first lead and the second lead of the second semiconductor device are arranged so as to line along the first side of the sealing material, and the first lead is arranged between the second lead and a first corner made by the first side and the third side, and
wherein the first semiconductor device and the second semiconductor device are mounted on the main surface of the wiring board such that the first side of the sealing material of the first semiconductor device and a third side of the sealing material of the second semiconductor device are opposite to each other, and the third side of the sealing material of the first semiconductor device and the first side of the sealing material of the second semiconductor device are oriented in a same direction as each other in the plan view.

4. The electronic apparatus according to claim 3, further comprising:
a power terminal to which a power source potential is configured to be supplied from outside;
a ground terminal to which a ground potential is configured to be supplied from the outside;

a third semiconductor device mounted on the main surface of the wiring board and including a same structure as a structure of the first semiconductor device; and a fourth semiconductor device mounted on the main surface of the wiring board and including a same structure as a structure of the second semiconductor device, wherein a third wiring, electrically connected to the power terminal, the first semiconductor device, and the third semiconductor device, is formed on the main surface of the wiring board, wherein a fourth wiring, electrically connected to the ground terminal, the second semiconductor device, and the fourth semiconductor device, is formed on the main surface of the wiring board, wherein the first lead and the second lead of the first semiconductor device protrude from a first side surface located between the first main surface and the second main surface of the sealing material, wherein the first lead and the second lead of the third semiconductor device protrude from a first side surface located between the first main surface and the second main surface of the sealing material, and wherein, in the plan view, the first semiconductor device and the third semiconductor device are mounted on the third wiring so as to overlap a part of the third wiring, such that the first terminal and the second terminal of each of the first semiconductor device and the third semiconductor device are electrically connected to the third wiring.

5. The electronic apparatus according to claim 4, further comprising:

a current output terminal which is configured to output an output current to the outside;

a current input terminal to which an input current from the outside is configured to be input;

a first plate-shaped conductive member electrically connected to the current output terminal and the first wiring; and a second plate-shaped conductive member electrically connected to the current input terminal and the second wiring, wherein, in the plan view, the first plate-shaped conductive member and the second plate-shaped conductive member are arranged so as to pass above the third wiring or the fourth wiring.

6. The electronic apparatus according to claim 1, wherein the sealing material of each of the first semiconductor device and the second semiconductor device includes:

a first main surface including a first side, a second side opposite to the first side, and a third side extending in a direction intersecting with an extending direction of each of the first side and the second side; and a second main surface which includes a surface opposite to the first main surface, wherein each of the first semiconductor device and the second semiconductor device includes a plurality of third leads electrically connected respectively to a plurality of control electrode pads including a gate electrode pad formed on the first front surface of the first semiconductor chip, and wherein, in a plan view, each of the plurality of third leads is arranged so as to line along the second side of the sealing material, and a tip of each of the plurality of third leads is bent so as to locate above the first main surface of the sealing material.

* * * * *